United States Patent [19]

Wong et al.

[11] Patent Number: 5,175,492
[45] Date of Patent: Dec. 29, 1992

[54] CALIBRATION AND ERROR CORRECTION FOR ELECTRICAL-SOURCE-TO-E/O-DEVICE IMPEDANCE MISMATCH AND O/E-DEVICE-TO-ELECTRICAL-RECEIVER IMPEDANCE MISMATCH IN A LIGHTWAVE COMPONENT ANALYZER

[75] Inventors: Roger W. Wong; Michael G. Hart, both of Santa Rosa, Calif.

[73] Assignee: Hewlett-Packard Company, Palo Alto, Calif.

[21] Appl. No.: 391,057

[22] Filed: Aug. 8, 1989

[51] Int. Cl.$^5$ .................. G01R 35/00; G01R 27/00
[52] U.S. Cl. ................. 324/158 R; 324/74; 324/96; 364/551.01
[58] Field of Search .......... 324/158 R, 73.1, 96, 324/74.77 K, 158 D, 616; 356/400, 401, 368; 350/389, 387, 386, 374, 376; 359/245, 322, 315; 364/551.07, 579

[56] References Cited

U.S. PATENT DOCUMENTS 4,845,423 7/1989 Pollard .................... 324/74
4,994,663 2/1991 Aoshima et al. ........... 324/77 K
5,021,647 6/1991 Tatsuno et al. ............ 324/96

OTHER PUBLICATIONS

"Vector Measurements of High Frequency Networks"; Hewlett Packard Company No. 5958-0387; Apr. 1, 1989.

*Primary Examiner*—Vinh Nguyen
*Attorney, Agent, or Firm*—William C. Milks, III

[57] ABSTRACT

A lightwave component analyzer including at least an internal optical receiver and preferably also including an internal optical source which are selectively connectable by switches configurable by means of an instrument controller for calibration and performance of electro-optical, opto-electrical, and optical measurements. Transmission measurements of E/O devices are corrected for source match errors, and transmission measurements of O/E devices are corrected for load match errors, in addition to frequency response and cross-talk error correction. Response and match error correction provides for improved measurements of test devices with an electrical port having an impedance different from that of the measurement system impedance.

20 Claims, 30 Drawing Sheets

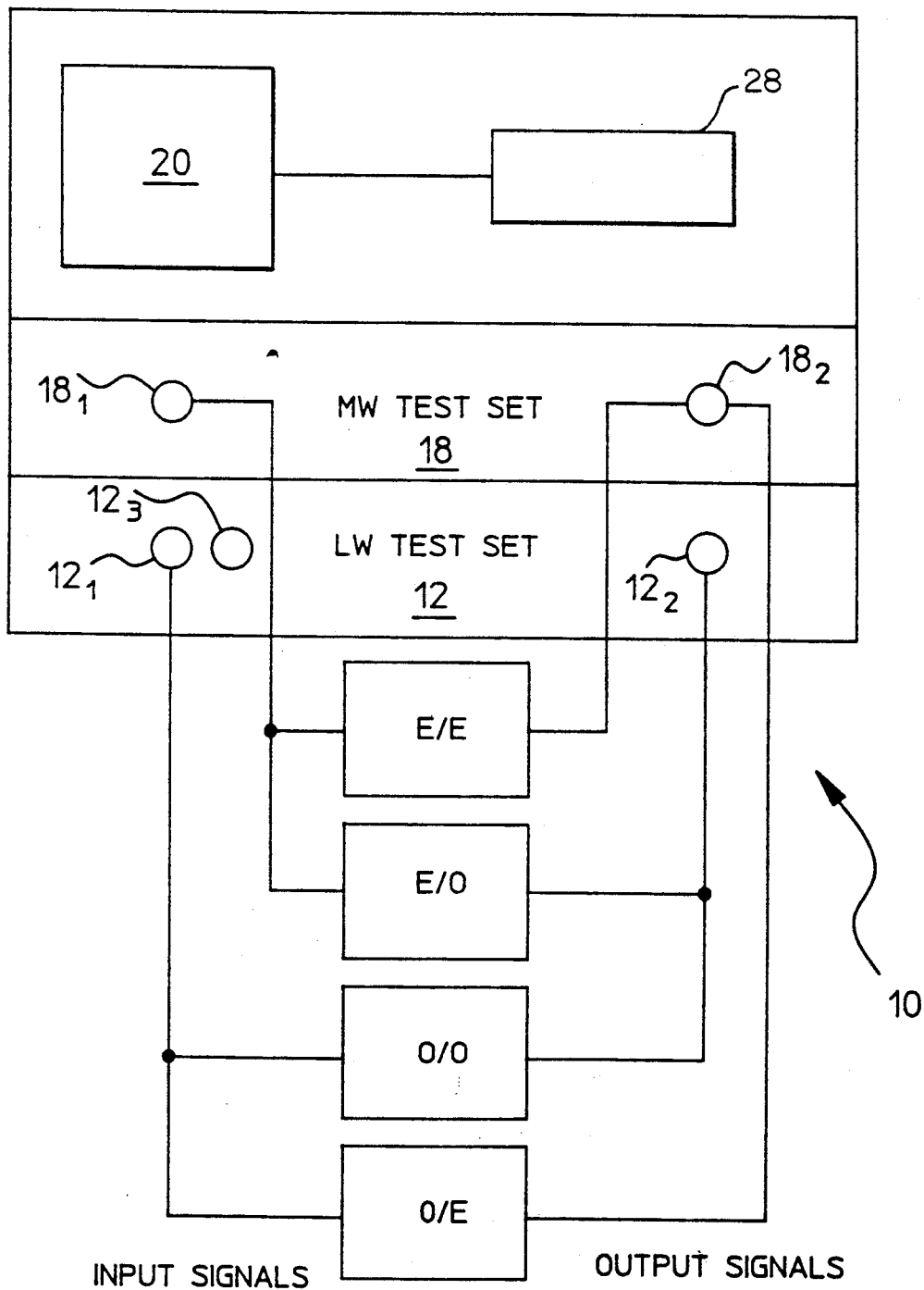
FIG_ 1

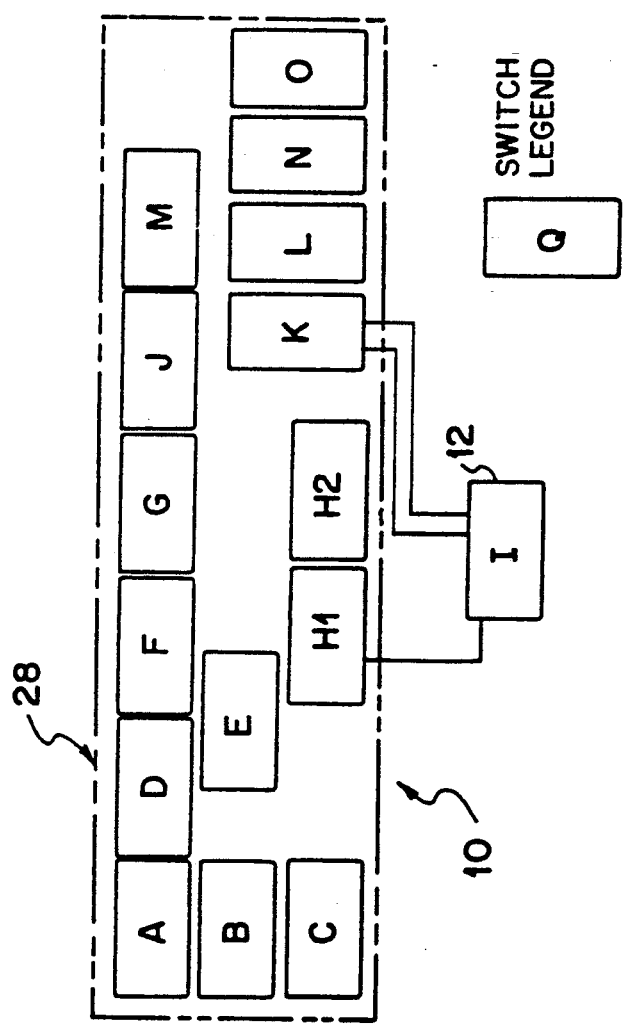
FIG_2

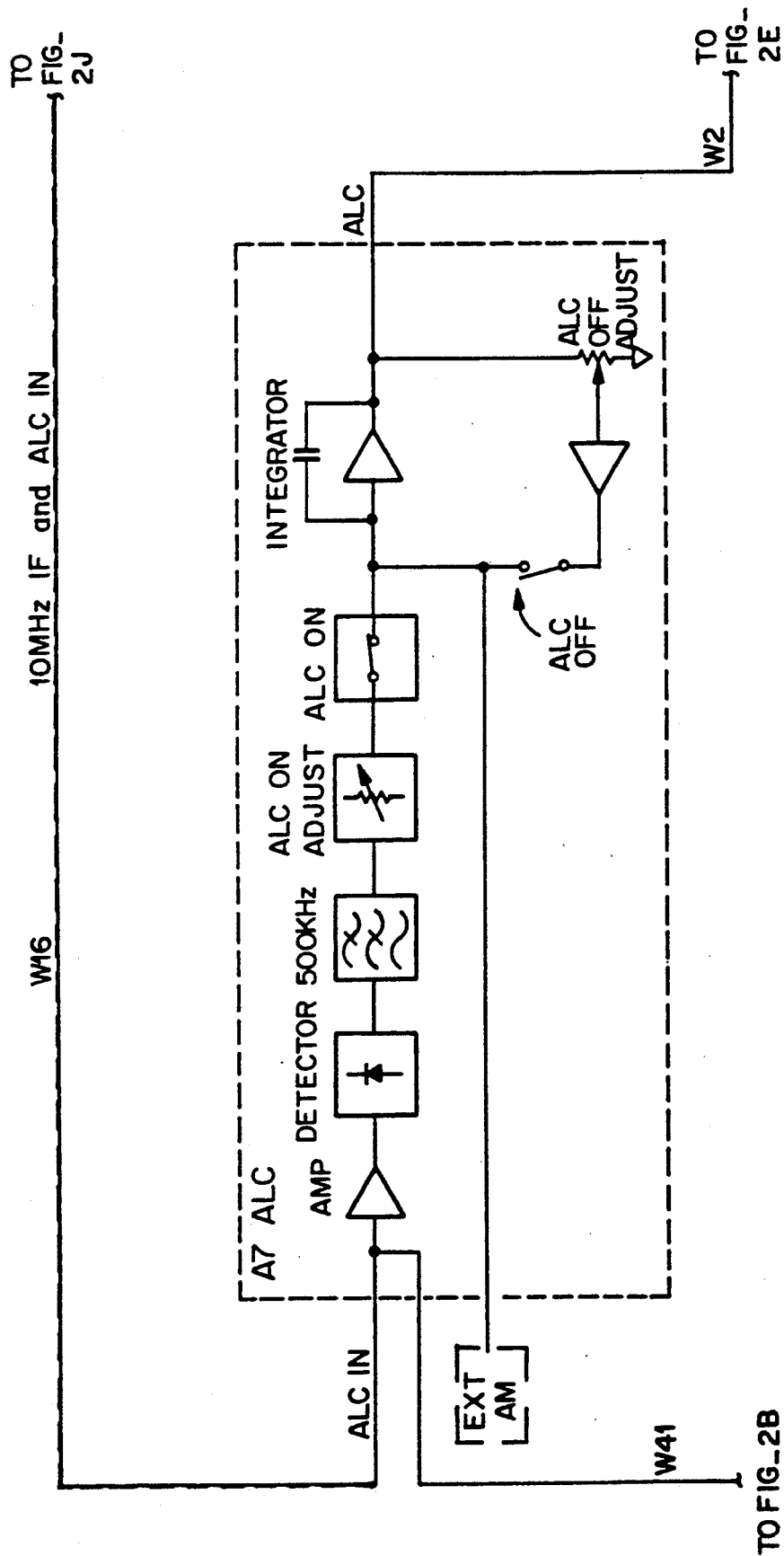
FIG_2A

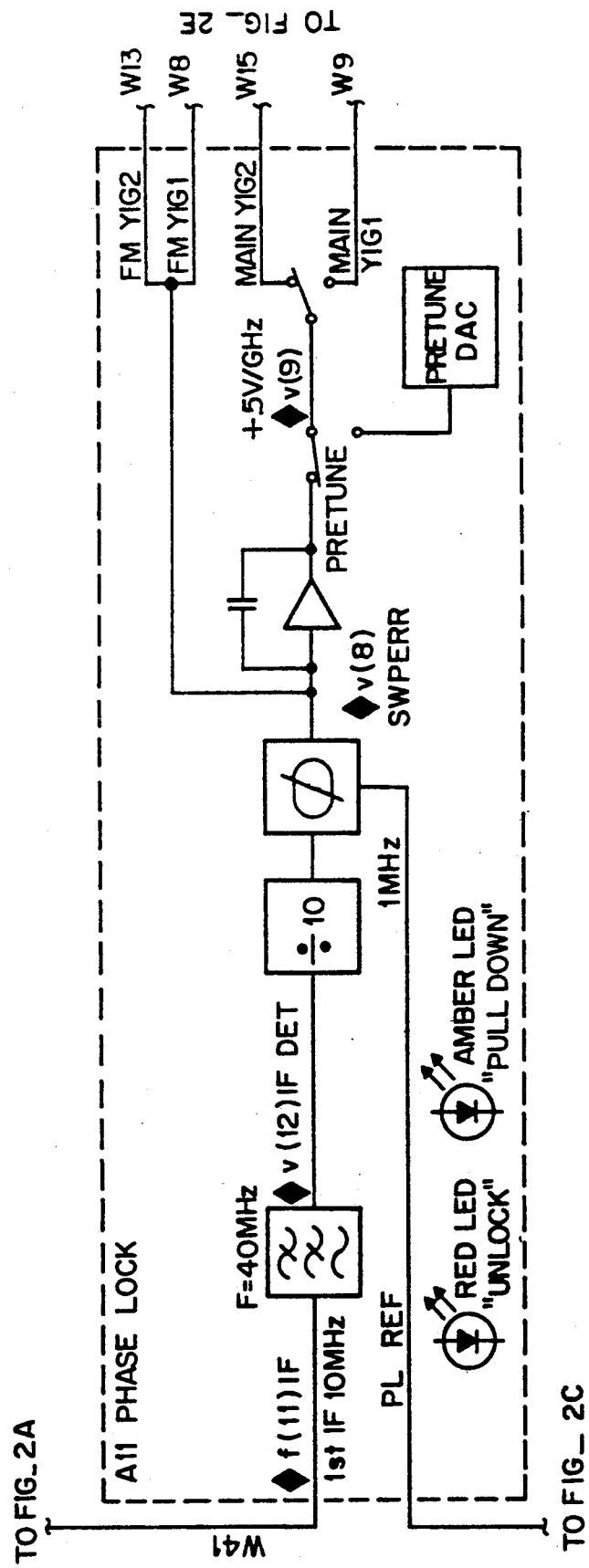
FIG_2B

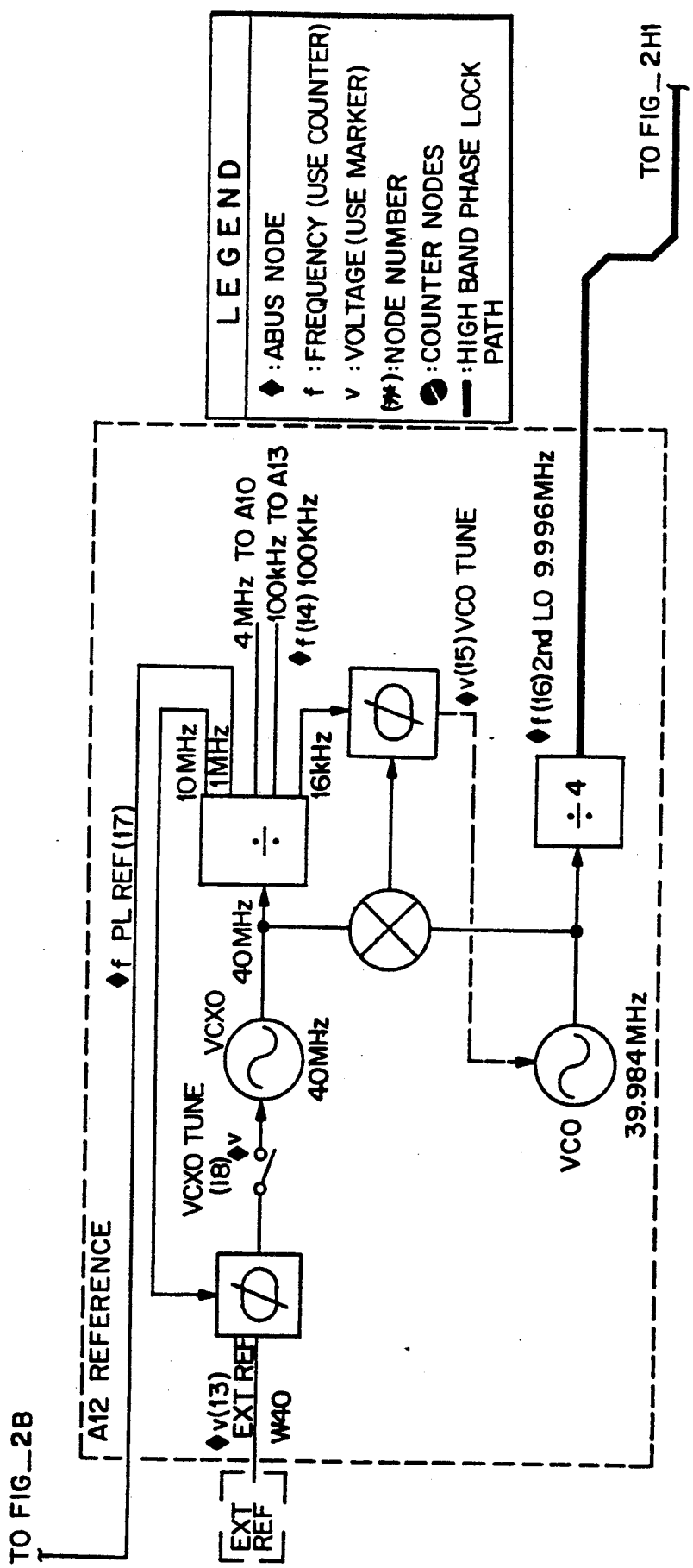
FIG_2C

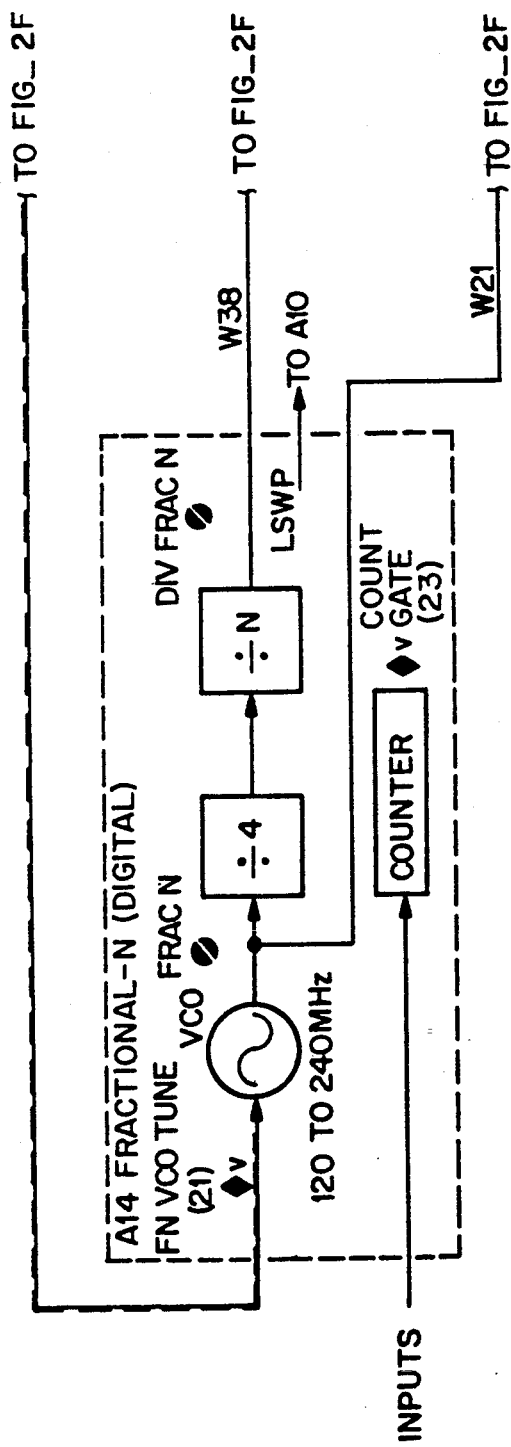
FIG_2D

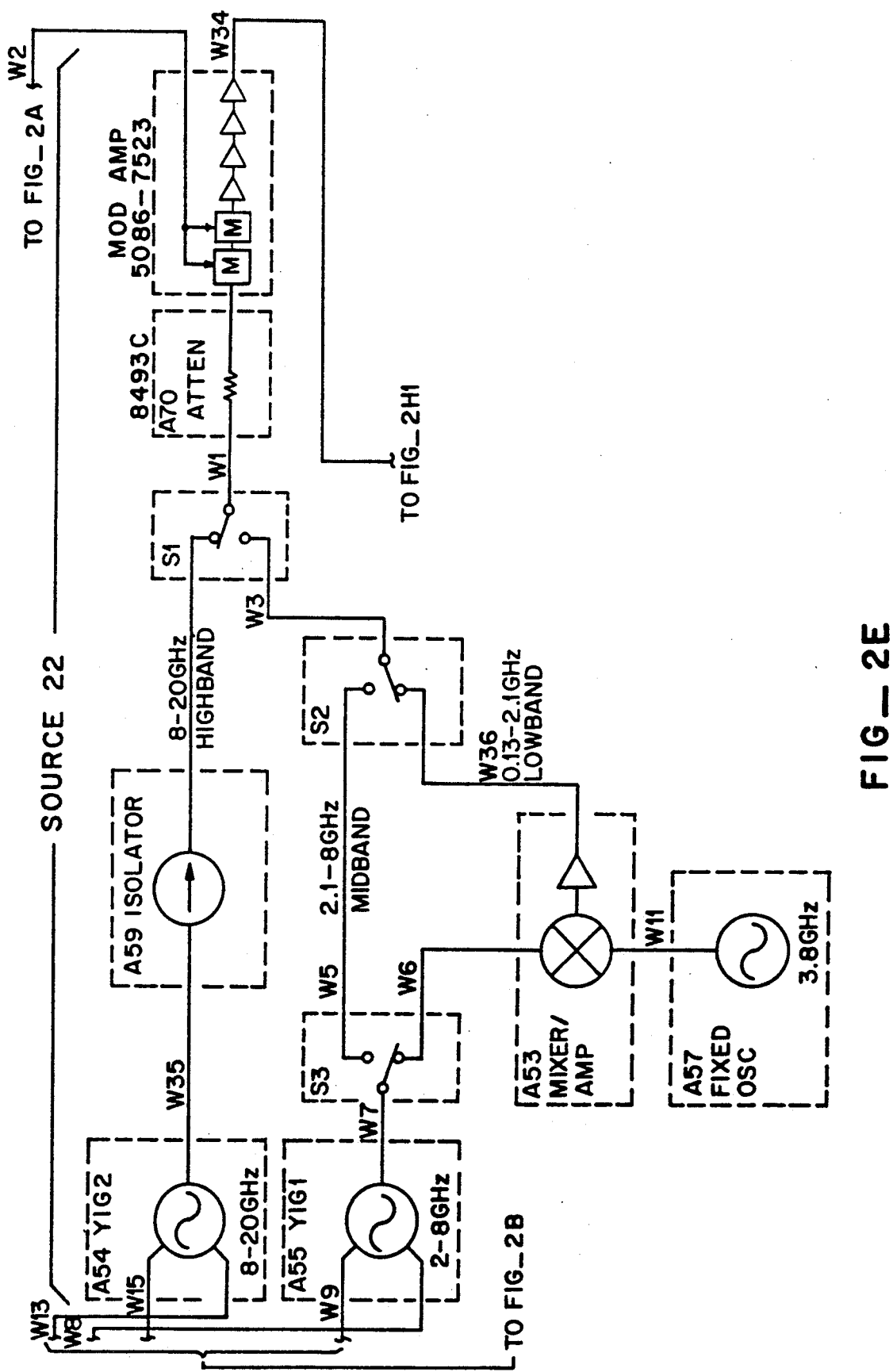
FIG_2E

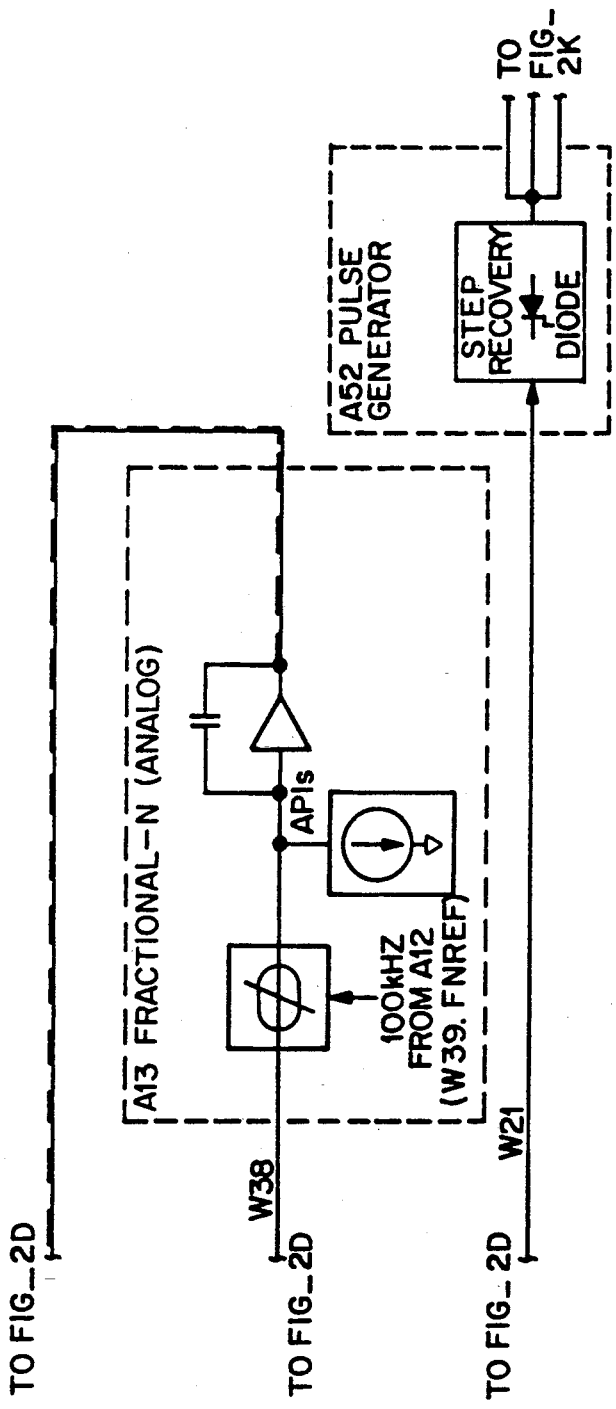
FIG_2F

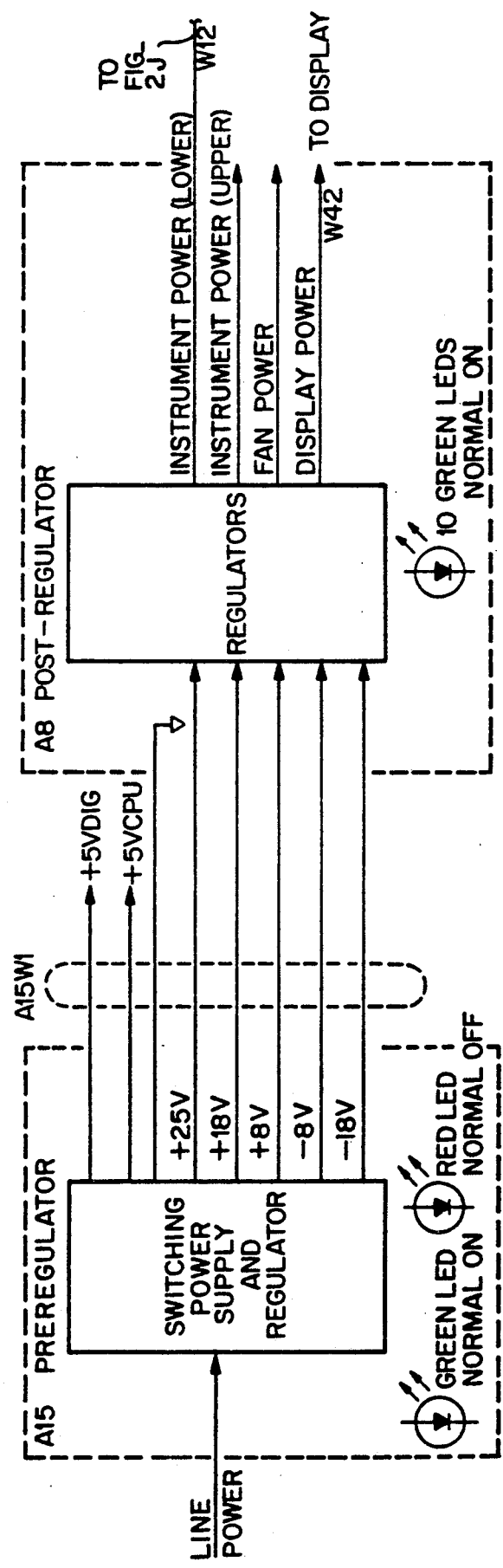
FIG_2G

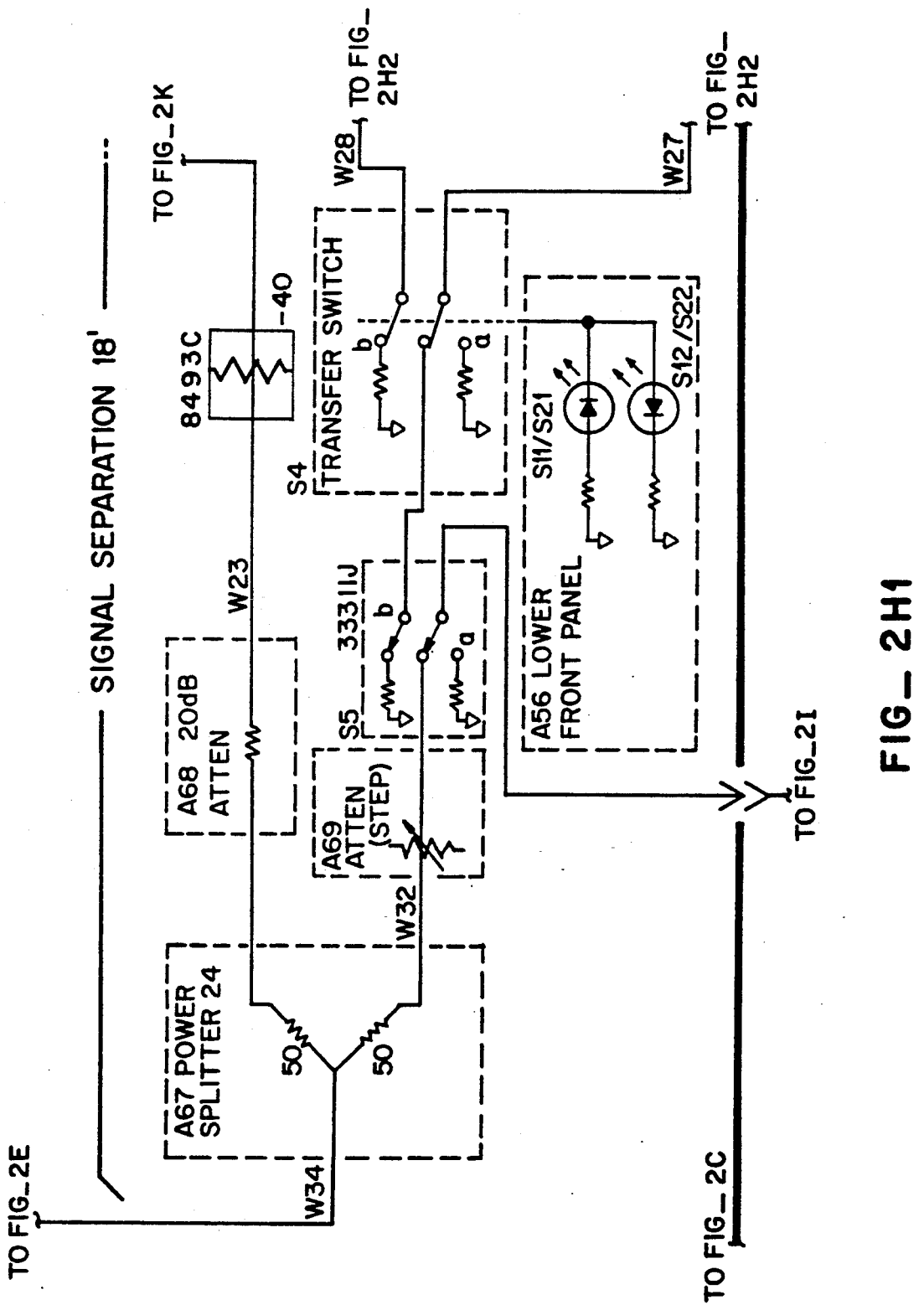
FIG_2H1

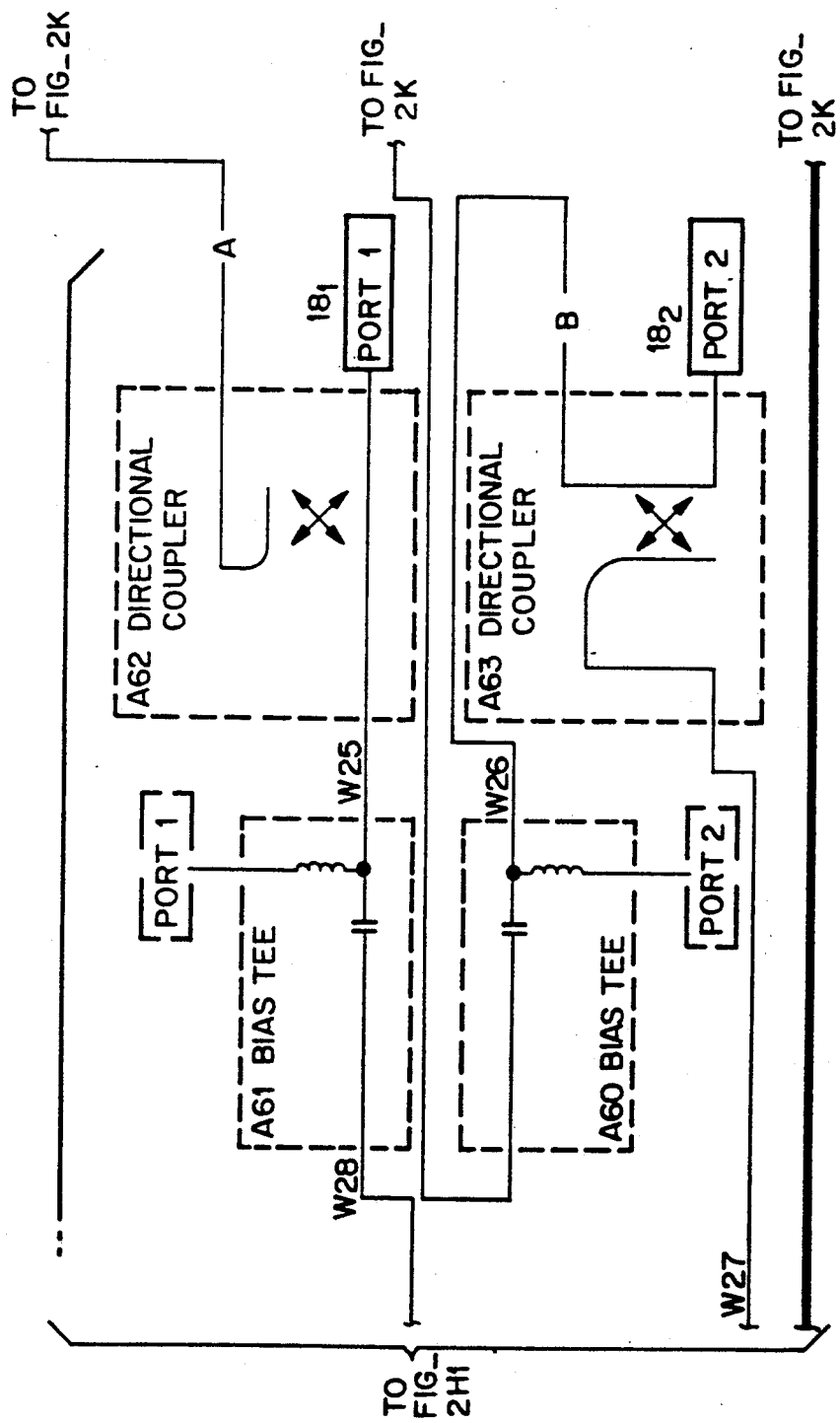
FIG_2H2

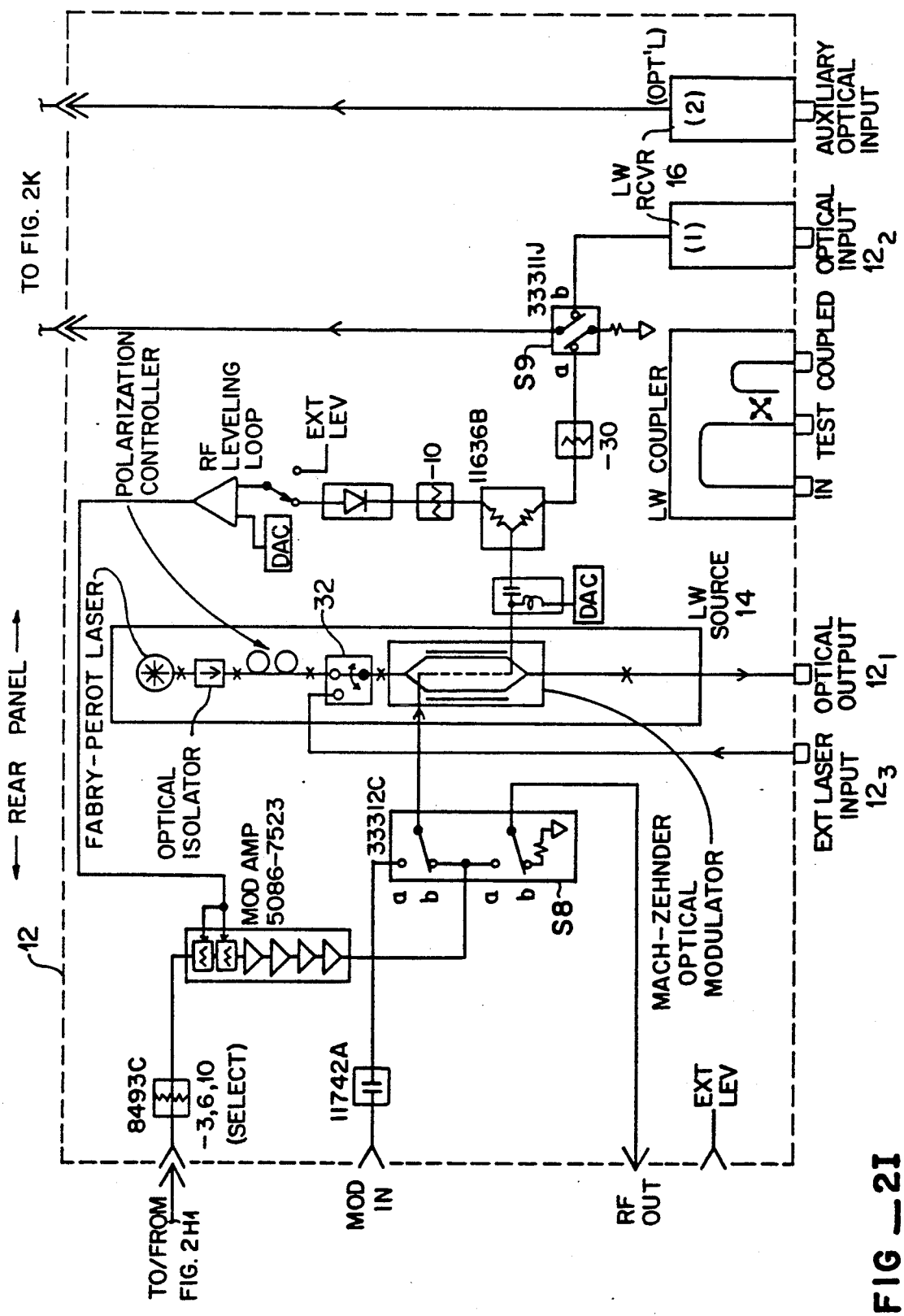
FIG_2I

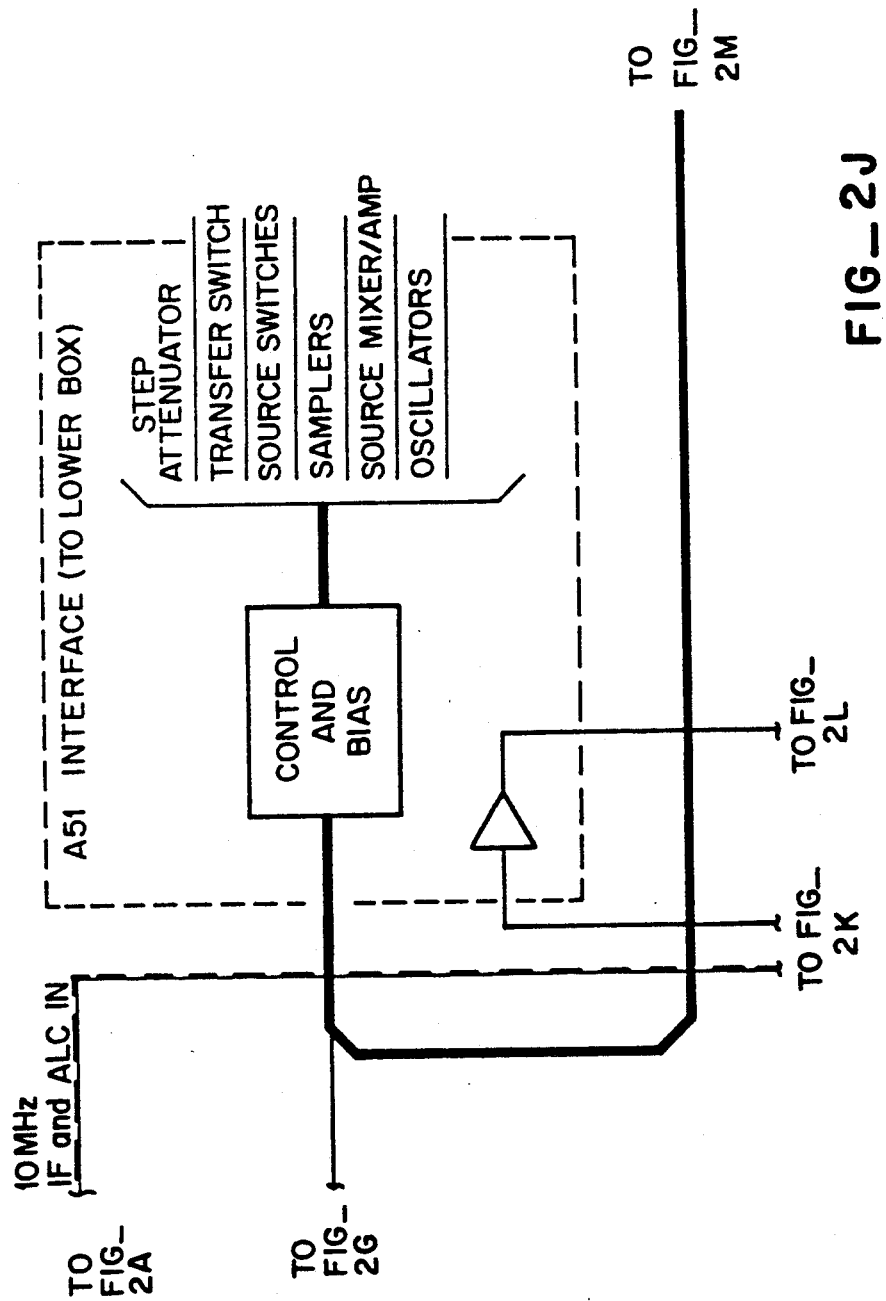
FIG_2J

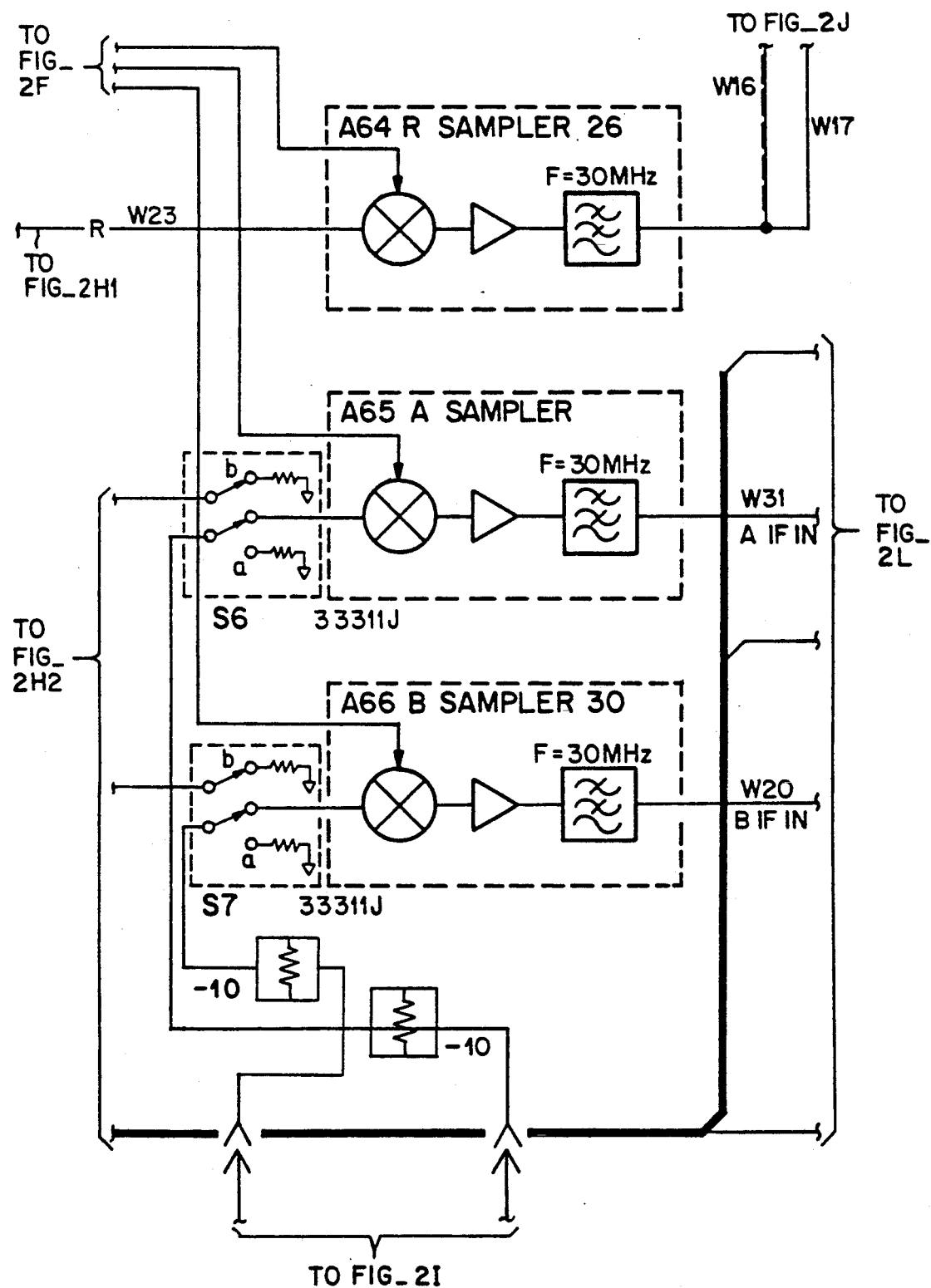
FIG_2K

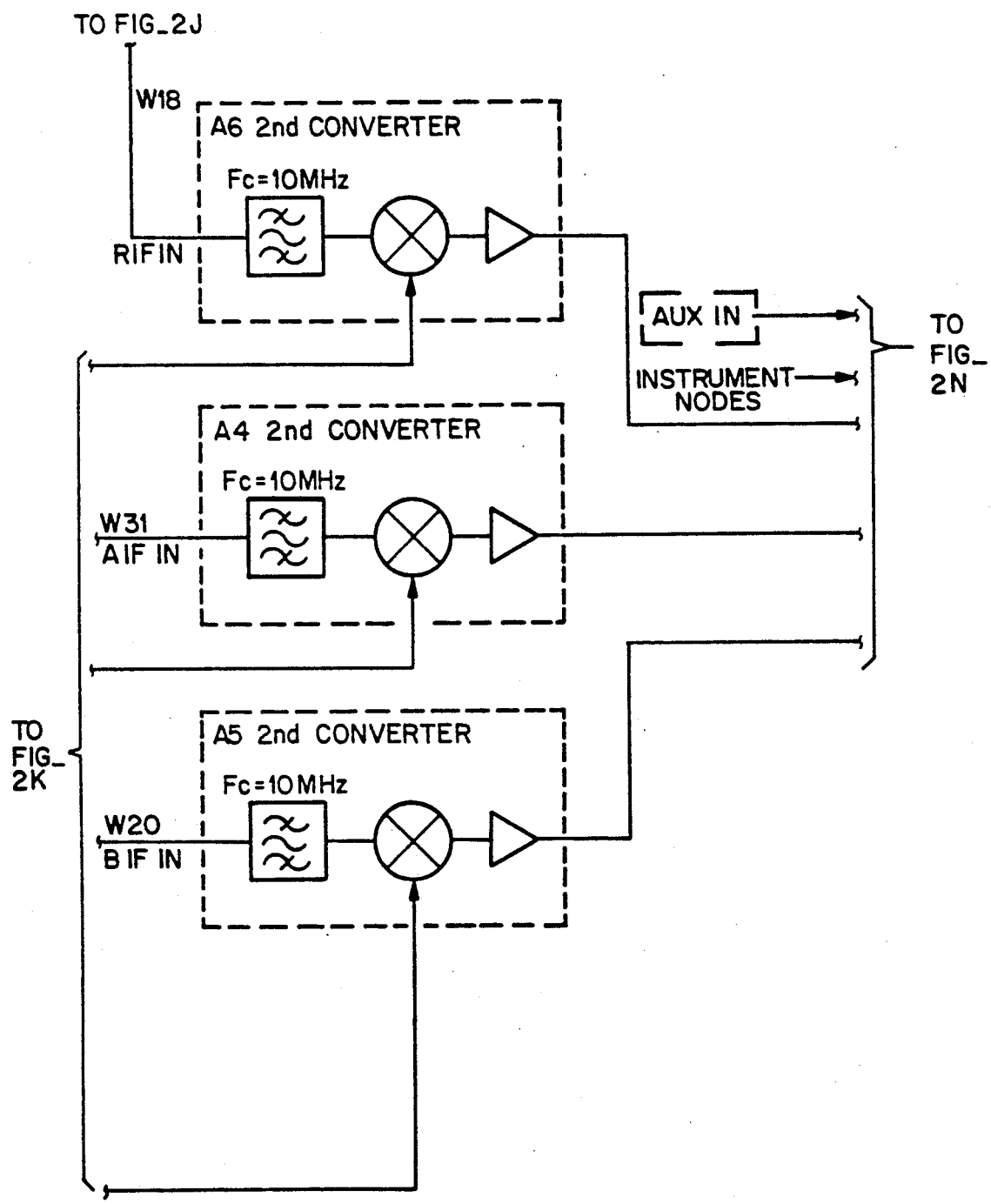
FIG_2L

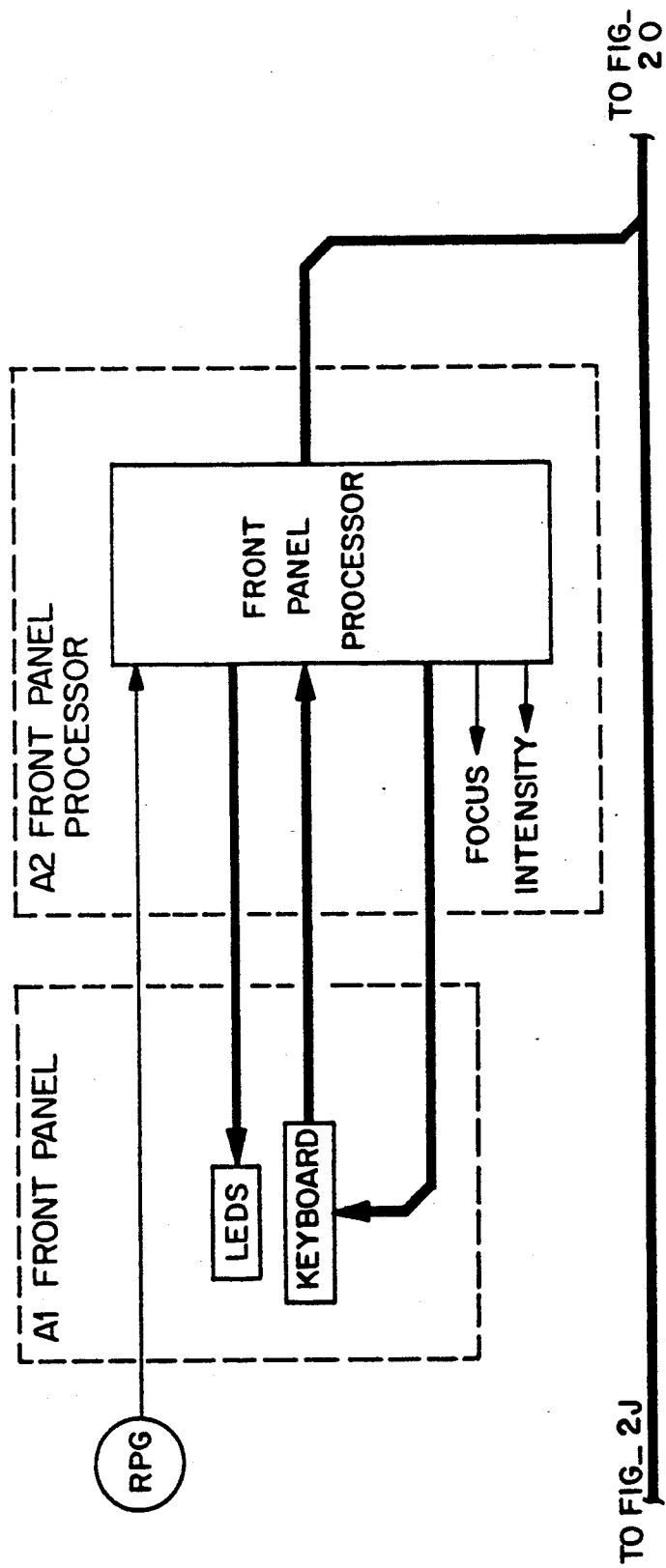
FIG_2M

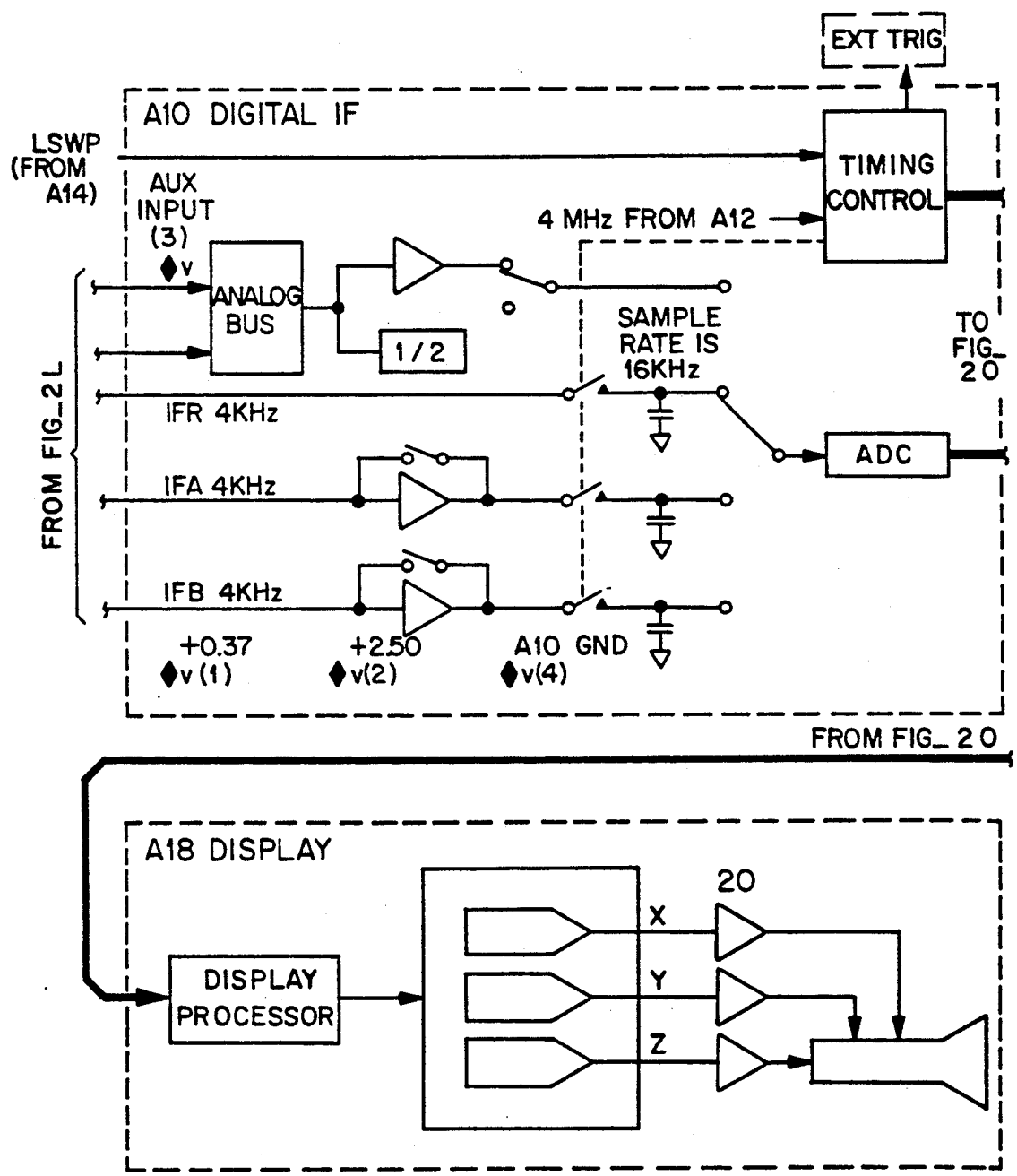
FIG_ 2N

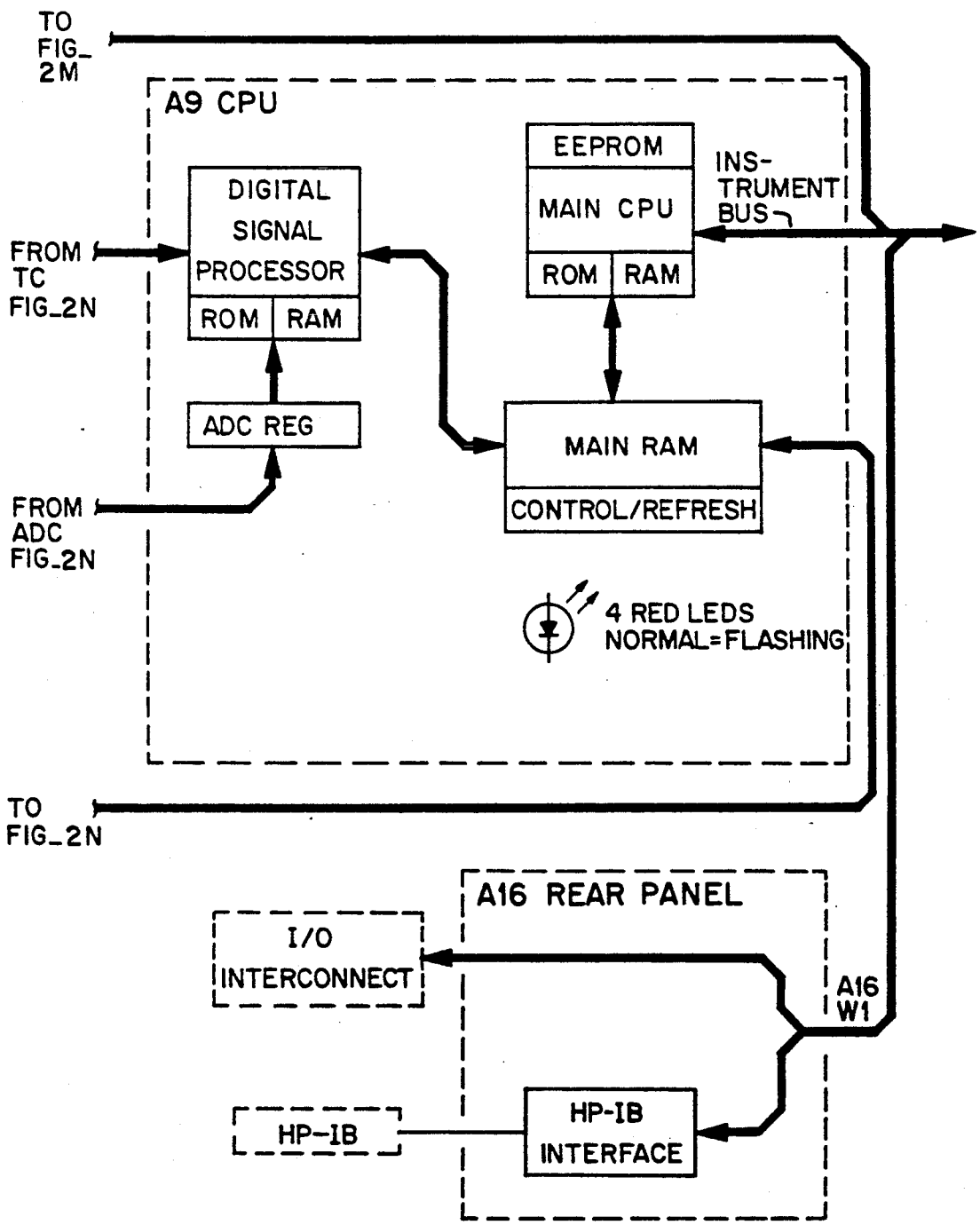
FIG_20

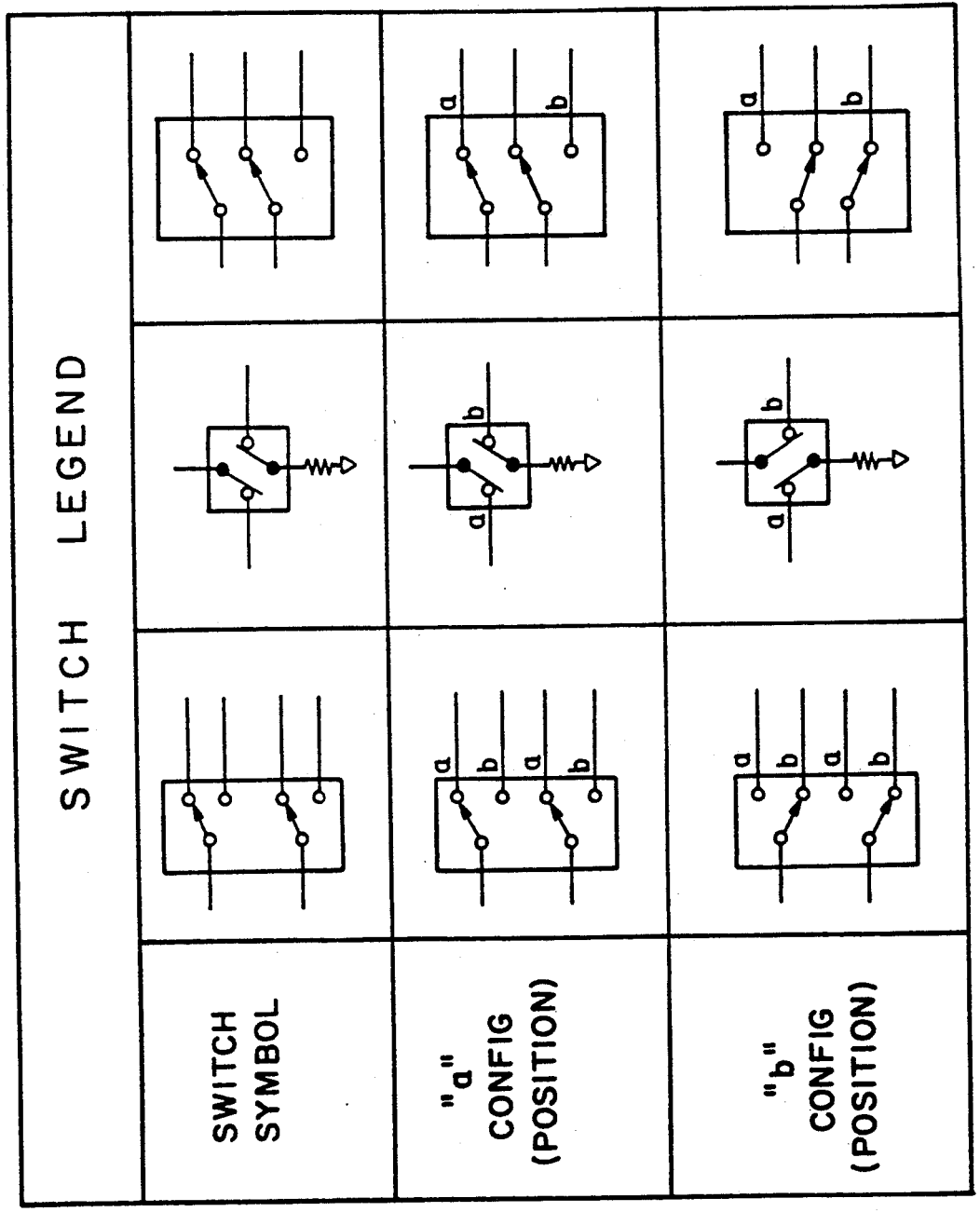
FIG_2Q

| DEVICE TYPE | DRIVE PORT | THRU PORT | REFL. PORT | S4 | S6 | S7 | S9 | S8 | S5 | THRU SAMPLR. | REFL. SAMPLR |
|---|---|---|---|---|---|---|---|---|---|---|---|
| E→E | RF1 | RF2 | RF1 | a | a | a | b | b | a | B | A |
| E→O | RF1 | LWR1 | RF1 | a | a | b | b | b | a | B | A |
| O→E | LWS/LWC | RF2 | LWR2 | a | b | a | b | b | b | B | A |
| O→O | LWS/LWC | LWR1 | LWR2 | a | b | b | b | b | b | B | A |

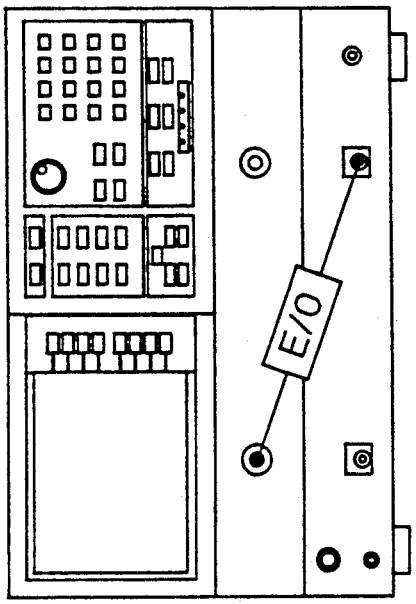
FIG_ 6A
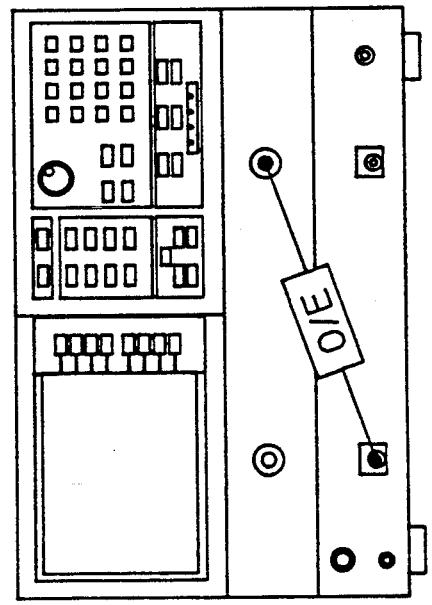
FIG_ 6B
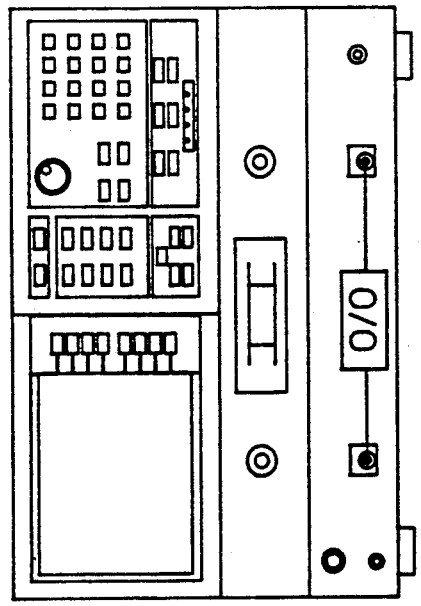
FIG_ 6C
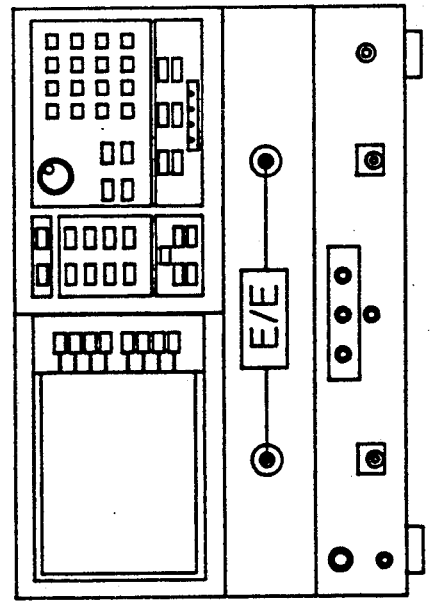
FIG_ 6D

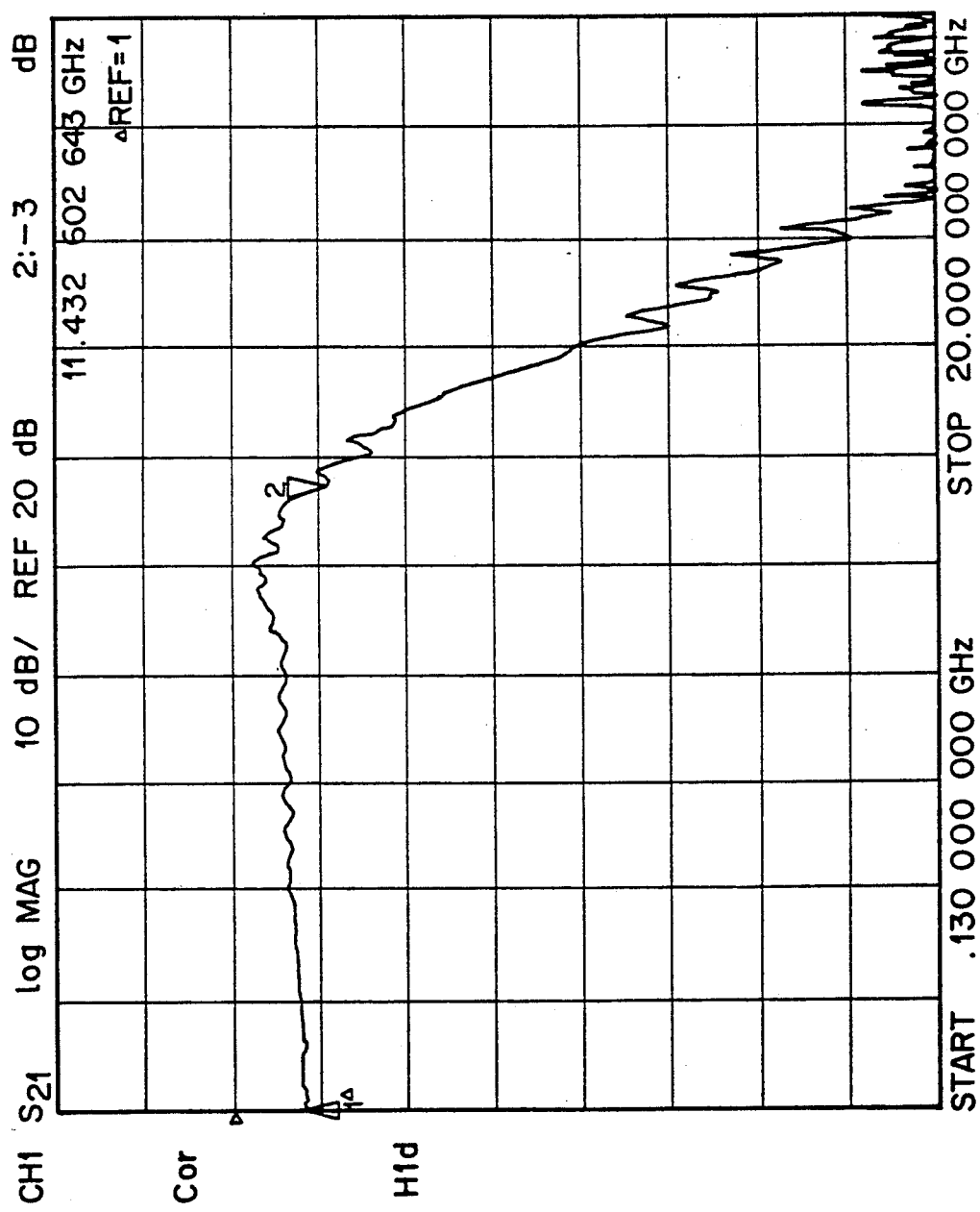
FIG—10

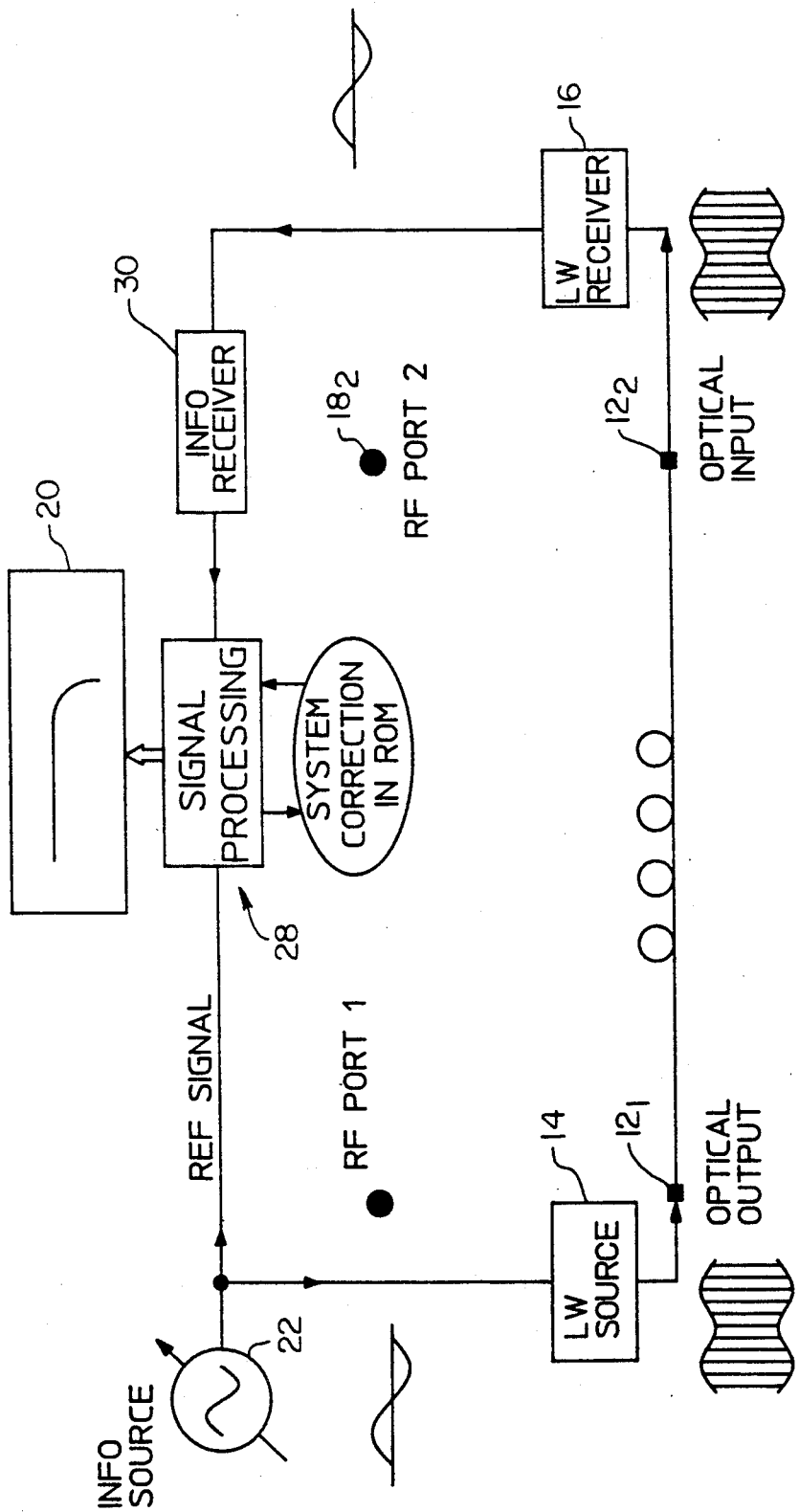
FIG_ 11

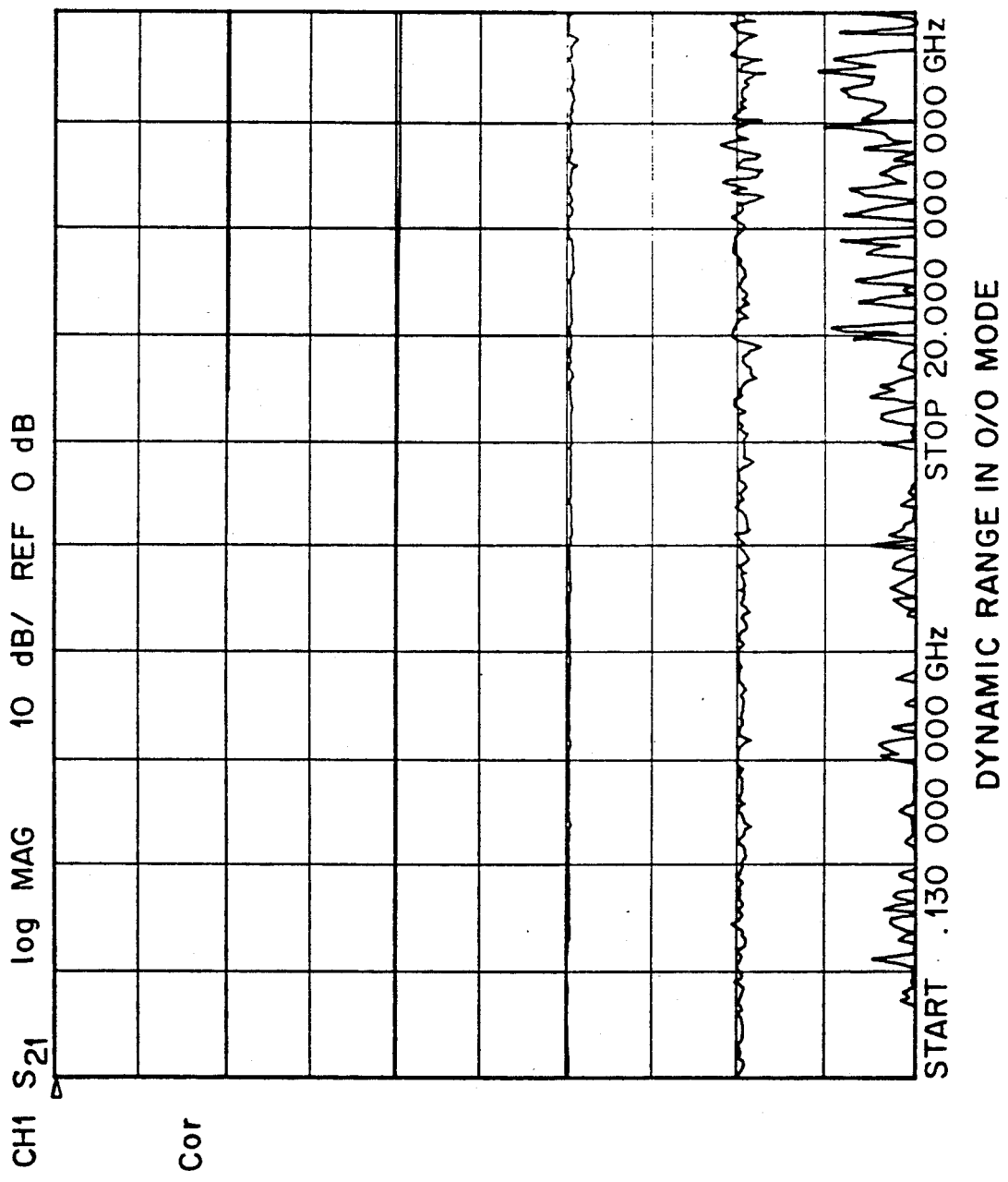
FIG_12

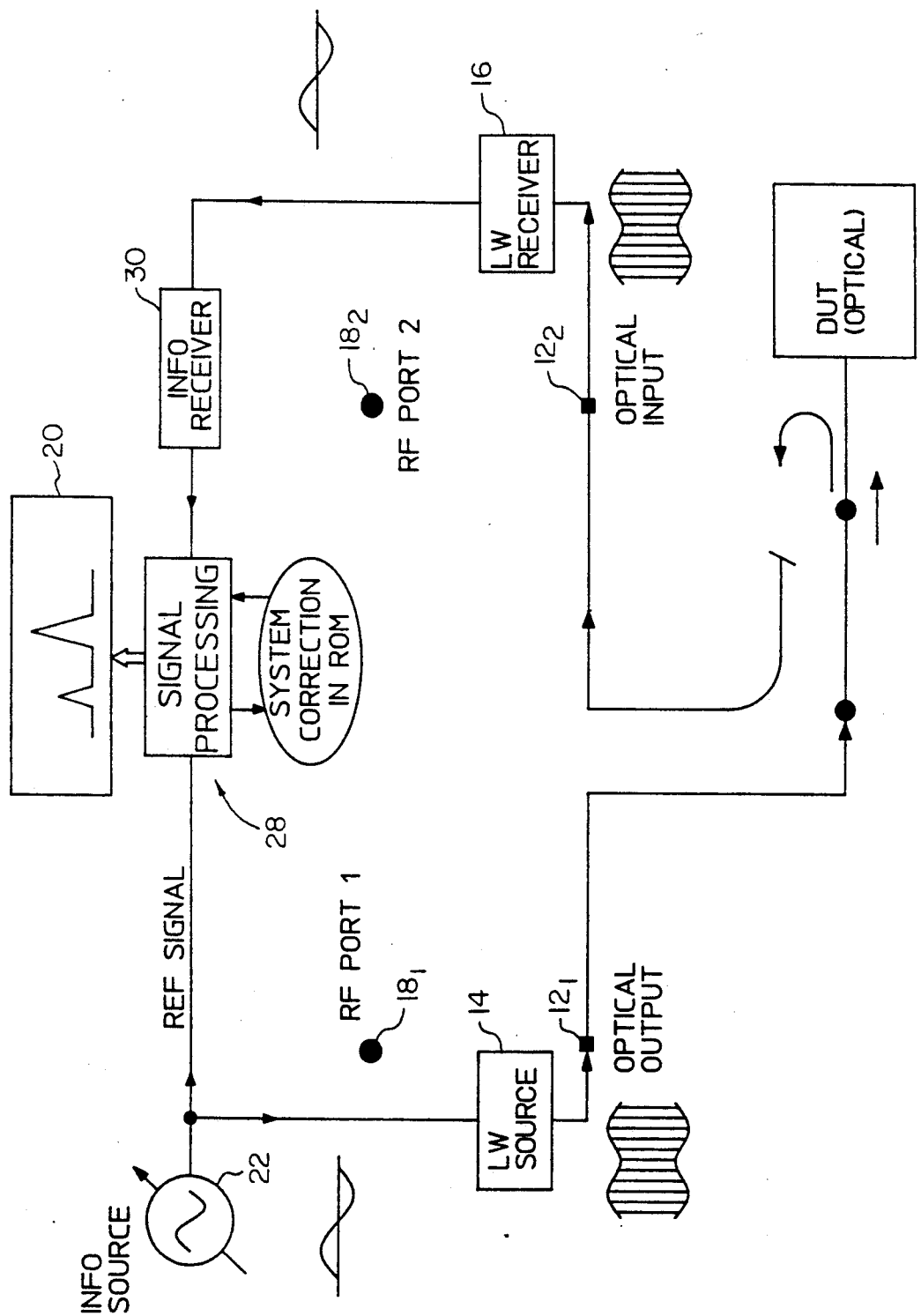
FIG_ 13

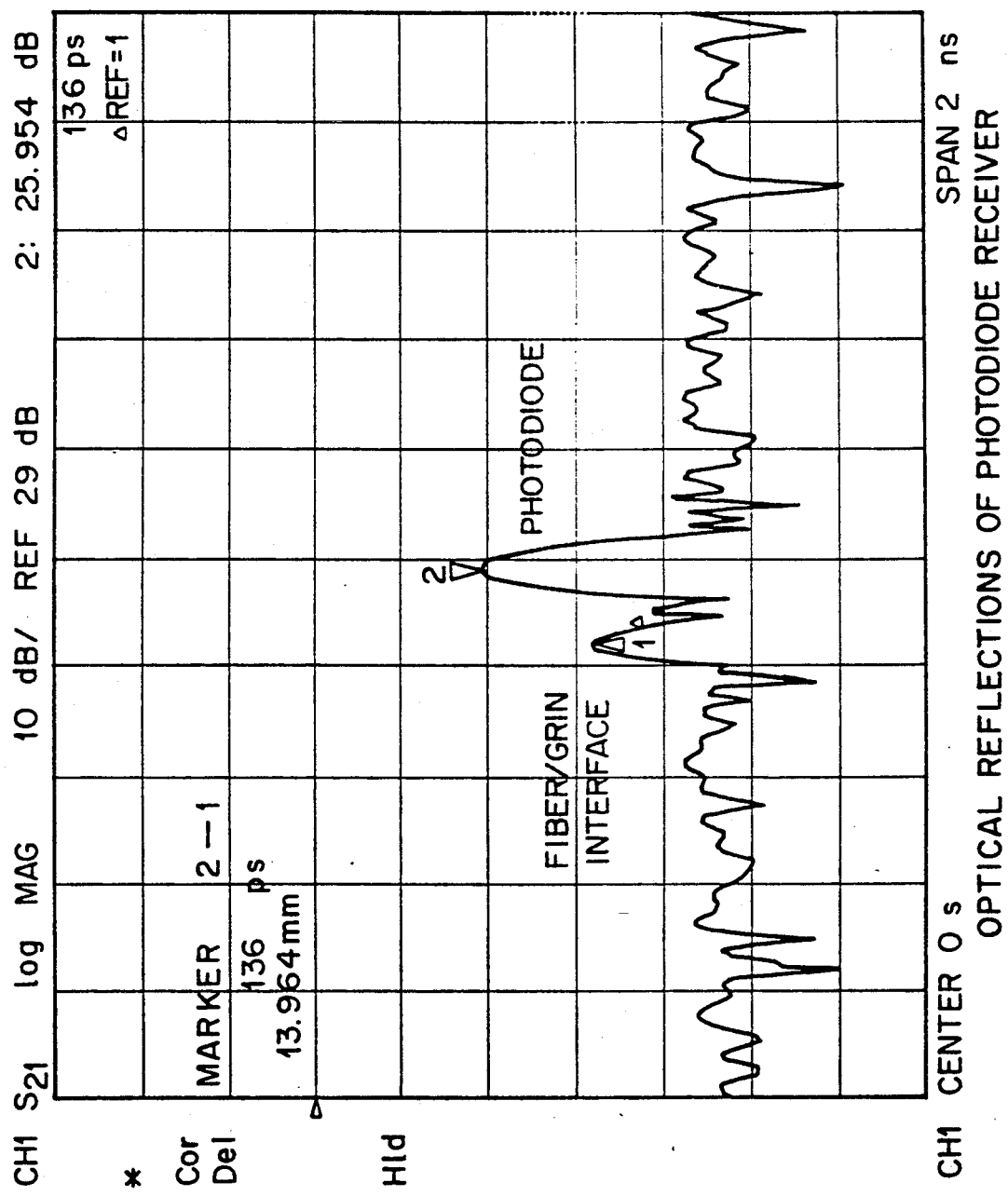
FIG—14

CALIBRATION AND ERROR CORRECTION FOR ELECTRICAL-SOURCE-TO-E/O-DEVICE IMPEDANCE MISMATCH AND O/E-DEVICE-TO-ELECTRICAL-RECEIVER IMPEDANCE MISMATCH IN A LIGHTWAVE COMPONENT ANALYZER

BACKGROUND OF THE INVENTION

This invention relates to electronic test instruments and, more particularly, to electronic instrumentation for signal measurements during tests performed on electrical, electro-optical, opto-electrical, and/or optical systems, subsystems, and associated components. Specifically, the invention is directed to calibration and error correction for electrical-source-to-electro-optical-device impedance mismatch, as well as opto-electrical-device-to-electrical-receiver impedance mismatch, in an electronic test instrument for accurately performing these tests. One embodiment of the invention provides such calibration and error correction for a lightwave component analyzer having at least an internal optical receiver and preferably also having an internal optical source which are selectively connectable by switches configurable by means of an instrument controller for calibration and performance of at least electro-optical and opto-electrical measurements. The switches are arranged in a configurable switch matrix which is connected by the instrument controller in response to selection of a measurement by a user to facilitate calibration of, and error-corrected measurements with, the lightwave component analyzer.

An exemplary use of the invention is in the field of optical and electrical signal measurements in connection with fiber optic systems. With higher bit rates and wider-band modulations becoming prevalent in fiber optic systems, the designers and manufacturers of these systems, as well as subsystems and associated components, need to be able to accurately characterize performance at increasingly higher modulation rates. Some new fiber optic systems now operate at speeds of one GBPS and higher, which are equivalent to RF and low microwave frequencies.

Various test systems have been developed to meet these measurement needs. One such test system is the HP 8702A lightwave component measurement system produced by Hewlett-Packard Company, Network Measurements Division, Santa Rosa, Calif. This system comprises an internal electrical source incorporated into an analyzer for performing electrical calibration and measurements, but the system comprises a discrete optical source and a discrete optical receiver for performing electro-optical (E/0), opto-electrical (0/E), and optical calibration and measurements. This system has the significant advantage that it incorporates a technique for calibrating the test system for performing the desired signal measurements by calibrating the optical source and receiver (or electro-optical and opto-electrical converters) in terms of their modulation (or demodulation) transfer characteristics. However, this system does not calibrate and error-correct E/0 or 0/E test measurements for impedance mismatches between the electrical source and an E/0 device under test or between an 0/E device under test and the electrical receiver. This has resulted in reduced accuracy during testing.

SUMMARY OF THE INVENTION

One embodiment of the present invention provides calibration and error correction for electrical-source-to-electro-optical-device impedance mismatch and opto-electrical-device-to-electrical-receiver impedance mismatch in a lightwave component analyzer for calibrated absolute and relative measurements of modulation and/or demodulation transfer characteristics of electro-optical (E/O), opto-electrical (O/E), and optical devices and for measuring the responses of fiber optic systems, subsystems, and associated components for characterizing their performance. Accordingly, the lightwave component analyzer can measure modulation (demodulation) bandwidth, modulation (demodulation) transfer functions, loss, delay, dispersion, length, and reflections of fiber optic system components, such as lasers, optical receivers, modulators, demodulators, optical fiber cable, and fiber components, based on frequency domain measurements, with improved accuracy.

Electrical-source-to-E/O-device impedance mismatch and O/E-device-to-electrical-receiver impedance mismatch calibration and error correction in accordance with one embodiment of the invention are preferably used in a lightwave component analyzer which comprises an internal optical source and an internal optical receiver. A switch matrix is incorporated into the lightwave component analyzer together with the optical source and receiver for providing the appropriate connections of the optical source and receiver circuits for calibrating the lightwave component analyzer and measuring E/0, 0/E, and optical devices, and, preferably, electrical devices, as well. The switch matrix is preferably configurable by means of an internal instrument controller.

The electrical-source-to-E/O-device impedance mismatch calibration steps are as follows. Five steps are needed.

The first step is to measure a short on electrical test port 1. The second step is to measure an open on electrical test port 1. The third step is to measure a load on electrical test port 1. The data measured during these steps are used to calculate forward source match (Esf), forward reflection tracking (Erf), and forward directivity (Edf). The fourth step is to measure isolation, which is used as Exf. Finally, the fifth step is to measure electrical and optical through connections, which are used to calculate transmission tracking (Etf). The above five steps can be performed in any order.

The equation to error-correct E/O devices is:

$$S21_{actual} = \frac{\frac{(S21\ meas - Exf)}{Etf}}{1 + \frac{(S11\ meas - Edf)}{Erf} Esf}$$

where
S21 meas is the measured transmission parameter containing systematic errors;
S21 actual is the corrected transmission parameter with source match, cross-talk, and transmission tracking errors removed;
S11 meas is the measured, uncorrected electrical reflection parameter;
Edf is forward directivity;
Erf is forward reflection tracking;
Esf is forward source match;
Exf is isolation; and Etf is transmission tracking.

The O/E-device-to-electrical-receiver impedance mismatch calibration steps are as follows. Nine steps are needed.

The first step is to measure a short on electrical test port 1. The second step is to measure an open on electrical test port 1. The third step is to measure a load on electrical test port 1. The data measured during these first three steps are used to calculate load match (Elf). The fourth step is to measure a short on electrical test port 2. The fifth step is to measure an open on electrical test port 2. The sixth step is to measure a load on electrical test port 2. The data measured during the fourth through sixth steps are used to calculate reverse source match (Esr), reverse reflection tracking (Err), and reverse directivity (Edr). The seventh step is to measure isolation, which is used as Exf. The eighth step is to measure an electrical through, which is used to calculate load match (Elf). Finally, the ninth step is to measure electrical and optical through connections, which are used to calculate transmission tracking (Etf). The above nine steps can be performed in any order.

The equation to error-correct O/E devices is:

$$S21_{actual} = \frac{1 + \frac{(S22\ meas - Edr)}{Err}(Esr - Elf)\frac{(S21\ meas - Exf)}{Etf}}{1 + \frac{(S22\ meas - Edr)}{Err}Esr}$$

where

S21 meas is the measured transmission parameter containing systematic errors;

S21 actual is the corrected transmission parameter with load match, cross-talk, and transmission tracking errors removed;

S22 meas is the measured, uncorrected electrical reflection parameter;

Edr is reverse directivity;

Err is reverse reflection tracking;

Esr is reverse source match;

Exf is isolation;

Elf is load match; and

Etf is transmission tracking.

Accordingly, transmission measurements of E/O devices can be corrected for source match errors, and transmission measurements of O/E devices can be corrected for load match errors, in addition to frequency response and cross-talk error correction. Calibration followed by error correction in accordance with the invention provides improved accuracy in actual test measurements of test devices with an electrical port having an impedance different from the lightwave component analyzer measurement system impedance.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings. In the drawing:

FIG. 1 is a block diagram of a lightwave component analyzer having an internal optical source and an internal optical receiver and incorporating a switch matrix configurable by means of an internal instrument controller for performing calibration and error-corrected test measurements in accordance with the invention;

FIG. 2, comprising FIGS. 2A–2G, 2H1, 2H2, and 2I–2O connected as shown, as well as FIG. 2Q, is a schematic diagram of the lightwave component analyzer shown in FIG. 1 illustrating the internal optical source and receiver and configurable switch matrix;

FIG. 3 is a table illustrating the appropriate positions of the switches shown in FIG. 2 for performing electro-optical (E/O), opto-electrical (O/E), and/or optical (O/O), as well as electrical (E/E), test measurements;

FIG. 6, comprising FIGS. 6A–6D, illustrates connections of devices for E/O, O/E, O/O, and E/E test measurements with the lightwave component analyzer shown in FIG. 1;

FIG. 10 illustrates data from an exemplary O/E device measurement in accordance with FIG. 9;

FIG. 11 is a simplified block diagram for transmission measurements on an optical device with the lightwave component analyzer shown in FIG. 2;

FIG. 12 illustrates data from an exemplary optical device transmission measurement in accordance with FIG. 11;

FIG. 13 is a simplified block diagram for reflection measurements on an optical device with the lightwave component analyzer shown in FIG. 2; and FIG. 14 illustrates data from an exemplary reflection measurement in accordance with FIG. 13.

DETAILED DESCRIPTION OF THE PREFERRED EMBODIMENTS

Figure 4:
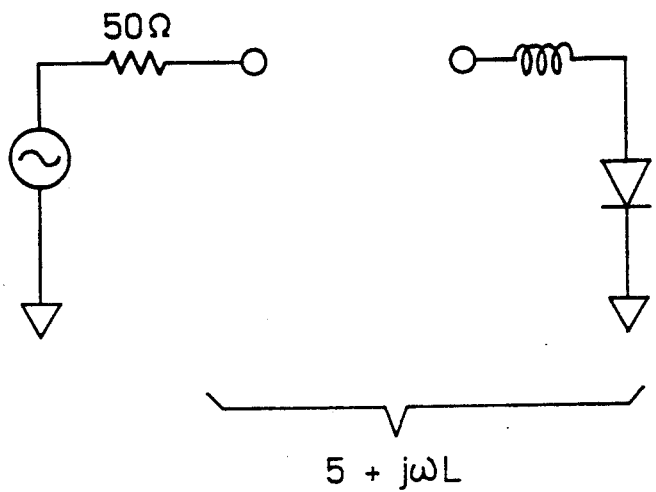
FIG. 4 is a schematic diagram of interconnection of an electrical source to an electro-optical device useful for explaining one embodiment of electrical-source-to-electro-optical-device impedance mismatch calibration and error correction in accordance with the invention.

FIG. 1 shows one embodiment of a lightwave component analyzer, generally indicated by the numeral 10. As shown in FIGS. 1 and 2, the lightwave component analyzer 10 comprises an optical, or lightwave, test set 12 having an internal optical, or lightwave, receiver 16 and preferably having an internal optical, or lightwave, source 14. (See FIG. 2I.) The lightwave test set 12 also preferably comprises optical, or lightwave, test ports $12_1$ and $12_2$. All of the elements of the lightwave component analyzer 10, including the lightwave source 14 and the lightwave receiver 16, are extensively characterized so that high levels of precision in lightwave measurements are achieved when the lightwave component analyzer is calibrated. Preferably, the lightwave component analyzer 10 also comprises an electrical test set 18 for electrical measurements. The electrical test set 18 also preferably comprises electrical test ports $18_1$ and $18_2$.

The lightwave component analyzer 10 preferably comprises essentially a 20 GHz vector network analyzer, for example, an HP 8720A vector network analyzer available from Hewlett-Packard Company, Network Measurements Division, Santa Rosa, Calif., specifically tailored for lightwave measurements. An optical source (the lightwave source 14) and receiver (the lightwave receiver 16) are incorporated into the vector network analyzer by expanding an extant electrical test set (the electrical test set 18) to incorporate an optical test set (the lightwave test set 12) having optical test ports (the lightwave test ports $12_1$ and $12_2$) and preferably housing the optical source and receiver. Accordingly, the lightwave component analyzer 10 preferably includes both the electrical test set 18 and the lightwave test set 12 so that electrical, E/O, O/E, and optical calibrations and test measurements can be performed.

The electro-optical characteristics of the lightwave source 14 and the opto-electrical characteristics of the lightwave receiver 16 in a test setup have to be sensitive, stable, and repeatable. Also, their modulation bandwidths need to be wider than that of a device under test (DUT) connected to the lightwave test port(s) $12_1$ and $12_2$ and/or the electrical test port(s) $18_1$ and $18_2$. Most of the HP 8720A vector network analyzer is leveraged and reused for the analyzer and information processing portion, as well as the microwave electrical test set portion, of the lightwave component analyzer 10. Conversely, the lightwave test set 12 is added to the lightwave component analyzer 10. The lightwave source 14 and the lightwave receiver 16 incorporated into the lightwave test set 12 preferably have the following performance characteristics.

The lightwave component analyzer 10 provides an optical modulation signal source which preferably generates a high-stability, 1 Hz-resolution synthesized signal that can be swept from 130 MHz to 20 GHz. (See FIG. 2E) As shown in FIG. 2I, the lightwave source 14 preferably comprises a laser operating at 1300 nm followed by an optical isolator, a polarization controller, and a Mach-Zehnder interferometer optical modulator. The optical modulator is driven by a high power microwave signal. A modulation source in the HP 8720A vector network analyzer provides 130 MHz to 20 GHz signals to the RF port of the optical modulator to modulate the lightwave source 14.

The lightwave source 14 is preferably calibrated at the factory and in the field using an approach known as the two-tone technique. This technique is described in a poster paper by Roger Jungerman shown at OFC in New Orleans, La., during January, 1988. The two-tone technique takes advantage of the inherent nonlinearity in the transfer characteristic of the optical modulator. Two closely-spaced RF frequencies are applied to the RF port of the optical modulator. The optical beam carries a modulation component at the difference frequency. As the pair of frequencies is swept over the range of the optical modulator, the beat frequency amplitude traces out the frequency response of the modulator.

Modulation bandwidth of the lightwave source 14 is greater than 20 GHz, with better than $+/-3$ dB flatness. The intensity-modulated light signal from the lightwave source 14 is applied to either the lightwave test ports $12_1$ and $12_2$ of the lightwave test set 12 for calibration of the lightwave component analyzer 10 or to the lightwave test port $12_1$ for a test measurement on a DUT.

The lightwave receiver 16 is a high-stability, high-resolution precision receiver with 50 dB dynamic range which allows measurements over a wide dynamic range and enables the lightwave component analyzer 10 to operate with an optical sensitivity of $-50$ dBm. The lightwave receiver 16 operates with single-mode optical fiber cable. Its optical detector is preferably a PIN photodiode. The lightwave receiver 16 has a modulation bandwidth that preferably extends to 20 GHz, with $+/-3$ dB flatness to 10 GHz, rolling off to $-12$ dB at 20 GHz. Minimum detectable optical signal (for modulations up to 20 GHz) is $-50$ dBm, and the typical optical dynamic range exceeds 40 dB. The 20 GHz modulation bandwidths of the lightwave source 14 and the lightwave receiver 16 provide ample margin for typical test measurements on a DUT.

The lightwave receiver 16 demodulates the modulated optical signal for processing in the lightwave component analyzer 10. The transmission and reflection characteristics of a DUT are then displayed, preferably on a cathode ray tube (CRT) 20 included in the lightwave component analyzer 10. The transmission and reflection data can be displayed either as a function of the RF modulation frequency or as a function of time or distance.

Considered in more detail, calibration and error-corrected test measurements for E/O and O/E devices in accordance with the invention involve switchably connecting the lightwave source 14 and the lightwave receiver 16 and the other portions of the lightwave component analyzer 10, as preferably shown in the schematic diagram of FIG. 2. As shown in FIG. 2I, the lightwave component analyzer 10 preferably incorporates the lightwave source 14 and the lightwave receiver 16 together with a switch matrix in the lightwave component analyzer. As shown in FIG. 2E, the lightwave component analyzer 10 includes a modulation source 22 which generates a 130 MHz to 20 GHz electrical signal. As shown in FIG. 2H1, the electrical signal is preferably input to a power splitter 24 which initially feeds a selected portion of the electrical signal generated by the modulation source 22 to an electro-optical (E/O) transducer in the form of the lightwave source 14. Another portion of the electrical signal generated by the modulation source 22 is fed as a reference signal to one input port of a sampler 26 included in a tuned vector receiver 28 incorporated into the lightwave component analyzer 10, as shown in FIG. 2K.

There are several features of the hardware which distinguish the lightwave component analyzer 10 from both the HP 8720A vector network analyzer and the HP 8702A lightwave component measurement system. These features are the addition of a switch matrix comprising five additional RF switches in the electrical test set 18 and the lightwave test set 12 and the complete integration of the lightwave hardware into the lightwave component analyzer 10, preferably into the lightwave test set. The RF switches are preferably controlled through the normal user interface of the leveraged HP 8720A vector network analyzer and its resident microprocessor-based internal instrument controller in response to user selection of various calibration and test measurements.

Considered in more detail, the differences that exist between the electrical test set 18 and the microwave test set in the HP 8720A vector network analyzer are as follows. As shown in FIGS. 2H1 and 2K, RF switches S5, S6, and S7 are added. Also, a higher power microwave modulator and amplifier combination comprises the modulation source 22 to increase the RF power at the electrical test port $18_1$ to +10 dBm (from −10 dBm in the HP 8720A vector network analyzer). Furthermore, a new ALC circuit is added to interface with the new microwave modulator in the new modulator-amplifier combination. (See FIG. 2A.) Additionally, the RF attenuator before the R channel input is increased to 40 dB to optimize the RF power into the R channel, as shown in FIGS. 2H1.

As shown in FIG. 2I, the optical source chain of the lightwave source 14 preferably comprises a CW semiconductor Fabry-Perot laser followed by an optical isolator, a polarization controller, and a Mach-Zehnder optical modulator. The polarization controller is needed to apply linearly polarized light at the appropriate angle to the input of the optical modulator.

The optical modulator is the device in the optical chain which superimposes the amplitude modulation envelope onto the CW laser light. The most important advantage of implementing the lightwave source 14 by means of an optical modulator instead of directly modulating the laser diode is that minimal fm chirp is generated with the optical modulator, which would otherwise occur when directly modulating a laser diode.

The optical isolator is present to stabilize the lightwave source 14 from back-reflected light which can be caused by any reflection interface in the measurement configuration, i.e., the optical modulator, optical connector interfaces, and test devices including optical launches into photodiodes, laser chip launches into fiber, etc.

An RF leveling loop is connected from the optical modulator to the microwave modulator-amplifier of the lightwave test set 12. The primary function of the RF leveling loop is to control the RF power drive into the optical modulator so that the modulated optical power is maximized and the modulation frequency response of the lightwave source 14 is optimally smooth.

As shown in FIGS. 1 and 2, the lightwave test set 12 preferably further comprises an additional optical, or lightwave, test port $12_3$. Furthermore, the lightwave test set 12 further comprises an optical switch 32. If the optical switch 32 is positioned as shown in FIG. 2I, the internal Fabry-Perot laser provides light to be modulated. If a user desires light of a different optical frequency to be modulated, however, the user merely actuates the optical switch 32 to the other position shown in FIG. 2I and connects the output of an external laser (not shown) to the lightwave test port $12_3$.

As shown in FIGS. 2H1, 2I, and 2K, the utilization of the six RF switches (S4 through S9) allows the routing of the RF input and output signals appropriately so that measurements of electrical, electro-optical, opto-electrical, and optical devices can be performed by a user more repeatably and easily. The RF switches S4, S5, S6, and S7 preferably reside in the electrical test set 18 and multiplex the HP 8720A vector network analyzer functions between RF and lightwave measurements. The RF switches S8 and S9 preferably reside in the lightwave test set 12. The RF switch S9 provides a way to monitor the RF power throughput of the optical modulator and indirectly a way to predict the modulated optical power as a function of frequency. The use of the RF output port of the optical modulator to obtain this signal avoids the need for a power tap preceding the modulator, allowing full power to be applied to the modulator. As shown in FIGS. 2E, 2H1, and 2I, the modulated RF signal is derived from the synthesized RF modulation source 22 through the RF switch S5 in series with an attenuation pad and a modulator-amplifier in the lightwave test set 12 and through the RF switch S8 to the RF drive port of the optical modulator.

FIG. 3 shows a table of RF switch settings for the lightwave component analyzer 10 configured to perform test measurements. The legend shown in FIG. 2Q facilitates an understanding of the connections which configure the switch matrix for performing these measurements.

FIG. 3 shows the RF switch configurations when measuring each device type, i.e., electrical (E/E), electro-optical (E/O), opto-electrical (O/E), and optical (O/O). With the switch matrix, measurements (E/E, E/O, O/E, and O/O) can be performed more accurately, repeatably, and easily. If different samplers are available, either the input and/or the output can be sampled. Accordingly, two test measurements can be performed simultaneously. A significant advantage which is a consequence of the internal RF switches is better measurement repeatability than if the RF connections were preformed manually. The repeatability of manual RF connections and disconnections is on the order of a few tenths of a decibel, as opposed to a few hundredths of a decibel repeatability for RF switches. Measurements require less time, as the number of steps in the measurement process is decreased by 40%.

Since the lightwave source 14 and the lightwave receiver 16 are integrated into the lightwave component analyzer 10, a unique calibration can be stored in the internal instrument memory. Accordingly, a user is allowed faster, more convenient, and easier calibrations and test measurements.

Calibration in connection with strictly electrical measurements is performed as in the HP 8720A vector network analyzer. Calibration in connection with electro-optical (E/O), opto-electrical (O/E), and optical measurements initially involves the lightwave component analyzer 10, lightwave source 14, and lightwave receiver 16. When the lightwave component analyzer 10 is used to characterize an E/O, O/E, or optical device, an initial calibration reference is established based on the known characteristics of the lightwave source 14 and the lightwave receiver 16.

Both the lightwave source 14 and the lightwave receiver 16 are earlier characterized in terms of their modulation (and demodulation) transfer characteristics (both absolute magnitude and phase) at the factory. The calibration data for accurate characterization of the lightwave source 14 and the lightwave receiver 16 are preferably measured at the time of construction or later maintenance and stored in EEPROMS in internal instrument memory. The lightwave component analyzer 10 incorporates firmware which can combine the calibration data arrays for use in subsequent measurements of fiber optic systems, subsystems, and associated component test measurements.

A user calibration measurement is then performed on the lightwave component analyzer 10 including the lightwave source 14 and/or the lightwave receiver 16, as well as the associated electrical and/or optical connections provided by the RF switch matrix, and error correction data are produced in the internal instrument controller by combining the factory and user calibration data, and the error correction data are then stored in the lightwave component analyzer internal instrument memory. The modulation (or demodulation) transfer characteristics are preferably given in terms of the responsivity magnitude and phase versus modulation frequency.

Figure 9:
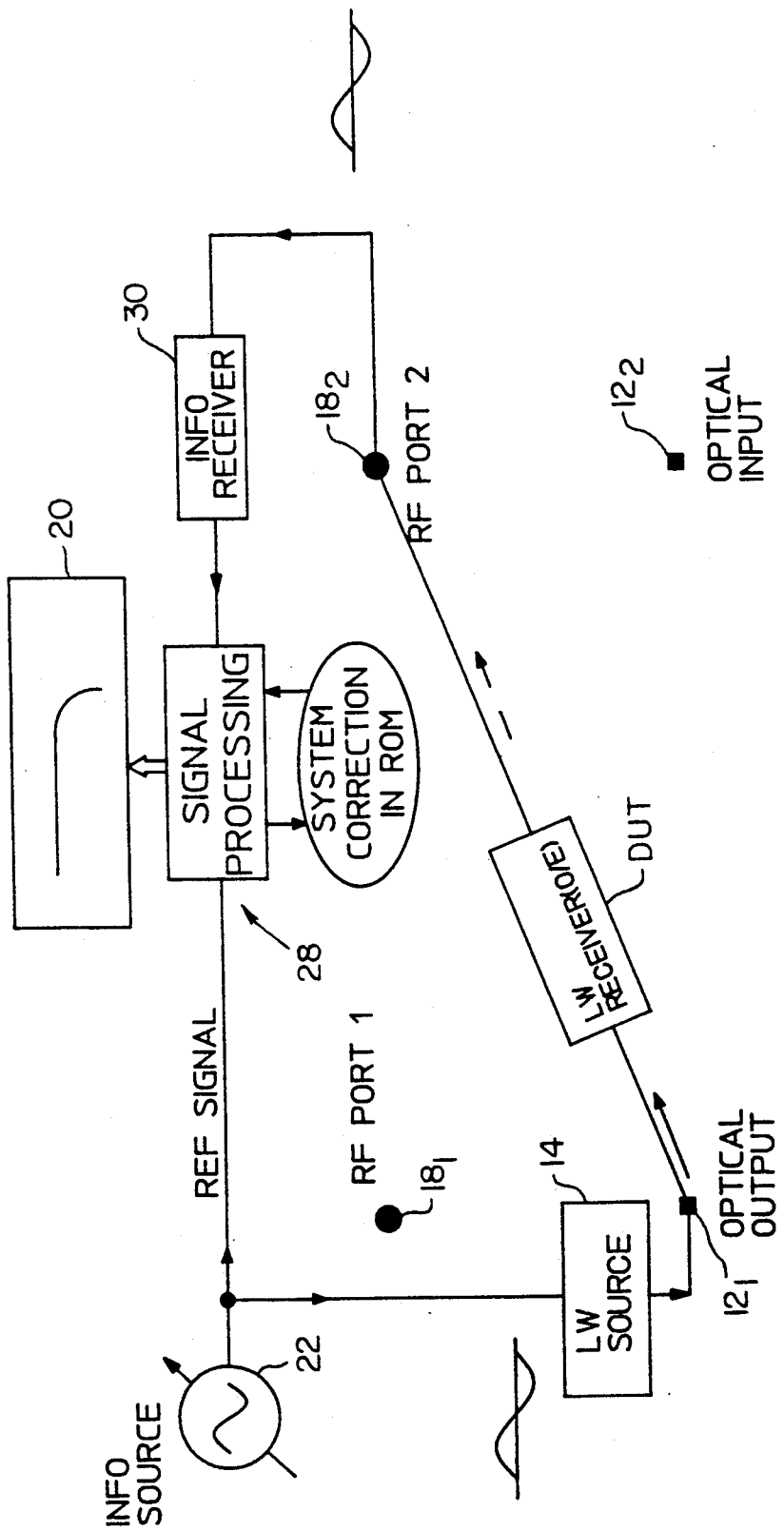
FIG. 9 is a simplified block diagram for measurements on an O/E device with the lightwave component analyzer shown in FIG. 2.

The internal instrument controller firmware of the lightwave component analyzer 10 incorporates coded instructions to perform the needed RF switch connections for the calibration process and while measuring the response characteristics of a DUT during desired test measurements. A calibration or measurement can be performed easily and quickly by user selection of the desired calibration or test measurement by actuation of a hard or soft key on the normal user interface of the leveraged HP 8720A vector network analyzer. The lightwave source 14 converts the electrical signal generated by the modulation source 22 to an optical signal. The optical signal produced by the lightwave source 14 is initially input to at least one opto-electrical electrical (O/E) transducer in the form of the lightwave receiver 16 during calibration. After calibration, a DUT in the form of an opto-electrical fiber optic system, subsystem, or associated component can have its input(s) connected to the lightwave test port(s) $12_1$ and $12_2$ of the lightwave test set 12 at the output(s) of the lightwave source 14 and its output(s) connected to the electrical test port(s) $18_1$ and $18_2$ of the electrical test set 18 so that the DUT can be tested, as shown in FIGS. 6B and 9.

Figure 7:
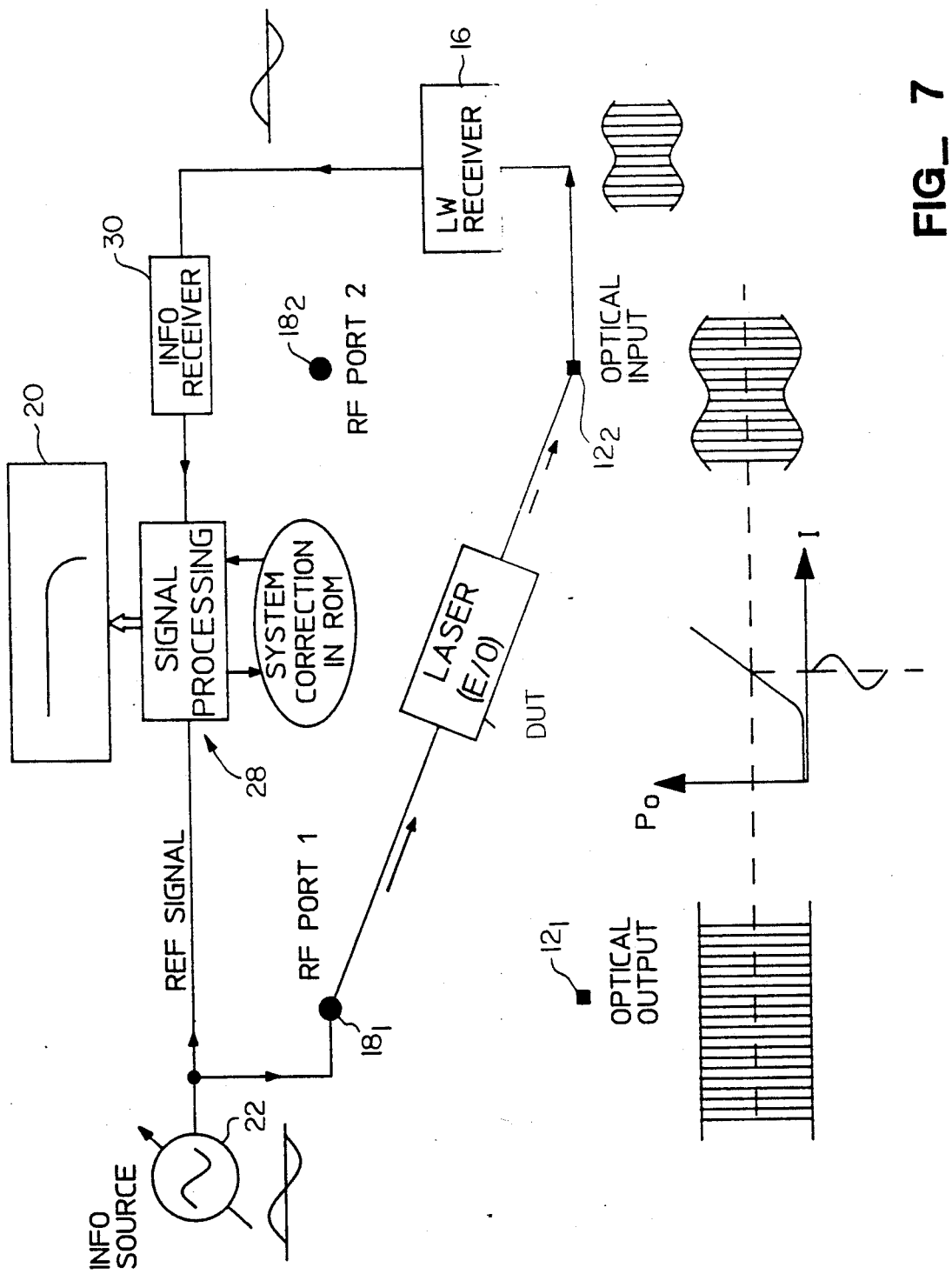
FIG. 7 is a simplified block diagram for measurements on an E/O device with the lightwave component analyzer shown in FIG. 2.
Figure 8:
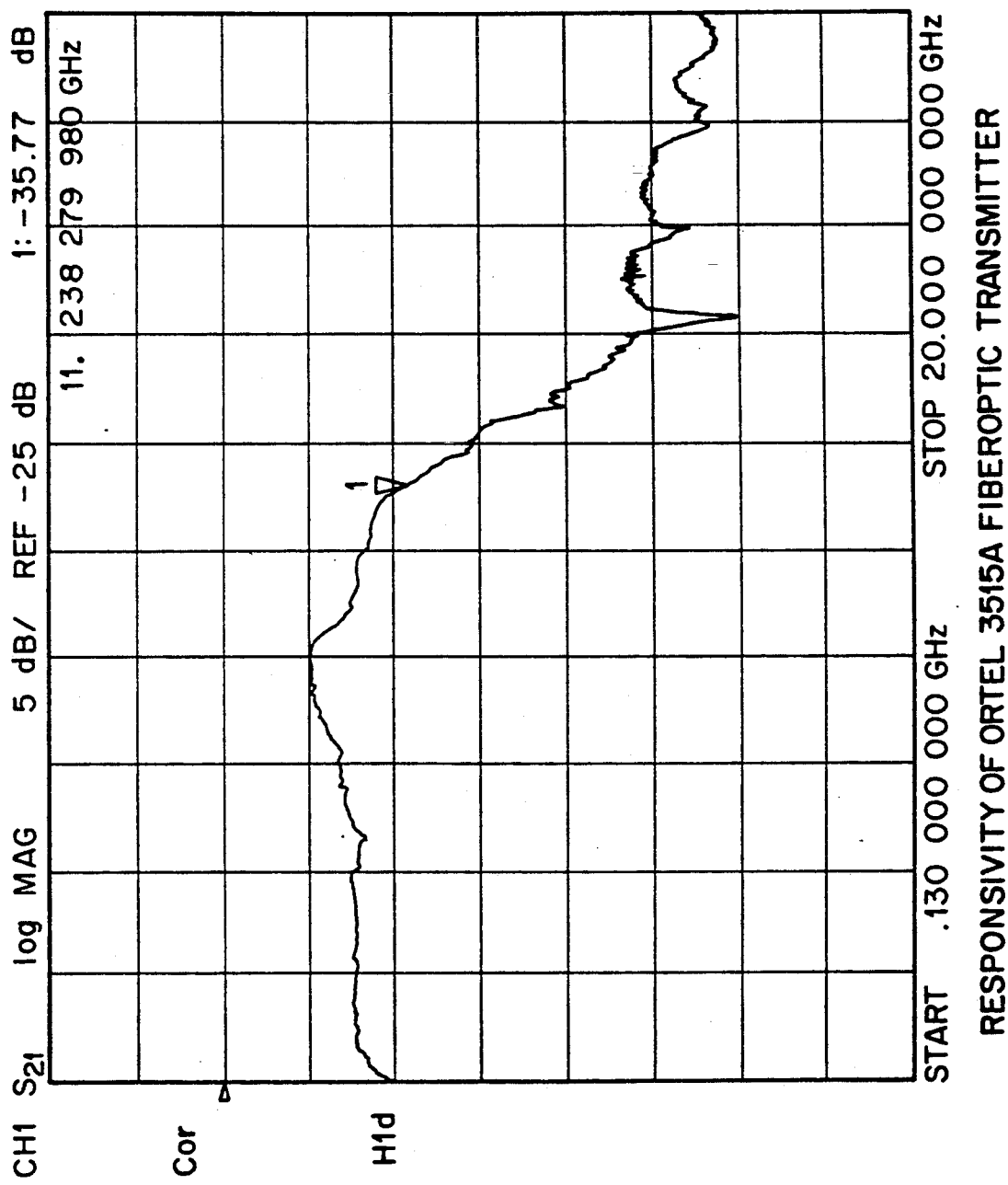
FIG. 8 illustrates data from an exemplary E/O device measurement in accordance with FIG. 7.

The lightwave receiver 16 reconverts the received optical signal to an electrical signal. As shown in FIG. 2K, the electrical signal produced by the lightwave receiver 16 is fed to another sampler 30 of the tuned vector receiver 28 during calibration. After calibration, a DUT in the form of an electro-optical fiber optic system, subsystem, or associated component can have its input(s) connected to the electrical test ports $18_1$ and $18_2$ of the electrical test set 18 and its output(s) connected to the lightwave test port(s) $12_1$ and $12_2$ of the lightwave test set 12 at the input(s) of the lightwave receiver 16 so that the DUT can be tested, as shown in FIGS. 6A and 7.

Optical calibrations ad test measurements are performed by connections across the lightwave test ports $12_1$ and $12_2$ of the lightwave test set 12, as shown in FIGS. 6C and 11. Optical reflection (one port optical) calibrations and test measurements are also performed by connections to the lightwave test ports $12_1$ and $12_2$ of the lightwave test set 12, as shown in FIG. 13.

By including features of a conventional S-parameter calibration, the user can reduce uncertainty caused by imperfect electrical test port impedance match as will now be described. This improves the accuracy of E/O and O/E test measurements.

As shown in FIG. 4, a laser diode is an E/O device which can have an electrical input impedance of approximately 5 ohms, for example, which is significantly lower than the measurement system output impedance of 50 ohms at electrical test port $18_1$. This poor impedance match results in standing waves between the RF source and the input port of the laser under test. A large systematic error is seen as a periodic ripple in the test measurement. The actual transmission frequency response does not contain this ripple. Electrical-source-to-E/O-device impedance mismatch calibration and error correction in accordance with the invention provide a more accurate test measurement by removing source match error.

The electrical-source-to-E/O-device calibration steps are as follows. Five steps are needed.

The first step is to measure a short on electrical test port $18_1$. The second step is to measure an open on electrical test port $18_1$. The third step is to measure a load on electrical test port $18_1$. The data measured during these steps are used to calculate forward source match (Esf), forward reflection tracking (Erf), and forward directivity (Edf). The fourth step is to measure isolation, which is used as Exf. Finally, the fifth step is to measure electrical and optical through connections, which are used to calculate transmission tracking (Etf). The above five steps can be performed in any order.

After the five steps of this calibration are performed, the appropriate error correction data can be stored. Thereafter, the equation to error-correct E/O devices is:

$$S21_{actual} = \frac{\frac{(S21\ meas - Exf)}{Etf}}{1 + \frac{(S11\ meas - Edf)}{Erf} Esf}$$

where
S21 meas is the measured transmission parameter containing systematic errors;
S21 actual is the corrected transmission parameter with source, match, cross-talk, and transmission tracking errors removed;
S11 meas is the measured, uncorrected electrical reflection parameter;
Edf is forward directivity;
Erf is forward reflection tracking;
Esf is forward source match;
Exf is isolation; and
Etf is transmission tracking.

Figure 5:
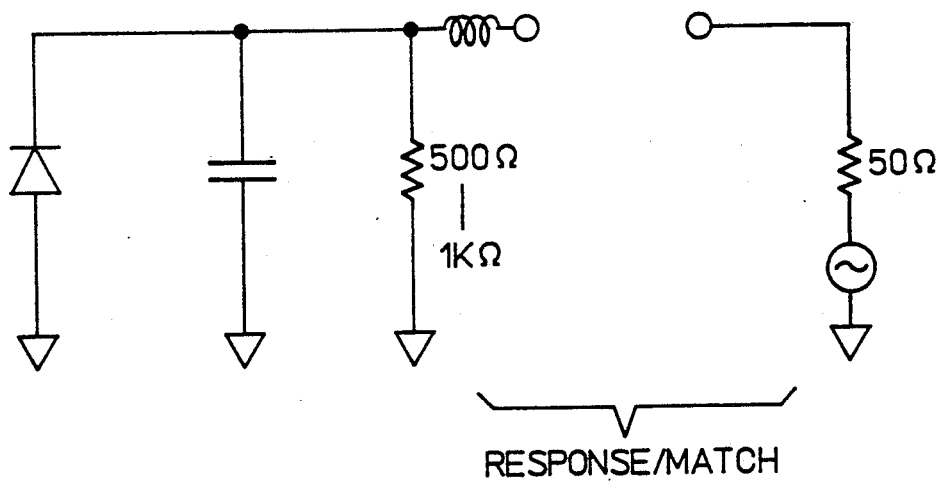
FIG. 5 is a schematic diagram of interconnection of an opto-electrical device to an electrical receiver useful for explaining one embodiment of opto-electrical-device-to-electrical-receiver impedance mismatch calibration and error correction in accordance with the invention.

Also, as shown in FIG. 5, a photodiode is an O/E device which can have an electrical output impedance of approximately 500 ohms, which is an impedance larger than the measurement system input impedance. This also results in a large systematic error which manifests itself as a ripple in the test measurement. O/E-device-to-electrical-receiver impedance mismatch calibration and error correction in accordance with the invention processes the measured data to remove load match errors to provide a more accurate test measurement.

The O/E-device-to-electrical receiver calibration steps are as follows. Nine steps are needed.

The first step is to measure a short on electrical test port $18_1$. The second step is to measure an open on electrical test port $18_1$. The third step is to measure a load on electrical test port $18_1$. The data measured during these first three steps are used to calculate load match (Elf). The fourth step is to measure a short on electrical test port $18_2$. The fifth step is to measure an open on electrical test port $18_2$. The sixth step is to measure a load on electrical test port $18_2$. The data measured during the fourth through sixth steps are used to calculate reverse source match (Esr), reverse reflection tracking (Err), and reverse directivity (Edr). The seventh step is to measure isolation, which is used as Exf. The eighth step is to measure an electrical through, which is used to calculate Elf. Finally, the ninth step is to measure electrical and optical through connections, which are used to calculate Etf. The above nine steps can be performed in any order.

After the nine steps of this calibration are performed, the appropriate error correction data can be stored.

Thereafter, the equation to error-correct O/E devices is:

$$S21_{actual} = \frac{1 + \frac{(S22\ meas - Edr)}{Err}(Esr - Elf)\frac{(S21\ meas - Exf)}{Etf}}{1 + \frac{(S22\ meas - Edr)}{Err}Esr}$$

where
S21 meas is the measured transmission parameter containing systematic errors;
S21 actual is the corrected transmission parameter with load match, cross-talk, and transmission tracking errors removed;
S22 meas is the measured, uncorrected electrical reflection parameter;
Edr is reverse directivity;
Err is reverse reflection tracking;
Esr is reverse source match;
Exf is isolation;
Elf is load match; and
Etf is transmission tracking.

These two forms of calibration and error correction can be thought of as subsets of full two-port, twelve-term error correction. Due to the nature of E/O devices, the reverse transmission is assumed to be zero. No correction is made for the impedance match at the optical port, and so the optical port match is assumed to be ideal. The full two-port error correction equations reduce to require only two measured parameters instead of four. Error correction of E/O devices requires five correction coefficients, while error correction of O/E devices requires six coefficients.

Edf, Edr, Erf, Err, Esf, Esr, Exf, Elf, and Etf can be calculated based on the preceding calibration measurements, as is well known. See, for example, *Vector Measurements of High Frequency Networks.* Hewlett-Packard Company Part No. 5958-0387 (Apr. 1, 1989), pages 3-5 to 3-16. The reflection coefficients may also be used for one-port error correction of S11 for E/O devices and S22 for O/E devices.

Accordingly, transmission measurements of E/O devices are corrected for source match errors, and transmission measurements of O/E devices are corrected for load match errors, in addition to frequency response and cross-talk error correction. Electrical-source-to-E/O-device impedance mismatch and O/E-device-to-electrical-receiver impedance mismatch calibration and error correction in accordance with the invention provide improved measurements of test devices with an electrical port having an impedance different from the impedance of the lightwave component analyzer 10.

The measurement of calibration standards and test device parameters is controlled by the lightwave component analyzer 10 as specified in the firmware. The calculation of error correction coefficients and the computation of the error correction algorithms using these coefficients is also contained in the analyzer firmware. The following is a copy of the firmware for the HP 8720A vector network analyzer internal instrument controller, which is executed to perform calibration and test measurements in accordance with the invention.

This module contains instructions to control measurement of calibration standards. This module also calculates error correction coefficients after the calibration standards are measured.

```
M68KL,P,"cal"
BEGIN

#FILE crins;      & oeo_cal_ary_ready &
#FILE cdommenu;   & Clist_freq, Clog_freq
                  &
#FILE cchtable;
#FILE cparams;
#FILE ccalmenu;
#FILE cmenu;
#FILE cresp;
                  & hd_cal_title, ch_e_coeff_base
                  &
COMMENT              ch_frequency_span, ch_
 average_factor
                     Cresponse_type, Cclass
_done, Ccorrection
                     Comit_isol, Ccal_s_refl,
Ccal_refl
                     Ccal_s_thru, Ccal_thru,
Ccal_s_isol, Ccal_isol
                     Cport1_std1, Cport2_st
d3, Cif_avg
```

```
                        PORT_ONE_REFL, PORT_TWO_
REFL
                        CAL_TWO_TERM_MENU, SAVE_
MENU, STD_CLASS_MENU
                        CAL_MENU, CAL_MENU3, CAL_
MENU2, CAL_TYPE_MENU    ;
#FILE cdebugc2; & cal_debug
                        &
#FILE fterm;    & CRLF, WSTR, WHEX, WHex
                        &
#FILE fterm3;   & WNUM, WREAL, WCPX
                        &
#FILE ftime2;   & user3_zero
                        &
#FILE cmessag0; & exceeded_available_memory,
  null_message          &
#FILE cmsgcal;  & test_set_not_valid, not_
  finished_caling       &
                & no_cal_in_progress,
connect_std, slide_load &
                        & press_done, press_save,
comp_cal_coeff          &
                        & measuring_std, select_
delete_cal_set          &
                        & more_slides_needed, slide_
mem_stolen              &
#FILE futil3;   & tell, warn, beep_done
                        &
#FILE futil2;   & clr_msg
                        &
#FILE fcal0;    & save_cal, unused_set
                        &
   & fcal00;
                        &
   & fcal01;     corr_off, corr_on
                        &
#FILE ccal;     & response, two_term, one_port_
  on_1                  &
                        & one_port_on_2, two_port,
s_two_port              &
                        & undefined_cal, std_open,
std_load, std_thru      &
                        & std_z, done_1_port, done_
reflection              &
                        & done_trans, done_isol,
  done_class            &
                        & done_two_term
                        &
#FILE fsweep;   & abort_swp, n_swp
                        &
#FILE fmenu;    &
                        &
   & fmenu1;     prev_menu, gen_menu, present_
menu, prior_menu        &
   & fmenu2;     h_cmd, h_off
                        &
```

```
                                &
                              & fmenu3;
                                              &
#FILE fstimuli;   & e_freq_at_pt, pt_at_freq
                                              &
  & cstimuli;
                              &
#FILE fchdata;    & curr_e_ch, num_of_groups
                              &
#FILE fchtable;   & entry_ch_int, e_ch_quad,
 entry_ch_dbl, ch_bit   &
                              & e_ch_bit
                              &
#FILE fcontvar;   &
                              &
  & ccontvar;       generic_param
                              &
  & fcontv1;        param, ch, raw_base, dp_raw
 _base                        &
#FILE ftlib3;     & clr_status_bit
                              &
#FILE ctlib;      & WFGR, WFGF
                              &
#FILE fsize;      & num_mpts, e_ary_size
                              &
#FILE fmemmgr;    &
                              &
  & cmemmgr;
                              &
   & cmemmgr2;     slide_load_arrays_id, error
 _coeff_id                    &
  & fmemmgr3;      release_mem, mem_stolen, mem_
 taken                        &
                              & release_mem_if
                              &
  & fmemmgr0;
                              &
#FILE cheader;    & header_size
                              &
#FILE cstdmenu;   & Cck7mm
                              &
#FILE fstds;      & last_class_element, h_last_
 class                        &
                              & h_last_element, set_std_
 lass, std_measd             &
                              & freq_covered, standard_
 specs                        &
                              & define_opt_std
                              &
  & cstds;         sliding, media_bit, load_bit,
 port1_1st_std    &
 COMMENT            isoln_fwd_std, trans_fwd_
 std, port2_1st_std
                    isoln_rev_std, trans_rev_
 std, freq_resp_std
                    two_term_response_std,
 two_term_offset_std
```

```
                              port_offset, port_size,
  f_min_index, z0_index
                              delay_index, loss_index,
  c0_index, c1_index
                              c2_index, c3_index, z_
  index, type_index
                              type2_index
                              ;
#FILE fstddata;  & set_cal_kit, preset_kit_tbl
                   &
#FILE cparam;    & elec_device, opt_device, eo_
  device, oe_device   &
#FILE fparam;    & new_param, dev_type
                   &
#FILE facttbl2;  & get_param
                   &
#FILE crtitle;   & cal_title_size
                   &
#FILE fmain;     & fini_tell
                   &
#FILE ctestset;  & LTS_sw6 &
#FILE ftestset;  & ts_present
                   &
#FILE fcommand;  & cmd_token
                   &
#FILE factive;   &
                       &
  & cactive;
                       &
  & factv1;        select_act_fcn
                       &

#FILE factv3;    & chk_upd_dom
                       &
#FILE cdisp;     & Cdual_chan &
#FILE fdatap5;   & upd_el_del_list &
#FILE ctrace0;   & update_raw &
#FILE ftrace;    & ch_part &
#FILE fmath0;    & speed_of_light &
#FILE fkernel;   & wait, send &
#FILE fkernel4;  & signal_init &
#FILE fiocnfig;  & eeprom2 base address &
#FILE fswptbl;   & start_freq_of_band &
#FILE ceeprom9;  & eeprom2 constants and oeo_
  offset_tbl &
#FILE fguided;   & draw_cal &
#FILE cguid;     & for CgstdX, Cgcal_XXX &

TYPELENGTH USER3: 8;

SUBROUTINE upd_all_segs;  EXTERNAL.L;
           & in slists &

EXTERNAL INTEGER ARRAY tgrp_num[1:2];
PROCEDURE new_num_grps(channel,num);
   VALUE   channel,num;
   INTEGER channel,num;
```

```
              EXTERNAL.L;

PROCEDURE copy_user3( from_addr, to_addr, size );
   VALUE from_addr, to_addr, size;
   DOUBLE from_addr, to_addr;
   INTEGER size;
                     EXTERNAL;
SUBROUTINE CNV1E_save;
                     EXTERNAL;
USER3 PROCEDURE CNV1e(cpx); VALUE cpx; COMPLE
  X cpx;    EXTERNAL;
USER3 PROCEDURE MPYE;
    EXTERNAL;
USER3 PROCEDURE fst_trig(angle); VALUE angle;
  DOUBLE angle;   EXTERNAL;
DOUBLE PROCEDURE arctan(tan); VALUE tan; USER
  3 tan;    EXTERNAL.L;
SUBROUTINE fetch_CNVE1;
                     EXTERNAL;
SUBROUTINE inc_fetch_CNVE1;
                     EXTERNAL;
REAL PROCEDURE SQRT( x );          VALUE x;
  REAL x;            EXTERNAL;
COMPLEX PROCEDURE exp_cmplx(val); VALUE val;
  COMPLEX val;      EXTERNAL;
REAL PROCEDURE ATAN(R); VALUE R; REAL R;
  EXTERNAL.L;
REAL PROCEDURE  SIN(R); VALUE R; REAL R;
  EXTERNAL.L;
REAL PROCEDURE TENX(X); VALUE X; REAL X;
  EXTERNAL.L;
REAL PROCEDURE LOG10(X); VALUE X; REAL X;
  EXTERNAL.L;

PROCEDURE   cal_done( type );
   VALUE    type;
   INTEGER  type;
                     FORWARD;
EXTERNAL REAL   TwoPi, system_z0;

#EJECT;
INTEGER CONSTANT  user3_length      := 6,
                  min_num_of_slides := 5,
                  real_size         := 4,
                  slide_data_blk    := 7 * real_
  size,
                  num_pts_bk_pt     := 20;

REAL    CONSTANT  unscale_c0 := 1.0@-15,
                  unscale_c  := 1.0@-18,
                  skin_coeff :=-158533.09;
                    & - ( 2*SQRT(freq_radians_
  skin) ) &

COMPLEX CONSTANT complex_1   := {1.0,0.0};
```

```
GLOBAL INTEGER cal_type;

GLOBAL BOOLEAN cal_in_progress,
               meas_std_data;
GLOBAL DOUBLE  cal_coeff_addr;
    & for input_cal_coeff &

GLOBAL INTEGER slid_load_used;    & 1      if
  sliding load used in cal,    &
                                  & 0      if
not... for stestlc, the       &
                                  & system
verification routines         &
                                  & initialized
to   0   in set_cal_type&
BOOLEAN re_cal;
BYTE ARRAY old_cal_title[-1:cal_title_size];

INTEGER cal_stds_remaining,
        num_slides,
        old_param,
        temp_num_of_groups,
        pt_count,
        std_count,
        last_class,
        cal_dev_type;
BOOLEAN refl_computed;
DOUBLE  slide_data_ptr,
        data_source,
        data_destination;

COMMENT number of points in each band of oeo
 cal data;
INTEGER TABLE pts_per_band := 0,0,10,10,29,38
 ,74,152,167,177,342,602;

COMMENT number of point at the first of each
 band;
INTEGER TABLE band_first_pt := 0,0,0,10,20,49
 ,87,161,313,480,657,999;

BYTE      TABLE     check_done    :=
                    done_reflection, done_reflec
tion, done_reflection,
                    done_isol,
                    done_trans,  done_trans,
                    done_reflection, done_reflec
tion, done_reflection,
                    done_isol,
                    done_trans,  done_trans,
                    done_trans,
                    done_two_term, done_two_term
; & check this out dds &
INTEGER TABLE    needed_mask    :=               &
   indexed by cal_done type &
        %7,          &done_1_port                &
```

```
           & bit patterns &
    %1C7,        &done_reflection        &
    %C30,        &done_trans             &
    %208,        &done_isol              &
    %FFF,        &done_2_port            &
      %1,        &done_response          &
   %6000,        &done_two_term          &
    %1C7,        &done_oe_refl           &
   %002F,        &done_eo_match          &
   %01FF;        &done_oe_match          &
INTEGER TABLE cal_stds_needed :=
    & indexed by cal_type &
       0,       & place holder     &
           & bit patterns &
       1,       & response         &
   %6000,       & two term         &
      %7,       & one-port port 1 &
      %7,       & one-port port 2 &
    %FFF,       & two-port         &
    %03F,       & s_two_port &
    %02F,       & eo_match &
    %1FF;       & oe_match &
GLOBAL
BYTE TABLE cal_arrays :=
    & indexed by cal_type &
       0,       & place holder     &
    & number of arrays &
       1,       & response         &
       2,       & two term         &
       3,       & one-port port 1 &
       3,       & one-port port 2 &
      12,       & two-port         &
      12,       & s_two_port &
       5,       & eo_match         &
       9;       & oe_match         &

BYTE TABLE dev_arrays :=
    & indexed by dev_type &
       0,       & e/e &
    & number of extra stds &
       0,       & o/o &
       1,       & o/e &
       2;       & e/o &

INTEGER TABLE eo_class_order :=   & classes are
    stored in this order &
       0,       & port1_1st_std     := 0 &
       1,       & port1_2nd_std     := 1 &
       2,       & port1_3rd_std     := 2 &
       3,       & isoln_fwd_std     := 3 &
       0,       & match_fwd_std     := 4 unuse d &
       4;       & trans_fwd_std     := 5 &

INTEGER TABLE oe_class_order := . & classes are
    stored in this order &
       6,       & port1_1st_std     := 0 &
```

```
        7,      & port1_2nd_std      := 1 &
        8,      & port1_3rd_std      := 2 &
        3,      & isoln_fwd_std      := 3 &
        4,      & match_fwd_std      := 4 &
        5,      & trans_fwd_std      := 5 &
        0,      & port2_1st_std      := 6 &
        1,      & port2_2nd_std      := 7 &
        2;      & port2_3rd_std      := 8 &

INTEGER TABLE calibrate_menu :=       & indexed
   by dev_type &
        CAL_E_MENU,    & elec_device &
        CAL_O_MENU,    & opt_device  &
        CAL_EO_MENU,   & eo_device   &
        CAL_OE_MENU;   & oe_device   &

INTEGER TABLE  cal_menus :=
        & indexed by cal_type &
        0,                      & place holder      &

STD_CLASS_MENU,         & response   &
        CAL_TWO_TERM_MENU,      & two_term temp &
        PORT_ONE_REFL,          & one_port port 1 &
        PORT_TWO_REFL,          & one_port port 2 &

CAL_MENU2,              & two port          &

CAL_MENU3,              & simple two port &

EO_MATCH_MENU,          & eo match          &

OE_MATCH_MENU;          & oe match          &

INTEGER TABLE cal_done_menu :=
        & indexed by cal_type &
        0,
        CAL_TYPE_MENU,
        CAL_TYPE_MENU,
        CAL_TYPE_MENU,
        CAL_TYPE_MENU,
        CAL_MENU2,
        CAL_MENU3,
        EO_MATCH_MENU,          & eo match          &

OE_MATCH_MENU;          & oe match          &

COMMENT This is the error coefficient mem id
   into which the active
           calibration is being stored;

GLOBAL INTEGER cal_mem_id;

#EJECT; COMMENT
```

```
                   cal_size
***********************************************
*                                              *
* Array size required for error coefficient    *
* arrays and array header for the calibration  *
* type.                                        *
*                                              *
* NOTE:  Now defined only for current entry ch -*
*        check other usages                    *
*                                              *
***********************************************
;
DOUBLE PROCEDURE cal_size( type );
   VALUE   type;
   INTEGER type;
   BEGIN & cal_size &
   cal_size :=  INTEGER(cal_arrays[type]+
               dev_arrays[dev_type[curr_e_
 ch]]) * DOUBLE( e_ary_size)
                + header_size;
   END;  & cal_size &

COMMENT
         cal_ary_offset
***********************************************
*                                              *
* 1 <= array_number <= 12                      *
*    NOTE:  Now defined only for curr_e_ch     *
*           check other usages                 *
*                                              *
***********************************************
;
DOUBLE PROCEDURE  cal_ary_offset( array_number,
 type );
   VALUE   array_number, type;
   INTEGER array_number, type;
                    ENTRY;
   BEGIN & cal_ary_offset  & cal_ary_offset := (IF array_number <= cal_
 arrays[type] THEN
             DOUBLE( array_number-1 )*DOUBLE
 ( e_ary_size )
                        ELSE
                           -1);

END;  & cal_ary_offset  &

#EJECT;
COMMENT
***********************************************
***********************************************
;
```

```
COMMENT
                restore_param
**************************************************
**************************************************
;
SUBROUTINE restore_param;
   BEGIN & restore_param &
      new_param( old_param );
   END;   & restore_param &

#EJECT; COMMENT
         deallocate_cal_array
**************************************************
**************************************************
;
SUBROUTINE deallocate_cal_array;
   BEGIN & deallocate_cal_array &
      release_mem( slide_load_arrays_id );
      cal_coeff_addr := 0;
   END;   & deallocate_cal_array &

COMMENT
                 terminate_cal
**************************************************
**************************************************
;
SUBROUTINE terminate_cal;
                      ENTRY;
   BEGIN & terminate_cal & deallocate_cal_array;
      cal_type := undefined_cal;
      cal_in_progress := FALSE;

END;   & terminate_cal &

COMMENT
         cal_mem_allocated
**************************************************
**************************************************
;
BOOLEAN PROCEDURE cal_mem_allocated;
                 ENTRY;
BEGIN
   DOUBLE dummy;
   cal_mem_allocated := TRUE;
   IF mem_taken ( dummy, cal_mem_id ) THEN
      BEGIN
         cal_mem_allocated := FALSE;
         terminate_cal;
```

```
            & display message &
        END;
END cal_mem_allocated;

#EJECT; COMMENT
            allocate_cal_array
****************************************************
****************************************************
;
BOOLEAN PROCEDURE allocate_cal_array( type );

VALUE   type;
    INTEGER type;
    BEGIN & allocate_cal_array &
        DOUBLE calsize;

IF cal_coeff_addr <> 0 THEN
            deallocate_cal_array;

& set up memory for calibration &
        cal_mem_id := error_coeff_id - 1 + unused_
 set;
        IF cal_mem_id >= error_coeff_id THEN
        BEGIN
            calsize := cal_size( type );
            mem_stolen( cal_coeff_addr, cal_mem_id,
 calsize );
        END
        ELSE
            warn( select_delete_cal_set );
        IF cal_coeff_addr <> 0 THEN
            BEGIN
                cal_coeff_addr := cal_coeff_addr
 + header_size;
            END
        ELSE & allocation error &
            BEGIN
                warn( exceeded_available_memory )  ;
                gen_menu( CAL_MENU );
            END;

allocate_cal_array := ( cal_coeff_addr
 <> 0 );

END;   & allocate_cal_array &

#EJECT; COMMENT
               allocate_cal
****************************************************
****************************************************
;
BOOLEAN PROCEDURE allocate_cal( type );
```

```
    VALUE    type;
    INTEGER type;
                    ENTRY;
    BEGIN & allocate_cal &
       BOOLEAN  result;
       cal_type := type;
       cal_in_progress := FALSE;
       num_slides := 0;
       refl_computed := FALSE;
       result := allocate_cal_array( type );
       IF result THEN
          BEGIN
            h_off( Cresponse_type, Cclass_done )  ;
            h_off( Cgstd1, Cgstd5 );
            h_off( Cgcal_none, Cgcal_two_port );

old_param := get_param( curr_e_ch );

END
         ELSE                                & there is
   not enough ram space       &
            BEGIN & else &
                warn( exceeded_available_memory )  ;
                terminate_cal;
            END;   & else & allocate_cal := result;

END;  & allocate_cal &

COMMENT
                    i_cal
***********************************************
***********************************************
;
SUBROUTINE i_cal;
                    ENTRY;
    BEGIN & i_cal &
       cal_mem_id := error_coeff_id;
       deallocate_cal_array;
       cal_type := undefined_cal;
       meas_std_data :=
       cal_in_progress := FALSE;
    END;  & i_cal &
```

The following instructions initiate measurements of calibration standards for a specified type of error correction.

EJECT; COMMENT
            set_cal_type

```
****************************************************
****************************************************
;
PROCEDURE  set_cal_type( type );
   VALUE   type;
   INTEGER type;
   BEGIN & set_cal_type &
    BYTE POINTER bptr;

IF cal_in_progress AND (dev_type[curr_e_
ch] <> cal_dev_type) THEN
         sel_ck( e_ch_bitmap( Cck7mm ) );

set_cal_kit( dev_type[curr_e_ch] );
      & Update cal kit for lightwave parameters & cal_dev_type := dev_type[curr_e_ch];

& For list freq. mode, turn on all &
      & segments prior to a calibration &
      IF e_ch_bit( Clist_freq )= 1  THEN
         upd_all_segs;

slid_load_used:=0;& "Sliding load not used"
flag initialization &

IF ( type = two_port AND NOT ts_present )
OR
         ( type = s_two_port AND ts_present )
THEN
         warn( test_set_not_valid );
      re_cal := ( ( e_ch_bit( Ccorrection ) = 1 )
AND
                 ( type = cal_type ) );
      IF re_cal THEN   & save old cal title &
         BEGIN
            STPNTR( bptr, entry_ch_dbl( ch_e_
coeff_base )
                          - header_size + hd_cal_
title );
            MOVE old_cal_title := bptr, +( cal_
title_size + 1 );
         END
         ELSE            & clear old cal title &
            old_cal_title[0] := 0;
         old_cal_title[-1] := cal_title_size;

old_param := get_param( curr_e_ch );

IF ((type = two_port) OR (type=s_two_port))
                                         AND (old_
param >= 4) THEN
         new_param( IF old_param = 6 THEN 1 ELSE
0 )
      ELSE IF type = eo_match AND (old_param<
```

```
       >0 AND old_param<>15 AND
                                    old_param<
>16) THEN
       new_param( eol_parm + e_ch_bit(Co_port) )
     ELSE IF type = oe_match AND (old_param<
>3 AND old_param<>17 AND
                                    old_param<
>18) THEN
       new_param( oel_parm + e_ch_bit(Ce_port) )
     ELSE IF old_param <= 3 THEN
       BEGIN
          IF      type = one_port_on_1 THEN new_
param( 0 )
          ELSE IF type = one_port_on_2 THEN new_
param( 3 );
       END;

corr_off( curr_e_ch );

& allocate_cal sets cal_type &
     IF (cal_in_progress := allocate_cal( type ))
THEN
       BEGIN & if &
          cal_stds_remaining    := cal_stds_
needed[ type ];

IF ( (cal_type <> two_port) AND
               (cal_type <> s_two_port) AND (cal_type <> eo_match) AND
               (cal_type <> oe_match) ) THEN
                tell( connect_std );

IF cal_type = response THEN
             set_std_class( freq_resp_std )

ELSE
             gen_menu( cal_menus[type] );
       END;   & if &

END;   & set_cal_type &

#EJECT; COMMENT
              set_gcal_type
************************************************
************************************************
;
PROCEDURE  set_gcal_type( kit, type );
   VALUE    kit, type;
   INTEGER  kit, type;
                             ENTRY;
   BEGIN & set_gcal_type &
    BYTE POINTER bptr;

IF cal_in_progress AND (dev_type[curr_e_
```

```
ch] <> cal_dev_type) THEN
      sel_ck( e_ch_bitmap( Cck7mm ) );

set_gcal_kit( kit );
   & Update cal kit,for lightwave parameters & cal_dev_type := dev_type[curr_e_ch];

slid_load_used:=0;& "Sliding load not used"
flag initialization & re_cal := ( ( e_ch_bit( Ccorrection ) = 1 )
  AND
                  ( type = cal_type ) );
   IF re_cal THEN   & save old cal title &
      BEGIN
         STPNTR( bptr, entry_ch_dbl( ch_e_coeff_
base )
                        - header_size + hd_cal_
title );
         MOVE old_cal_title := bptr, +( cal_
title_size + 1 );
      END
      ELSE            & clear old cal title &
         old_cal_title[0] := 0;
      old_cal_title[-1] := cal_title_size;

old_param := get_param( curr_e_ch );

COMMENT
   IF (type = two_port) AND (old_param >=  4)
THEN
         new_param( IF old_param = 6 THEN 1 ELSE
0 )
      ELSE IF type = eo_match AND (old_param<
>0 AND old_param<>15 AND
                                 old_param<
>16) THEN
         new_param( eol_parm + e_ch_bit(Co_port) )
      ELSE IF type = oe_match AND (old_param<
>3 AND old_param<>17 AND
                                 old_param<
>18) THEN
         new_param( oel_parm + e_ch_bit(Ce_port) )
      ELSE IF old_param <= 3 THEN
         BEGIN
            IF     type = one_port_on_1 THEN new_
param( 0 )
            ELSE IF type = one_port_on_2 THEN new_
param( 3 )
         END;

corr_off( curr_e_ch );

& allocate_cal sets cal_type &
   IF (cal_in_progress := allocate_cal( type ))
```

```
THEN
           BEGIN & if &
              cal_stds_remaining    := cal_stds_
  needed[ type ];

set_gstd_class( freq_resp_std );

draw_cal;
           END;   & if &

END;   & set_gcal_type &

#EJECT; COMMENT
                    resume_cal
***************************************************
***************************************************
;
SUBROUTINE resume_cal;
    BEGIN & resume_cal &
       IF cal_in_progress THEN
          BEGIN & if &
             IF cal_mem_allocated THEN
                gen_menu( cal_menus[cal_type] );
          END    & if &
       ELSE
          warn( no_cal_in_progress );
    END;   & resume_cal &

SUBROUTINE clr_msg_and_in_progress;
    BEGIN
    clr_msg ( comp_cal_coeff );
    cal_in_progress := FALSE;      & needs to be
 false after a "compute" &
    END;
PROCEDURE show_calc_disp ( curr_pt );
     VALUE curr_pt; INTEGER curr_pt;
BEGIN
   INTEGER tell_msg_no;

CASE (( curr_pt / num_pts_bk_pt ) MOD 2 ) OF
   BEGIN
       tell_msg_no := null_message   ;
       tell_msg_no := comp_cal_coeff ;
   END of case statement;
   tell ( tell_msg_no );
END;

#EJECT; COMMENT
              move_slide_val
***************************************************
*                                                 *
```

```
* move_slide_val is used to move data to/from    *
* local stack to more long term memory           *
* IT IS VERY DEPENDENTED ON THE ALLOCATION ORDER *
* OF THE LOCAL STACK                             *
**************************************************
;
PROCEDURE move_slide_val( from_adr, to_adr );
   VALUE from_adr, to_adr;
                                          DOUBLE
  from_adr, to_adr;
    BEGIN
        INTEGER POINTER from = from_adr,
                        to   = to_adr;

MOVE to := from,+(slide_data_blk/2);

END move_slide_val;

SUBROUTINE patch_return_from_slide_menu;
   BEGIN
     present_menu := prior_menu;
     IF last_class_element > 1 THEN
        gen_menu( STD_CLASS_MENU )
        ELSE
        gen_menu( cal_menus[ cal_type ] );
   END;

SUBROUTINE check_slide_arrays;
   BEGIN
   IF mem_stolen( slide_data_ptr, slide_load_
 arrays_id,
                                         slide_data_
 blk * pt_count ) THEN
      BEGIN
      IF ( num_slides > 0 )  OR  ( slide_data_
ptr = 0 ) THEN
         BEGIN     & truly a memory problem, not
1st request &
         num_slides := 0;
         warn( slide_mem_stolen );
         patch_return_from_slide_menu;
         END ;  & real memory problem &
      END ;      & mem_stolen true   &
   END check_slide_arrays;

#EJECT; COMMENT
                   load_slid
**************************************************
**************************************************
;
PROCEDURE load_slid;
BEGIN
REAL ARRAY    values[ 0 : ( slide_data_blk /
 real_size )  - 1 ];
REAL            x,  y,  x2,  y2,  x2_y2,
```

```
                sx = values[ 0 ]     ,sy = values
[ 1 ],
                sx2= values[ 2 ]     ,sy2= values
[ 3 ], sxy = values[ 4 ],
                sx3_y2x = values[ 5 ],sy3_x2y =
   values[ 6 ];
DOUBLE add_src, add_dst;

add_src := data_source;
check_slide_arrays;

IF slide_data_ptr # 0 THEN
   BEGIN
   add_dst := slide_data_ptr ;

REPEAT pt_count DO
       BEGIN
       IF  num_slides = 0 THEN
             sx := sy := sx2 := sy2 := sxy :=
   sx3_y2x := sy3_x2y := 0.0
           ELSE  move_slide_val( add_dst , ADRS(
   values )  );

ASSEMBLE(            MOVE.L add_src,R
8;   JSR    fetch_CNVE1;
           MOVE.L   R0, x;   MOVE.L   R1, y;
       ADD.L  #6, add_src);

x2     := x * x;
       y2     := y * y;
       x2_y2  := x2 + y2;
       sx     := sx  +   x;                      sy
   := sy   + y;
       sxy    := sxy + (x*y);
       sx2    := sx2 + x2;                       sy2
   := sy2  + y2;
       sx3_y2x:= sx3_y2x + (x * x2_y2);   sy3_x
   2y:= sy3_x2y + (y * x2_y2);

move_slide_val( ADRS( values ),  add_ds t );
       add_dst  := add_dst  + slide_data_blk;
       END loop;

num_slides := num_slides + 1 ;
   release_mem_if( slide_load_arrays_id );

END;& array space available &
END load_slid;

#EJECT; COMMENT
              compute_load
************************************************
*                                               *
* PROBLEMS: Due to the limited numerical resolu- *
```

```
* tion a potential problem may occur.  The input   *
* values are points on a circle, and terms to the  *
* third power occur, this means the input resolu-  *
* tion is approx 8 bits.  So the circle finding    *
* routine will find the center of the circle to    *
* -48db of the data.                               *
*     i.e. -- Do NOT expect more than approx -48db *
* accuracy on the circle compaired to the worst    *
* case data value.                                 *
*    NOTE:  Also num of slides have some effect    *
* on the resolution.                               *
****************************************************
;
PROCEDURE compute_load;
BEGIN
REAL          tx, ty, tx2, ty2, txy, tx3_y2x,
   ty3_x2y;
REAL          x, y, det, sx_tx, sy_ty;
REAL ARRAY    values[ 0 : ( slide_data_blk /
  real_size )   - 1 ];
REAL          sx = values[ 0 ]     ,sy = values
  [ 1 ],
              sx2= values[ 2 ]     ,sy2= values
  [ 3 ], sxy = values[ 4 ],
              sx3_y2x = values[ 5 ],sy3_x2y =
  values[ 6 ];
DOUBLE   add_dst, add_src;

IF ( pt_count  > 0 ) THEN check_slide_arrays
  ;

add_src  := slide_data_ptr    ;
add_dst  := data_destination  ;
#EJECT;
IF num_slides < min_num_of_slides THEN
   BEGIN & if not enough slides &
   release_mem_if( slide_load_arrays_id );
   warn( more_slides_needed );
   END    & if not enough slides &
 ELSE
   BEGIN & else enough slides &
   tell( comp_cal_coeff );
   IF pt_count > 0 THEN
    REPEAT pt_count DO
      BEGIN
      move_slide_val( add_src , ADRS( values ) );

tx  :=  sx / num_slides ;            ty
   := sy / num_slides   ;
      tx2 :=  sx2 - ( sx_tx := sx * tx );
      ty2 :=  sy2 - ( sy_ty := sy * ty );
      txy :=  sxy -   sx * ty ;

tx3_y2x := sx3_y2x + ( tx * ( 2.0 * sx_
tx - 3.0*sx2 - sy2 ) )
                           - ( 2.0 * ty * txy ) ;
```

```
       ty3_x2y := sy3_x2y + ( ty * ( 2.0 * sy_
ty - 3.0*sy2 - sx2 ) )
                       - ( 2.0 * tx * txy ) ;
       det      := .5 / ( ( tx2 * ty2 ) - ( txy
 * txy ) ) ;

x        := tx + det * ( ( ty2 * tx3_y2x
 ) - ( txy * ty3_x2y ) ) ;
       y        := ty + det * ( ( tx2 * ty3_x2y
 ) - ( txy * tx3_y2x ) ) ;

ASSEMBLE(  MOVE.L  add_dst, R8;     MOV
E.L  x, R0;  MOVE.L y,  R1;
                 JSR     CNV1E_save;       MOV
E.L  R8, add_dst );

add_src  := add_src + slide_data_blk;
       END;
    num_slides := 0;
    h_last_element;
    IF freq_covered THEN  tell( press_done )
         ELSE tell( connect_std );
     patch_return_from_slide_menu;
     release_mem( slide_load_arrays_id );
     END;  & else enough slides &

END compute_load;

The following instructions store data acquired
during measurements of calibration standards.

#EJECT; COMMENT
                 take_data
************************************************
************************************************
;
PROCEDURE take_data;
   BEGIN & take_data &
   BOOLEAN is_sliding, std_in_band;
   REAL    fmin,  fmax;
   INTEGER class, iclass, pt_start, pt_stop ;

INTEGER temp,
           std_int;
   BYTE std_type;

IF cal_mem_allocated THEN

BEGIN & if cal_mem_allocated &
       std_int := std_measd( fmin, fmax, class );
       is_sliding := TBIT( std_int , load_bit) ;
       std_type := BYTE( RIGHT(std_int,8) );

IF cal_dev_type=eo_device OR cal_dev_type=
```

```
oe_device THEN
    BEGIN
      IF (std_type = std_receiver OR std_type =
std_source) AND
          std_count > 0 THEN
             & put extra arrays for these
standards after all the &
             & regular cal arrays &
          iclass := cal_arrays[cal_type]+(std_
count-1)
      ELSE
        IF cal_type = response THEN
         BEGIN
         iclass := 0;
         class := 0;
         END
        ELSE IF cal_type = two_term THEN
          iclass := two_term_offset_std - class
        ELSE IF cal_type=eo_match THEN
          iclass := eo_class_order[class]
        ELSE IF cal_type = oe_match THEN
          iclass := oe_class_order[class];
    END
  ELSE
    BEGIN
       IF cal_type = one_port_on_2 THEN
          class := class - port_offset
       ELSE IF cal_type = response THEN
          class := 0;
       IF class >= two_term_response_std THEN
          iclass := two_term_offset_std - class
          ELSE
          iclass := class;
    END;

std_in_band    :=   TRUE;
    IF (iclass > (cal_arrays[cal_type] + std_
count-1)) OR
       ( iclass  <   0 ) THEN
       std_in_band:=FALSE; & detection of
invalid cal cmd&

IF e_ch_quad( ch_frequency_span ) = 0 THEN
       BEGIN
         pt_start := 0;
         pt_stop := num_mpts[ curr_e_ch ] - 1;
       END
    ELSE
       BEGIN
         pt_start  :=  pt_at_freq( QUAD( fm in ) );
         pt_stop   :=  pt_at_freq( QUAD( fm
ax ) );
       END;
                         & the following is to make
sure take_data banding
                           agrees  with standard_
``` specs in std_act                problems when buckets
step < 1 Hz      &

IF NOT(fmin <= REAL(e_freq_at_pt(pt_start)))
       THEN IF pt_start < num_mpts[ curr_e_ch ] THEN
                pt_start := pt_start + 1
            ELSE std_in_band := FALSE;

IF NOT(fmax >= REAL(e_freq_at_pt(pt_stop)))
       THEN    IF pt_stop  >   0   THEN
    pt_stop  := pt_stop  - 1
                                        ELSE
std_in_band := FALSE;

pt_count  := pt_stop - pt_start + 1;

IF ( pt_count >  0 )  AND  std_in_band
 THEN
        BEGIN data_source  :=dp_raw_base[curr_e_ch, generic_param ]
                + DOUBLE(   pt_start * user3_length );

IF std_type=std_source OR std_type=std_receiver THEN
            BEGIN
            data_destination := cal_coeff_addr
                + DOUBLE( iclass ) * DOUBLE ( e_ary_size )
                                   + DOUBLE (pt_start * user3_length );
            std_count := std_count + 1;
            send( oeo_cal_ary_ready );
            END
        ELSE
            data_destination := cal_coeff_addr
                + DOUBLE( iclass ) * DOUBLE ( e_ary_size )
                                   + DOUBLE (pt_start * user3_length );

IF is_sliding THEN
            load_slid
          ELSE
            BEGIN copy_user3( data_source, data_destination, pt_count );
            h_last_element;
            END;

```
            END pt_count > 0
      ELSE  BEGIN
            pt_count := 0;
            h_last_element;
            END;

IF freq_covered OR is_sliding THEN
         BEGIN
            IF is_sliding THEN
               BEGIN
               IF pt_count <= 0 THEN num_slides
  := min_num_of_slides;
               IF num_slides < min_num_of_slides
                  THEN tell( slide_load)
                ELSE   tell( press_done );
               END;
            cal_stds_remaining := RBIT( cal_stds_
remaining, class );
            last_class := class;
         END
       ELSE tell( connect_std );

COMMENT meas_std_data remains true until
all sweeps are
               taken for the std;
     IF std_count=0 OR (std_type=std_source
AND std_count=3) OR
          (std_type=std_receiver AND std_count
=2) THEN
          meas_std_data := FALSE;

END;   & if cal_mem_allocated &

END;   & take_data &

#EJECT;
PROCEDURE zero_std( std );

VALUE std;  INTEGER std;
BEGIN cal_stds_remaining := RBIT( cal_stds_remaining,
 std );
  IF cal_in_progress THEN
     user3_zero( cal_coeff_addr
                 + DOUBLE( std )*DOUBLE( e_
ary_size ),
                 num_mpts[ curr_e_ch ]);
END zero_std;

SUBROUTINE omit_2_isolation;
BEGIN
  zero_std( isoln_fwd_std );
```

```
   zero_std( isoln_rev_std );
   h_cmd(Comit_isol);
   beep_done;
   tell( press_done ) ;
END omit_2_isolation;
SUBROUTINE omit_1_isolation;
BEGIN
   zero_std( isoln_fwd_std );
   h_cmd(Comit_isol);
   beep_done;
   tell( press_done );
END omit_1_isolation;

SUBROUTINE omit_isolation;
   IF cal_type = eo_match THEN
     omit_1_isolation
   ELSE IF cal_type = oe_match THEN
     omit_1_isolation
   ELSE
     omit_2_isolation;

#EJECT; COMMENT
                       z_to_s
***************************************************
***************************************************
;
COMPLEX PROCEDURE z_to_s( z );            VALUE
   z;      COMPLEX z;
BEGIN
   z_to_s  :=  ( z - system_z0 ) / ( z + system_
   z0 );
END z_to_s;

#EJECT;
COMMENT
                    circ_interp
***************************************************
*                                                 *
* Given a set of input parameters, read in an     *
* array of data, execute an interpolation algor-  *
* ithm on it and then write out the results to    *
* another array.                                  *
*                                                 *
***************************************************
;
COMPLEX PROCEDURE circ_interp( freq, array );

VALUE freq, array;
   REAL freq;
   INTEGER array;
BEGIN
   INTEGER band,pt;
   REAL
      start_freq,stop_freq,ratio,
      Ax, Ay, Bx, By,
      P1x, P1y, P2x, P2y, P3x, P3y,
```

```
   M1, M2, B1, B2, Cx, Cy;
DOUBLE fetch_ptr = REGISTER 8;
DOUBLE Ang,Ang1,Ang2,Ang3,Theta,data_addr;

USER3 Center,P1t,P2t,P1,P2;
COMPLEX result;
BOOLEAN pos_theta;
INTEGER CONSTANT max_band := 11;   & must
match table in sswptbl & data_addr := ADRS(eeprom2_base) + oeo_offset_
tbl[array-1] + oeo_hd_sz;

COMMENT determine band containing freq;
  band := 0;
  start_freq := REAL( start_freq_of_band[band] )
* 100000.;
  WHILE (freq > start_freq) AND (band <= max_
band) DO
     BEGIN
     band := band + 1;
     start_freq := REAL( start_freq_of_band
[band] ) * 100000.;
     END;
  band := band-1;
  stop_freq := start_freq;
  start_freq := REAL(start_freq_of_band[band])
* 100000.;

ratio := (freq - start_freq)/(stop_freq -
start_freq);
  pt := INTEGER(( ratio * REAL(pts_per_band
[band])) MOD 1.0) + band_first_pt[band];

IF freq=start_freq OR freq=stop_freq THEN

BEGIN
     fetch_ptr := data_addr + (pt*user3_length);
     fetch_CNVE1;
     ASSEMBLE( MOVEM.L R0/R1, result );
     END
  ELSE
  BEGIN   & freq<>start freq<>stop &

IF (pt-band_first_pt[band]) > pts_per_band
[band]/2 THEN
        pt := pt-1; & backward, else forward &
        pos_theta := FALSE;

fetch_ptr := (pt*user3_length)+data_addr;
        fetch_CNVE1;
        ASSEMBLE (MOVE.L  R0,P1x);
        ASSEMBLE (MOVE.L  R1,P1y);
```

```
        fetch_ptr := user3_length+data_addr;
        fetch_CNVE1;
        ASSEMBLE (MOVE.L   R0,P2x);
        ASSEMBLE (MOVE.L   R1,P2y);

fetch_ptr := user3_length+data_addr;
        fetch_CNVE1;
        ASSEMBLE (MOVE.L   R0,P3x);
        ASSEMBLE (MOVE.L   R1,P3y);

Ax := (P1x+P2x)/2;
        Ay := (P1y+P2y)/2;
        Bx := (P2x+P3x)/2;
        By := (P2y+P3y)/2;

IF P2y=P1y THEN P2y := P1y+.0000001;
        M1 := (P1x-P2x)/(P2y-P1y);
        IF P3y=P2y THEN P3y := P2y+.0000001;
        M2 := (P2x-P3x)/(P3y-P2y);
        B1 := Ay- (M1*Ax);
        B2 := By- (M2*Bx);
        IF M1=M2 THEN M2 := M2+.00001;
        Cy := ((B2*M1)-(B1*M2))/(M1-M2);
        IF M1=0 THEN Cx := (B1-B2)/M2
                ELSE Cx := (Cy-B1)/M1;

P1 := CNV1e(COMPLEX (P1x , P1y));
        Center := CNV1e(COMPLEX (Cx,Cy));

P1t := CNV1e(COMPLEX (P1x-Cx, P1y-Cy) );
        Ang1 := arctan (P1t);
            & arctan (P2t) &
        Ang2 := arctan (CNV1e(COMPLEX (P2x-Cx,
P2y-Cy)));
        IF Ang2 > Ang1 THEN
        BEGIN       & positive angle between P1
and P2 &
            pos_theta := TRUE;
            Ang := Ang2 - Ang1;
        END
        ELSE
        BEGIN       & negative angle between P1
and P2 &
            pos_theta := FALSE;
            Ang := Ang1 - Ang2;
          END;
          & assume phase change between two
adjacent frequency &
          & points is not greater than 180
degrees   &
        IF TBIT (Ang, 17) THEN
        BEGIN
            Ang := %40000 - Ang;    & Ang := 360deg
- Ang &
            & take the complement of pos_theta &
```

```
            IF pos_theta THEN pos_theta := FALSE
                        ELSE pos_theta := TRUE;
        END;

Theta := Ang * ratio;

IF Theta > 7 THEN   & 7 = .01 degree, very
small angle &
    BEGIN
        & convert theta to special complex
angle representation &
        & e^j*theta=COS(theta)+j*SIN(theta) &
        fst_trig (Theta);
        IF NOT pos_theta THEN
        BEGIN
            & Need fst trig results for negative
Theta &
            & SIN(-Theta) = -SIN(Theta), COS(-
Theta)= COS(Theta) &
            ASSEMBLE ( SWAP      R0;
                       NEG.W     R0;
                       SWAP      R0);
        END;
        COMMENT do complex multiple (rotation
on complex plane)
                (e^j*theta) * P1t
                    fst_trig result already in
R0-R1;
        ASSEMBLE( MOVEM.L   P1t,R2-R3);
        MPYE;

COMMENT do complex addition(translate
on complex plane)
                 Pinterp + Center
                 MPYE result already in R0-R 1;
        ASSEMBLE( MOVEM.L   Center,R2-R3);
        ASSEMBLE (JSRX ADDE; JSRX CNVE1; MOVE
M.L R0/R1,result );
    END
    ELSE
    BEGIN
        ASSEMBLE( MOVEM.L P1, R0/R1 );
        ASSEMBLE (JSRX CNVE1; MOVEM.L R0/R1,
result );
    END;

END freq<>start_freq<>stop;

circ_interp := result;
        END;
```

The following is a mathematical model for electrical calibration standards.

```
#EJECT; COMMENT
                std_act_elec
*********************************************
*********************************************
;
COMPLEX PROCEDURE std_act_elec( freq,   std_addrs );
                                        VALUE
 freq,   std_addrs;
                                        REAL
 freq; DOUBLE std_addrs;
BEGIN
INTEGER type;
REAL    freq_radians, f1, skin_factor, delay,
  z_mech;
COMPLEX result, skin_cpx, S11, S21, exp, R, R
 _exp, denom;
REAL POINTER std_coeff;
BYTE POINTER std_type = std_coeff;
REAL real_result = result, imag_result = result
 + 4;
DOUBLE d= std_coeff;
                & DEBUG &

SUBROUTINE offset_result;
BEGIN
   IF delay # 0.0 THEN
      BEGIN
      z_mech       := std_coeff[    z0_index ]  ;

IF TBIT( std_type[ type2_index ], media_
bit ) THEN
         BEGIN  &waveguide&
         f1   := std_coeff[ f_min_index ]  /
freq;
            & denormalize delay to fmax and
compute for present freq &
         delay:= delay * SQRT( (1.0 - ( f1 *
f1 )) );
         skin_factor := 0.0;
         END    &waveguide&
      ELSE       & coax    &
         skin_factor := std_coeff[  loss_inde x ] /
                    ( SQRT( freq_radians )
* z_mech * skin_coeff );

skin_cpx := COMPLEX( 1.0 - skin_factor,
skin_factor );
         R    :=  z_to_s( z_mech * skin_cpx );
      exp :=
           exp_cmplx( COMPLEX( 0.0 , -delay * freq_
radians ) * skin_cpx );

IF type # std_thru THEN
         BEGIN
         R_exp    := R * exp;
         denom    := complex_1 - ( R_exp * R_
```

```
exp );
        denom     := 1.0 / denom;
        S11       := ( R - ( R_exp * exp )
) * denom;
        S21       := ( exp - ( R_exp * R )
) * denom;
        result := S11 + ( ( S21 * S21 * result )
                          / ( complex_1 - ( S1
1 * result ) ) );
        END & not a thru &
      ELSE result := exp;  & is a thru &
    END non zero delay;
END offset_result;

STPNTR( std_coeff, std_addrs );

freq_radians := TwoPi * freq;
type    := std_type[ type_index ];

delay    := std_coeff[ delay_index ];

result    := 0.0;

IF type = std_thru THEN
       &thru& BEGIN
              real_result := 1.0;
              END
 ELSE
   BEGIN
   IF type = std_open   THEN
       &open&BEGIN
              f1 :=  freq * 1@-9;
              imag_result := (std_coeff[c0_index]
* unscale_c0)
                             + ( f1 * unscale_c
* ( std_coeff[c1_index]
                             + ( f1 * ( std_
coeff[c2_index]
                             + ( f1 * std_coeff
[c3_index] ) ) ) );
                                    & order
importmant -- overflow prob&
              IF ABS( imag_result ) < 1.@-20
 THEN imag_result :=1.@-20;
              imag_result := -1.0 / ( imag_
result * freq_radians );
              END
    ELSE IF type = std_load  THEN
        &load& real_result := system_z0
     ELSE IF type = std_z       THEN
         & z  & real_result := std_coeff[ z_index ]
; COMMENT unneeded
      ELSE IF type = std_short THEN
         &short&         &default value are correct
```

```
&   ;

result := z_to_s( result );
   END not a thru;

offset_result;

std_act_elec := result;
END std_act_elec;

The following are mathematical models for optical
calibration standards.

#EJECT; COMMENT
                 std_act_opt
********************************************
********************************************
;
COMPLEX PROCEDURE std_act_opt( freq, std_addrs );
   VALUE freq, std_addrs;
   REAL freq;
   DOUBLE std_addrs;
   BEGIN
   INTEGER type;
   REAL freq_radians, delay, loss_dB, loss,
 reflect;
   COMPLEX result, exp;
   REAL POINTER std_coeff;
   BYTE POINTER std_type = std_coeff;

SUBROUTINE offset_result;
   BEGIN
      IF delay <> 0.0 THEN
      BEGIN
      IF std_type <> std_opt_thru THEN delay
 := delay *2.;
      exp := exp_cmplx( COMPLEX( 0.0, -(delay
 * freq_radians) ) );
      result := result*exp;
      END;

END offset_delay;

STPNTR( std_coeff, std_addrs );
   freq_radians := TwoPi * freq;
   type := std_type[ type_index ];

delay := std_coeff[ length_index ] * std_coeff
 [ n_index ]
              / speed_of_light;
```

```
   loss_dB := std_coeff[ length_index ] * std_
coeff[ loss_index ];
   loss := TENX( -0.1*loss_dB );

IF std_coeff[ refl_index ] <> 0.0 THEN
      reflect := 0.01*std_coeff[ refl_index ]

ELSE
      BEGIN
      reflect := (std_coeff[n_index] - 1.0)/(
std_coeff[n_index] + 1.0);
      reflect := reflect*reflect;
      END;

result := complex_1;

IF type = std_opt_thru THEN
      result := result * loss
   ELSE & type <> std_opt_thru &
      result := result * loss * loss * reflect ;
      offset_result;

std_act_opt := result;
END std_act_opt;

The  following  are  mathematical  models  for
calibration of opto-electrical devices.

#EJECT;
COMPLEX PROCEDURE std_act_rcvr( freq, std_addrs,
 pt );
     VALUE freq, std_addrs, pt;
     REAL freq;
     INTEGER pt;
     DOUBLE std_addrs;

BEGIN
     INTEGER type,ary_size;
     REAL freq_rad,B;
     COMPLEX result, exp;
     REAL POINTER std_coeff;
     BYTE POINTER std_type = std_coeff;
     QUAD fstart,fspan;
     DOUBLE ptr = REGISTER 8;

STPNTR( std_coeff, std_addrs );
     type := std_type[ type_index ];

freq_rad := TwoPi * freq;

IF type = std_receiver THEN
        BEGIN
        ary_size := num_mpts[curr_e_ch]*user3_
 length;
```

```
      circ_interp( freq, e_ch_bit(Co_port)+1 );
& interp ary 1 or 2 &
      ASSEMBLE( MOVE.L R0,R2; MOVE.L R1,R3 );
   & calf in R2/R3 &
      ptr := cal_coeff_addr + ary_size*cal_arrays
[cal_type] + pt*user3_length;
      fetch_CNVE1;  & cal_2 in R0/R1 &
      ASSEMBLE( JSRX DVR1;  MOVEM.L R0/R1, result
);  & calf/cal_2 &
      END
   ELSE
      result := COMPLEX( 1.0, 0.0 );
   std_act_rcvr := result;
END;
```

The following are mathematical models for calibration of electro-optical devices.

```
#EJECT;
COMPLEX PROCEDURE std_act_src( freq, std_addrs,
 pt );
   VALUE freq, std_addrs, pt;
   REAL freq;
   DOUBLE std_addrs;
   INTEGER pt;
   BEGIN
   INTEGER type, ary_size;
   COMPLEX result, exp;
   REAL POINTER std_coeff;
   BYTE POINTER std_type = std_coeff;
   DOUBLE ptr = REGISTER 8;

STPNTR( std_coeff, std_addrs );
   type := std_type[ type_index ];

IF type = std_source THEN
      BEGIN
      ary_size := num_mpts[curr_e_ch]*user3_
length;
      circ_interp( freq, 3 );   & calf2 &
      ASSEMBLE( MOVE.L R0,R2; MOVE.L R1,R3 );

ptr := cal_coeff_addr + ary_size*cal_
arrays[cal_type] + pt*user3_length;
      fetch_CNVE1;  & cal_2 in R0/R1 &
      ASSEMBLE( JSRX DVR1 );         & calf2
/ cal_2 &
      ASSEMBLE( MOVE.L R0,R2; MOVE.L R1,R3 );
   & calf2 / cal_2 &
```

```
      ptr := ptr + ary_size;
      fetch_CNVE1;    & cal_3 &
      ASSEMBLE( JSRX MPY1 );    & cal_3 * calf
2 / cal_2 &
      ASSEMBLE( MOVEM.L R0/R1,result );
      END
   ELSE IF type = std_refl_sens THEN
      result := COMPLEX( 1.0, 0.0 )
   ELSE
      result := COMPLEX( 1.0, 0.0 );
   std_act_src := result;
END;

COMPLEX PROCEDURE std_act( freq, class, pt );

VALUE freq, class, pt;
   REAL freq;
   INTEGER class, pt;
   BEGIN
   BYTE POINTER std_type;
   DOUBLE std_addrs;
   INTEGER type;

std_addrs := standard_specs( freq, class ) ;
   STPNTR( std_type, std_addrs );
   type   := std_type[ type_index  ];

IF type < std_optical THEN
      std_act := std_act_elec( freq, std_addrs )
   ELSE IF type <= std_opt_thru THEN
      std_act := std_act_opt( freq, std_addrs )
   ELSE IF type <= std_thru_rcvr THEN
      std_act := std_act_src( freq, std_addrs, pt )
   ELSE IF type <= std_thru_src THEN
      std_act := std_act_rcvr( freq, std_addrs,
 pt )
   ELSE std_act := COMPLEX(0.0,0.0);
   END;
```

The following instructions calculate error correction coefficients for frequency response correction.

```
#EJECT; COMMENT
     compute_freq_resp_coeff
********************************************
********************************************
;
PROCEDURE compute_freq_resp_coeff;
BEGIN
DOUBLE add;
INTEGER index;
COMPLEX coeff, meas ;
   add := cal_coeff_addr;
```

```
        tell( comp_cal_coeff );
        FOR index := 0  UNTIL num_mpts[ curr_e_ch ] -
1 DO
        BEGIN
        ASSEMBLE(MOVE.L add     ,R8; JSR fetch_
CNVE1; MOVEM.L R0-R1,meas);

coeff:=meas/ std_act( REAL( e_freq_at_
pt( index ) ),
                                        freq_resp_
std, index );

ASSEMBLE(MOVE.L  add,       R8;
                MOVEM.L coeff,   R0-R1;    JS
R CNV1E_save );

add := add + user3_length;

IF NOT(index MOD num_pts_bk_pt) THEN
show_calc_disp ( index );
        END loop;
    clr_msg_and_in_progress;
END;
```

The following instructions calculate error correction coefficients for response and isolation correction, that is, for two-term error correction.

```
#EJECT; COMMENT
        compute_two_term_coeff
**********************************************
*                                             *
* First array is offset, second array is      *
* frequency response.                         *
**********************************************
;
PROCEDURE compute_two_term_coeff;
BEGIN
DOUBLE add;
INTEGER index, offset;
COMPLEX coeff, meas, meas2 ;
    add := cal_coeff_addr;
    offset := e_ary_size;
    tell( comp_cal_coeff );
    FOR index := 0  UNTIL num_mpts[ curr_e_ch
] - 1 DO
        BEGIN ASSEMBLE(MOVE.L add , R8; JSR fetch_CNVE1;
MOVEM.L R0-R1, meas2;
                ADD.W offset, R8; JSR fetch_CNVE1;
MOVEM.L R0-R1, meas);

coeff:=std_act( REAL( e_freq_at_pt( index
```

```
)  ),
                      two_term_response_std,
index )/( meas-meas2);

ASSEMBLE(MOVE.L   add,          R8;   ADD.
W offset, R8;
            MOVEM.L coeff,   R0-R1;   JSR
CNV1E_save );

add := add + user3_length;

IF NOT(index MOD num_pts_bk_pt) THEN
show_calc_disp ( index );
        END loop;
   clr_msg_and_in_progress;
END;
```

The following instructions calculate error correction coefficients for one-port error correction.

```
#EJECT; COMMENT
        compute_1_port_coeff
***************************************************
***************************************************
;
PROCEDURE compute_1_port_coeff( first_std_class );
                     VALUE first_std_class;
  INTEGER first_std_class;
BEGIN
DOUBLE  add;
INTEGER offset, index;
REAL    freq;
COMPLEX meas1    , meas2    , meas3    ,
        act_1    , act_2    , act_3    ,
        term21_21, term32_32, term13_13,
        term21_3 , term32_1 , term13_2 ,
        coeff1   , coeff2   , coeff3   ,
        det,
        term21=coeff1,term32=coeff2,term13=coeff3;

add := cal_coeff_addr;
   offset := e_ary_size;
   IF NOT cal_in_progress  & only occurs on port2
of 2port reflection&
     THEN add := cal_coeff_addr + DOUBLE(port_
offset)*DOUBLE(offset) ;
   tell( comp_cal_coeff );

#EJECT;
   FOR index := 0  UNTIL num_mpts[ curr_e_ch ] -
1 DO
      BEGIN
      freq   :=   REAL( e_freq_at_pt( index ) );
```

```
    act_1 := std_act( freq, first_std_class,
index );
    act_2 := std_act( freq, first_std_class
+ 1 ,index);
    act_3 := std_act( freq, first_std_class
+ 2 ,index);

ASSEMBLE(MOVE.L add    ,R8;JSR fetch_CNVE1;
MOVEM.L R0-R1,meas1;
         MOVE.W offset,R9;JSR inc_fetch_CNVE1;
MOVEM.L R0-R1,meas2;
                             JSR inc_fetch_CNVE1;
MOVEM.L R0-R1,meas3 );

term21 := meas2 - meas1;
    term32 := meas3 - meas2;
    term13 := meas1 - meas3;

term21_3  := term21 * act_3;
    term32_1  := term32 * act_1;
    term13_2  := term13 * act_2;

term21_21 := term21 * act_2 * act_1;
    term32_32 := term32 * act_3 * act_2;
    term13_13 := term13 * act_1 * act_3;

det    := 1.0 / (term21_21 + term32_
32 + term13_13);

coeff1:=(term21_21*meas3 + term32_32
*meas1 + term13_13*meas2)
             * det;
         &directivity& coeff2:=-(term21_3        + term32_1
     + term13_2)
             * det;
         &source match& coeff3:= coeff1 * coeff2 +
         ( (term21_3* meas3 + term32_1
*meas1 + term13_2 *meas2)
             * det );
         &tracking&

ASSEMBLE(MOVE.L  add,   R8;
         MOVEM.L coeff1,R0-R1; JSR CNV1E_
save ;
         MOVE.L  add,   R8;      ADD.W
offset,R8;
         MOVEM.L coeff2,R0-R1; JSR CNV1E_
save ;
         MOVE.L  add,   R8;      ADD.W
offset,R8; ADD.W offset,R8;
         MOVEM.L coeff3,R0-R1; JSR CNV1E_
save );
```

```
            add := add + user3_length;
            IF NOT(index MOD num_pts_bk_pt) THEN
  show_calc_disp ( index );
        END loop;

clr_msg_and_in_progress;
    refl_computed := TRUE;

END compute_1_port_coeff;
```

The following instructions calculate error correction coefficients for full two-port error correction, that is, for twelve-term error correction.

```
#EJECT; COMMENT
        compute_2_port_coeff
****************************************************
*                                                   *
* Order (structure) of error coeffs is VERY         *
* important  ( see acorrect )                       *
*     e      e      e      e     e     e     e      *
*     e      e      e      e     e                  *
*    DF     SF     RF     XF    LF    TF    DR      *
*    SR     RR     XR     LR    TR                  *
*                                                   *
****************************************************
end of comment;
PROCEDURE compute_2_port_coeff;
BEGIN
DOUBLE  add,  add2;
INTEGER offset, coeff_offset, index, port;
COMPLEX coeff1   ,   coeff2 ,   coeff3 ,
        coeff4   ,   coeff5 ,   coeff6 ,
        meas4    ,   meas5  ,   meas6  ,
                                act_6 ;

add := cal_coeff_addr;
    tell( comp_cal_coeff );
    offset := e_ary_size;

FOR port := 1 TO 2 DO
      BEGIN
      IF port = 2 THEN add := cal_coeff_addr +

DOUBLE( port_
offset )*DOUBLE( offset );

IF ( (cal_type = s_two_port) AND (port = 2)
  ) THEN
        copy_user3( cal_coeff_addr, add, port_size *
                                    num_mpts[ curr_
e_ch ])
      ELSE
        FOR index := 0  UNTIL num_mpts[ curr_e_ch ]
```

```
- 1 DO
     BEGIN
     act_6 := std_act( REAL( e_freq_at_pt(
index ) ),
                 (IF port=1 THEN trans_fwd_
std ELSE trans_rev_std),
                 index );

ASSEMBLE(MOVE.L add,    R8;JSR fetch_CNVE1;
MOVEM.L R0-R1,coeff1;
          MOVE.W offset,R9;JSR inc_fetch_CNVE1;
MOVEM.L R0-R1,coeff2;
                              JSR inc_fetch_CNVE1;
MOVEM.L R0-R1,coeff3;
                              JSR inc_fetch_CNVE1;
MOVEM.L R0-R1,meas4;
                              JSR inc_fetch_CNVE1;
MOVEM.L R0-R1,meas5;
                              JSR inc_fetch_CNVE1;
MOVEM.L R0-R1,meas6 );

coeff5 :=  meas5 - coeff1;
     coeff5 :=  coeff5 / ( coeff3 + ( coeff2 *
coeff5 ) );
                                        &
load match & coeff6 :=   ( meas6 - meas4) * ( complex_1
- (coeff2 * coeff5) )/
               act_6;
                                        &
transmission tracking &
     coeff5 := coeff5 / ( act_6 * act_6 );
   &correct for thru&
        & no math needed to done to xtalk coeff& add2  := add + ALEFT( DOUBLE( offset) ,
2 );   &4*offset&
     ASSEMBLE(MOVE.L   add2,    R8;
           MOVEM.L coeff5,R0-R1; JSR CNV1E_
save ;
           MOVE.L  add2,    R8;      ADD.W
offset,R8;
           MOVEM.L coeff6,R0-R1; JSR CNV1E_
save );

add := add + user3_length;

IF NOT(index MOD num_pts_bk_pt) THEN
show_calc_disp ( index );
     END add index loop;

END port loop;

clr_msg_and_in_progress;
```

END compute_2_port_coeff;

The following instructions calculate error correction coefficients for response and source match error correction of electro-optical (E/O) devices.

```
#EJECT;
COMMENT
      compute_eo_match_coeff
*****************************************************
*                                                    *
* Order (structure) of error coeffs is VERY          *
* important  ( see acorrect )                        *
*   e      e      e      e      e      e'     e''    *
*   DF     SF     RF     XF     TF     TF     TF     *
*****************************************************
;
PROCEDURE compute_eo_match_coeff;
BEGIN DOUBLE   add, add2;
INTEGER  offset, coeff_offset, index, port;
COMPLEX  coeff1  ,   coeff2 ,   coeff3 ,
         coeff4  ,   coeff5 ,
         meas4   ,   meas5  , act_5 ;

add := cal_coeff_addr;
   tell( comp_cal_coeff );
   offset := e_ary_size;

FOR index := 0   UNTIL num_mpts[ curr_e_ch ]
 - 1 DO
         BEGIN
         act_5 := std_act( REAL( e_freq_at_pt(
 index ) ),
                                 trans_fwd_std ,
                                 index );

ASSEMBLE(MOVE.L add,   R8;JSR fetch_CNVE1;
MOVEM.L R0-R1,coeff1;
              MOVE.W offset,R9;JSR inc_fetch_CNVE1;
MOVEM.L R0-R1,coeff2;
                                 JSR inc_fetch_CNVE1;
MOVEM.L R0-R1,coeff3;
                                 JSR inc_fetch_CNVE1;
MOVEM.L R0-R1,meas4;
                                 JSR inc_fetch_CNVE1;
MOVEM.L R0-R1,meas5 );

coeff5 :=   ( meas5 - meas4) / act_5;
                                                &
transmission tracking &
         & no math needed to done to xtalk coeff&
```

```
        add2   := add + ALEFT( DOUBLE( offset) ,
2 );   &4*offset&
        ASSEMBLE(MOVE.L  add2,   R8;
                MOVEM.L coeff5,R0-R1; JSR CNV1E_
save );

add := add + user3_length;

IF NOT(index MOD num_pts_bk_pt) THEN
show_calc_disp ( index );
        END add index loop;

clr_msg_and_in_progress;

END;
```

The following instructions calculate error correction coefficients for response and load match error correction of opto-electrical (O/E) devices.

```
#EJECT;
COMMENT
        compute_oe_match_coeff
************************************************
*                                               *
* Order (structure) of error coeffs is VERY     *
* important   ( see acorrect )                  *
*   e       e       e      e      e     e    e  *
*                                               *
*   e       e       e'                          *
*   DR      SR      RR     XF     LF    TF   DF *
*   SF      RF      TF                          *
************************************************
;
PROCEDURE compute_oe_match_coeff;
BEGIN DOUBLE   add,  add2;
INTEGER  offset, coeff_offset, index, port;
COMPLEX  coeff7    ,   coeff8 ,   coeff9 ,
         coeff4    ,   coeff5 ,   coeff6 ,
         meas4     ,   meas5  ,   meas6  ,
                                  act_6 ;

add := cal_coeff_addr;
    tell( comp_cal_coeff );
    offset := e_ary_size;

FOR index := 0   UNTIL num_mpts[ curr_e_ch ]
 - 1 DO
        BEGIN
        act_6 := std_act( REAL( e_freq_at_pt(
  index ) ),
                            trans_fwd_std,
                            index );
```

```
        ASSEMBLE(MOVE.L add,     R8;JSR fetch_CNVE1;
MOVEM.L R0-R1,coeff7;
            MOVE.W offset,R9;JSR inc_fetch_CNVE1;
MOVEM.L R0-R1,coeff8;
                                 JSR inc_fetch_CNVE1;
MOVEM.L R0-R1,coeff9;
                                 JSR inc_fetch_CNVE1;
MOVEM.L R0-R1,meas4;
                                 JSR inc_fetch_CNVE1;
MOVEM.L R0-R1,meas5;
                                 JSR inc_fetch_CNVE1;
MOVEM.L R0-R1,meas6 );

coeff5 :=   meas5 - coeff7;
        coeff5 :=   coeff5 / ( coeff9  + ( coeff8
* coeff5 ) );
                                                     &
load match & coeff6 :=   ( meas6 - meas4) * ( complex_1
- (coeff8 * coeff5) )/ act_6;
                                                     &
transmission tracking &
        coeff5 := coeff5 / ( act_6 * act_6 );
   &correct for thru&
        & no math needed to done to xtalk coeff& add2    := add + ALEFT( DOUBLE( offset) ,
2 );    &4*offset&
        ASSEMBLE(MOVE.L   add2,    R8;
                MOVEM.L coeff5,R0-R1; JSR CNV1E_
save ;
                MOVE.L    add2,    R8;    ADD.W
 offset,R8;
                MOVEM.L coeff6,R0-R1; JSR CNV1E_
save );

add := add + user3_length;

IF NOT(index MOD num_pts_bk_pt) THEN
show_calc_disp ( index );
        END add index loop;

clr_msg_and_in_progress;

END;

#EJECT; COMMENT
                        cal_done
******************************************************
******************************************************
;
PROCEDURE   cal_done( type );
```

```
    VALUE   type;
    INTEGER type;
                            ENTRY;
    BEGIN & cal_done &

IF cal_mem_allocated THEN
       BEGIN & if cal_mem_allocated &

IF (type = done_class ) AND NOT freq_
covered OR
            meas_std_data    THEN
          warn( not_finished_caling )
        ELSE IF (type = done_class ) AND ( cal_type
 # response ) THEN
            BEGIN
            h_last_class;
            IF last_class_element > 1 THEN
              prev_menu;
            IF ( (cal_stds_remaining AND  cal_stds_
needed[ cal_type ] AND
                        needed_mask[ check_done[last_
class ] ] ) = 0 ) THEN
               BEGIN
               IF (cal_type = two_port) OR (cal_
type = s_two_port) OR
                   (cal_type = eo_match) OR (cal_
type = oe_match) THEN
                   tell( press_done )
                   ELSE tell( press_save ) ;
               END
            ELSE tell( connect_std );
            END
        ELSE IF ( (cal_stds_remaining AND needed_
mask[type]) # 0) THEN
            warn( not_finished_caling )
        ELSE
            BEGIN & enough standards done and not
 a done_class &
            CASE type  OF
              BEGIN & case &
                BEGIN
                & done_1_port &
                    IF cal_type = one_port_on_ 2
THEN
                        compute_1_port_coeff( port2_
1st_std )
                       ELSE BEGIN
                        compute_1_port_coeff( port1_
1st_std );
                       IF cal_type = s_two_port
THEN
                         BEGIN & if &
                            cal_in_progress :
```

```
= TRUE;    & not yet FALSE &
                        h_cmd(Ccal_s_refl );
                  END   & s_two_port &
                  ELSE IF cal_type = eo_match
THEN
                     BEGIN & if &
                        cal_in_progress :
= TRUE;    & not yet FALSE &
                        h_cmd(Ccal_eo_refl);
                  END   & eo_match &
                  ELSE IF cal_type = oe_match
THEN
                     BEGIN & if &
                        cal_in_progress :
= TRUE;    & not yet FALSE &
                        h_cmd(Ccal_oe_refl);
                  END;   & oe_match &
               END;
            END;
            BEGIN
         & done_reflection &
               compute_1_port_coeff( port1_
1st_std );

& special port2 call &
               compute_1_port_coeff( port2_
1st_std );
               cal_in_progress := TRUE;
         & not yet FALSE &
               h_cmd(Ccal_refl);
            END;
            BEGIN
          & done_trans &
               IF cal_type = s_two_port
THEN
                  h_cmd(Ccal_s_thru)
               ELSE IF cal_type = oe_match
THEN
                  h_cmd(Ccal_oe_thru)
               ELSE
                  h_cmd(Ccal_thru);
            END;
            BEGIN
          & done_isol &
               IF cal_type = s_two_port
THEN
                  h_cmd(Ccal_s_isol)
               ELSE IF cal_type = eo_match
THEN
                  h_cmd(Ccal_eo_isol)
               ELSE IF cal_type = oe_match
THEN
                  h_cmd(Ccal_oe_isol)
               ELSE
                  h_cmd(Ccal_isol);
            END;
```

```
                BEGIN
        & done_2_port &
            compute_2_port_coeff;
            COMMENT ?? dds 8/1
            cal_type := two_port;    & in
case of s_two_port &
            END;
            BEGIN                            & done_
class ( done_response ) &
            compute_freq_resp_coeff;
            END;
            BEGIN
        & done_two_term &
            compute_two_term_coeff;
            END;
            BEGIN
        & done_oe_refl  &
                    & order is reversed from
 that used for full two  &
            compute_1_port_coeff( port2_
1st_std );

& special port 1 call &
            compute_1_port_coeff( port1_
1st_std );
            cal_in_progress := TRUE;
        & not yet FALSE &
            h_cmd(Ccal_oe_refl);
            END;
            BEGIN
        & done_eo_match &
            compute_eo_match_coeff;
            END;
            BEGIN
        & done_oe_match &
            compute_oe_match_coeff;
            END;
          END;   & case &

IF NOT cal_in_progress THEN
              BEGIN & if &
              save_cal;
              END   & if &
            ELSE
              BEGIN
              gen_menu( cal_done_menu[ cal_type
] );
              IF ((cal_stds_remaining AND cal_
stds_needed[cal_type])=0)
                THEN tell( press_save );
              END;

END;  & not a done_class and enough
 standards done &

END;    & if cal_mem_allocated &
```

```
        clr_status_bit (WFGR+WFGF);   & clear waiting
for GET status bits &
        fini_tell;   & tell hpib we are done &

END    & cal_done & ;

SUBROUTINE cal_done_reflection;
   IF cal_type = two_port THEN
      cal_done( done_reflection )
   ELSE IF cal_type = oe_match THEN
      cal_done( done_oe_refl )
   ELSE
      cal_done( done_1_port );

COMMENT
                        fin_save
***********************************************
*                                              *
* Items to complete save routine in scal0 but  *
* required too much symbol space so were put back *
* here.                                        *
*                                              *
***********************************************
;
PROCEDURE fin_save;
                        ENTRY;
   BEGIN
      BYTE POINTER bptr;
           STPNTR( bptr, cal_coeff_addr - header_
size + hd_cal_title );
           bptr[-2 ] := 0;    & clear stored bit &
           MOVE bptr[-1] := old_cal_title[-1],
+(cal_title_size+2);
           IF (cal_type = two_port) OR (cal_type =
s_two_port) OR
              (cal_type = eo_match) OR (cal_type =
oe_match) THEN
              restore_param;
           corr_on( cal_mem_id - (error_coeff_id -
1));
           gen_menu( SAVE_MENU );
           cal_in_progress := FALSE;
   END fin_save;

#EJECT;
COMMENT
        cal_acquisiton_done
***********************************************
*                                              *
* Called by control, in the control process.   *
*                                              *
***********************************************
;
SUBROUTINE cal_acq_done;
                ENTRY;
```

```
BEGIN & cal_acq_done & take_data;
    COMMENT set meas_std_data in take_data,
 set to FALSE only if
        standard is actually done.  For E/O
and O/E cals take
        data is called more than once.  meas_
std_data should
        remain TRUE until after the final
measurement is made;
    IF cal_coeff_addr <> 0 AND        & cal
memory hasn't been stolen &
        cal_in_progress THEN          & HPIB
crashes ?? &
        BEGIN & if &
           IF ( last_class_element <= 1 ) AND ( cal_type <> response )    THEN
               cal_done(done_class);
           IF NOT meas_std_data THEN beep_done;
        END;    & if &
    clr_msg( measuring_std );
    new_num_grps(curr_e_ch,temp_num_of_groups);

END;   & cal_acq_done &
```

The following instructions request measurement of a calibration standard by 'control' process.

```
#EJECT;
COMMENT
                acq_data
*******************************************
*                                          *
* Begin data acquisition for obtaining calibra- *
* tion data.  If swept, take one additional sweep *
* to allow for settling.  If averaging is turned *
* on, take enough sweeps for the averaging factor *
* plus 1.                                   *
*                                          *
* Called from the command process, as with most *
* most other cal operations.                *
*                                          *
*******************************************
;
SUBROUTINE acq_data;
            ENTRY;
    BEGIN & acq_data &

IF cal_in_progress THEN
            BEGIN & if cal_in_progress & abort_swp;   & wtp 1/31 &
```

```
            std_count := 0;
        IF NOT meas_std_data THEN
            BEGIN & if &
                temp_num_of_groups :=
                    num_of_groups[curr_e_ch];
                meas_std_data := TRUE;
            END;  & if &
        tell( measuring_std );

tgrp_num[curr_e_ch]:=0;& resets averaging number &
            IF e_ch_bit( Cif_avg ) = 1    THEN n_swp( entry_ch_int(ch_average_factor) )
            ELSE
                n_swp( 1 );

END;   & if cal_in_progress &
    & ELSE spurious command, probably out-of-sequence HP-IB &

END;   & acq_data &
```

The following instructions request a series of measurement sweeps for calibration of electro-optical (E/O) devices.

```
#EJECT;
COMMENT
                acq_data_eo
**************************************************
*                                                 *
* Begin data acquisition for obtaining calibra-   *
* tion data. If swept, take one additional sweep  *
* to allow for settling. If averaging is turned   *
* on, take enough sweeps for the averaging factor *
* plus 1.                                         *
*                                                 *
* Take multiple sweeps required for E/O calibra-  *
* tion.                                           *
*                                                 *
* Called from the command process, as with most   *
* other cal operations.                           *
*                                                 *
**************************************************
;
PROCEDURE acq_data_eo;
                    ENTRY;
    BEGIN & acq_data_eo &
    INTEGER o_port;
    BOOLEAN sw_couple;
```

```
    IF cal_in_progress THEN
        BEGIN & if cal_in_progress &
        o_port := e_ch_bit( Co_port );
        signal_init( oeo_cal_ary_ready, 0 );

std_count := 0;
        abort_swp;   & wtp 1/31 &
            IF NOT meas_std_data THEN
                BEGIN & if &
                    temp_num_of_groups :=
                              num_of_groups[curr_e_ch];
                    meas_std_data := TRUE;
                END;   & if &
        new_param( 1 );  & *** S21 -- rf cable *** &
            tell( measuring_std );

tgrp_num[curr_e_ch]:=0;& resets averaging number &
            IF e_ch_bit( Cif_avg ) = 1    THEN n_swp( entry_ch_int(ch_average_factor) )
              ELSE
                n_swp( 1 );
            wait( oeo_cal_ary_ready );

abort_swp;    & wtp 1/31 &
        COMMENT measure optical cable, O/O1 for E/O1, O/O2 for E/O2;
        new_param( oo1_parm + o_port );   & O/O1 or O/O2 &
            tell( measuring_std );

tgrp_num[curr_e_ch]:=0;& resets averaging number &
            IF e_ch_bit( Cif_avg ) = 1    THEN n_swp( entry_ch_int(ch_average_factor) )
              ELSE
                n_swp( 1 );
            wait( oeo_cal_ary_ready );

sw_couple := e_ch_bit( Csw_couple )< >0;
            IF sw_couple THEN h_off( Csw_couple, Csw_couple );
            set_misc_control( LTS_sw6, TRUE ); & O/O1 with mod cal port & abort_swp;   & wtp 1/31 &
            new_param( oo1_parm );   &  O/O1  &
                tell( measuring_std );

tgrp_num[curr_e_ch]:=0;& resets
``` averaging number &
          IF e_ch_bit( Cif_avg ) = 1    THEN n_swp( entry_ch_int(ch_average_
factor) )
          ELSE
             n_swp( 1 );
       wait( oeo_cal_ary_ready );

set_misc_control( LTS_sw6, 0 );  & reset
mod cal switch &
       IF sw_couple THEN  h_key(Csw_couple,
Csw_couple,Csw_couple);
       new_param( eol_parm + o_port );  &
restore E/O_ &

END;  & if cal_in_progress &
   & ELSE spurious command, probably out-of-
sequence HP-IB &

END;  & acq_data_eo &

The following instructions request a series of measurement sweeps for calibration of opto-electrical (O/E) devices.

```
#EJECT;
COMMENT
              acq_data_oe
*************************************************
*                                                *
* Begin data acquisition for obtaining calibra-  *
* tion data.  If swept, take one additional sweep *
* to allow for settling.  If averaging is turned *
* on, take enough sweeps for the averaging factor *
* plus 1.                                        *
*                                                *
* Take multiple sweeps required for O/E calibra- *
* tion.                                          *
*                                                *
* Called from the command process, as with most  *
* other cal operations.                          *
*                                                *
*************************************************
;
PROCEDURE acq_data_oe;
                ENTRY;
   BEGIN & acq_data_oe &
   INTEGER e_port;

IF cal_in_progress THEN
          BEGIN & if cal_in_progress &
          e_port := e_ch_bit( Ce_port );
          signal_init( oeo_cal_ary_ready, 0 );
```

```
            std_count := 0;
         abort_swp;    & wtp 1/31 &
            IF NOT meas_std_data THEN
               BEGIN & if &
                  temp_num_of_groups :=
                           num_of_groups[curr_e_
ch];
               meas_std_data := TRUE;
            END;   & if &
         COMMENT measure rf cable - S12 for O
/E1 and S21 for O/E2;
         new_param( 2 - e_port );   & S12 or S 21 &
            tell( measuring_std );

tgrp_num[curr_e_ch]:=0;& resets
averaging number &
            IF e_ch_bit( Cif_avg ) = 1    THEN n_swp( entry_ch_int(ch_average_
factor) )
            ELSE
               n_swp( 1 );

wait( oeo_cal_ary_ready );
         abort_swp;   & wtp 1/31 &
         COMMENT measure optical cable - O/O1 ;
         new_param( oo1_parm );    & ** O/O1 ** &
            tell( measuring_std );

tgrp_num[curr_e_ch]:=0;& resets
averaging number &
            IF e_ch_bit( Cif_avg ) = 1    THEN
               n_swp( entry_ch_int(ch_average_
factor) )
            ELSE
               n_swp( 1 );

wait( oeo_cal_ary_ready );
         new_param( oe1_parm + e_port );   &
restore O/E_ &

END;   & if cal_in_progress &
   &  ELSE spurious command, probably out-of-
sequence HP-IB &

END;   & acq_data_oe &

#EJECT;
SUBROUTINE check_refl_status;
BEGIN
   tell( connect_std );
   IF refl_computed THEN
      BEGIN  & must redo all of relection &
      cal_stds_remaining := cal_stds_remaining
OR
```

```
       ( needed_mask[done_reflection] AND cal_
stds_needed[cal_type] );
     h_off(Cport1_std1, Cport2_std3 );
     h_off(Ccal_refl,Ccal_refl);
     h_off(Ccal_s_refl,Ccal_s_refl);
     refl_computed := FALSE;
     END;   & must redo all of relection &
END check_refl_status;

#FILE fcalmenu;

END$

IF cal_debug THEN BEGIN
              & debug &
       WSTR( "CAL: cal_mem_id" ); WHEX( cal_
mem_id );        & debug &
       CRLF; END;
              & debug &
     IF cal_debug THEN BEGIN
              & debug &
       WSTR( "CAL: cal_mem_id" ); WHEX( cal_
mem_id );        & debug &
       CRLF; END;
              & debug &
         IF cal_debug THEN
           BEGIN
             WSTR( "take data, fc, rem, class,
src, dest" );
             WHEX( freq_covered );
             WHEX( cal_stds_remaining );
             WHEX( class );
             WHex( data_source, 6 );
             WHex( data_destination, 6 );
             CRLF;
           END;

IF cal_debug THEN BEGIN
              & debug &
         WSTR( "CAL: data_sour" );
              & debug &
         WHex( data_source,6); CRLF;
              & debug &
         WSTR( "CAL: data_dest" );
              & debug &
         WHex( data_destination, 6);CRLF;
              & debug &
         WSTR( "CAL: pt_count" ); WHEX( pt_
count ); CRLF;   & debug &
         END;
              & debug &

IF cal_debug THEN BEGIN
              & debug &
```

```
        WSTR("std_act");WREAL(freq);WNUM(class);
                    & debug &
            WHex(d,7); WNUM( type ); CRLF; END;
                    & debug &

IF cal_debug THEN BEGIN
                    & debug &
    WSTR("        ");WCPX(result);WREAL(delay);
                    & debug &
    WREAL(z_mech);WREAL(system_z0);CRLF;
                    & debug &
END;
                    & debug &

IF cal_debug THEN BEGIN
                    & debug &
        WSTR( "act_" );  CRLF;
                    & debug &
        WCPX( act_1 );   CRLF;
                    & debug &
        WCPX( act_2 );   CRLF;
                    & debug &
        WCPX( act_3 );   CRLF;
                    & debug &
        CRLF; END;
                    & debug &
    IF cal_debug THEN BEGIN
                    & debug &
        WSTR( "meas" );  CRLF;
                    & debug &
        WCPX( meas1 );   CRLF;
                    & debug &
        WCPX( meas2 );   CRLF;
                    & debug &
        WCPX( meas3 );   CRLF;
                    & debug &
        CRLF; END;
                    & debug &

IF cal_debug THEN BEGIN
                    & debug &
        WSTR( "coeff" ); CRLF;
                    & debug &
        WCPX( coeff1 );  CRLF;
                    & debug &
        WCPX( coeff2 );  CRLF;
                    & debug &
        WCPX( coeff3 );  CRLF;
                    & debug &
        CRLF; END;
                    & debug &

IF cal_debug THEN BEGIN
                    & debug &
                WSTR( "CAL: data_sour" );
                    & debug &
```

```
                WHex( data_source,6); CRLF;
                       & debug &
                WSTR( "CAL: data_dest" );
                       & debug &
                WHex( data_destination, 6);CRLF;
                       & debug &
                WSTR( "CAL: pt_count" ); WHEX( pt_
   count ); CRLF;   & debug &
                WSTR( "CAL: index" ); WHEX( temp );
   CRLF;          & debug &
                WSTR( "CAL: pt_start" ); WHEX( pt_
   start ); CRLF;   & debug &
                END;
                       & debug &

COMMENT
   This is a software generated file !!!
   Changes must be made in SKINFO
   Run gensk to re-generate file;
SUBROUTINE p7;  ENTRY;
BEGIN CASE cmd_token-201 OF
BEGIN
& 201 &
BEGIN
   h_toggle;
   IF e_ch_bit( Ccorrection ) = 1 THEN
    turn_corr_on
    ELSE corr_off( curr_e_ch );
END;
& 202 &
BEGIN
h_toggle;
IF e_ch_bit( Cfreq_zoom ) = 0 AND
    mem_id_addr[z_error_coeff_id_1+curr_e_ch - 1] <> 0
THEN
    release_mem( z_error_coeff_id_1+curr_e_ch - 1 );
END;
& 203 &
gen_menu( calibrate_menu[ dev_type[curr_e_ch] ] );
& 204 &
resume_cal;
& 205 &
;
& 206 &
BEGIN
define_opt_std( std_fresnel );
select_act_fcn( active_refl_power );
END;
& 207 &
;
& 208 &
corr_off( curr_e_ch );
& 209 &
```

```
set_cal_type( response );
& 210 &
BEGIN
set_cal_type( two_term );
END;
& 211 &
set_cal_type( one_port_on_1 );
& 212 &
set_cal_type( one_port_on_2 );
& 213 &
set_cal_type( two_port );
& 214 &
set_cal_type( eo_match );
& 215 &
set_cal_type( oe_match );
& 216 &
;
& 217 &
;
& 218 &
;
& 219 &
;
& 220 &
;
& 221 &
select_act_fcn( active_velocity_factor );
& 222 &
BEGIN
select_act_fcn( active_refractive_index );
END;
& 223 &
select_act_fcn( active_system_z0 );
& 224 &
tell( command_not_implemented );
& 225 &
;
& 226 &
;
& 227 &
BEGIN
h_toggle;
IF e_ch_bit(Clist_freq) OR
   e_ch_bit(Clog_freq) THEN
   upd_el_del_list(curr_e_ch);
IF e_ch_bit(Cdual_chan) THEN
   BEGIN
   IF ch_bit(Clist_freq,3-curr_e_ch) OR
      ch_bit(Clog_freq,3-curr_e_ch)  THEN
         upd_el_del_list(3-curr_e_ch);
   ch_part( update_raw, 3-curr_e_ch );
   END;
chk_upd_dom;
END;
& 228 &
select_act_fcn( active_ref_plane_1 );
& 229 &
```

```
select_act_fcn( active_ref_plane_2 );
& 230 &
select_act_fcn( active_ref_plane_opt );
& 231 &
select_act_fcn( active_ref_plane_B );
& 232 &
select_act_fcn( active_ref_plane_A );
& 233 &
set_std_class( port1_1st_std );
& 234 &
set_std_class( port1_2nd_std );
& 235 &
set_std_class( port1_3rd_std );
& 236 &
cal_done( done_1_port );
& 237 &
set_std_class( port2_1st_std );
& 238 &
set_std_class( port2_2nd_std );
& 239 &
set_std_class( port2_3rd_std );
& 240 &
check_refl_status;
& 241 &
tell( connect_thru );
& 242 &
tell( isolate_ports );
& 243 &
cal_done( done_2_port );
& 244 &
cal_done_reflection;
& 245 &
    set_std_class( trans_fwd_std );
& 246 &
    set_std_class( match_fwd_std );
& 247 &
    set_std_class( trans_rev_std );
& 248 &
    set_std_class( match_rev_std );
& 249 &
cal_done( done_trans );
& 250 &
omit_isolation;
& 251 &
set_std_class( isoln_fwd_std );
& 252 &
set_std_class( isoln_rev_std );
& 253 &
cal_done(done_isol);
& 254 &
check_refl_status;
& 255 &
tell( connect_thru );
& 256 &
tell( isolate_ports );
& 257 &
```

```
set_std_class( two_term_response_std );
& 258 &
set_std_class( two_term_offset_std );
& 259 &
cal_done( done_two_term );
& 260 &
check_refl_status;
& 261 &
tell( isolate_ports );
& 262 &
cal_done(done_eo_match);
& 263 &
check_refl_status;
& 264 &
tell( connect_thru );
& 265 &
tell( isolate_ports );
& 266 &
cal_done( done_oe_match );
& 267 &
set_element( 1 );
& 268 &
set_element( 2 );
& 269 &
set_element( 3 );
& 270 &
set_element( 4 );
& 271 &
set_element( 5 );
& 272 &
set_element( 6 );
& 273 &
set_element( 7 );
& 274 &
cal_done(done_class);
& 275 &
acq_data;
& 276 &
compute_load;
END;
END p7;
```

The following constitute the parameters for calibration of standard models.

```
M68KL,P,"stddata"
BEGIN

#FILE cstds;
    & type2 values    &
#FILE ccal;
    & for std_type's &
#FILE cstds2;
```

```
EXTERNAL BYTE ARRAY cal_kit_ary.L[0:1];
EXTERNAL BOOLEAN dirty_opt_kit.L;
COMMENT
          cal_kit_descriptor
***************************************************
*    reduced   7 mm kit from 8510                  *
***************************************************
;
& calibration kit label &
BYTE    TABLE a00 := 10,03,'7,'m,'m,' ,' ,' ,
  ' ,' ,' ,' ;   & kit label &
& class lists of calibration standards &
BYTE    TABLE b00 :=  1, 2, 0, 0, 0, 0, 0, 0,
              & port1_1st_std &
                      1, 1, 0, 0, 0, 0, 0, 0,
              & port1_2nd_std &
                      3, 3, 5, 6, 0, 0, 0, 0,
              & port1_3rd_std &
                      1, 3, 0, 0, 0, 0, 0, 0,
              & isoln_fwd_std &
                      1, 4, 0, 0, 0, 0, 0, 0,
              & match_fwd_std &
                      1, 4, 0, 0, 0, 0, 0, 0,
              & trans_fwd_std &
                      1, 2, 0, 0, 0, 0, 0, 0,
              & port2_1st_std &
                      1, 1, 0, 0, 0, 0, 0, 0,
              & port2_2nd_std &
                      3, 3, 5, 6, 0, 0, 0, 0,
              & port2_3rd_std &
                      1, 3, 0, 0, 0, 0, 0, 0,
              & isoln_rev_std &
                      1, 4, 0, 0, 0, 0, 0, 0,
              & match_rev_std &
                      1, 4, 0, 0, 0, 0, 0, 0,
              & trans_rev_std &
                      3, 1, 2, 4, 0, 0, 0, 0,
              & freq_resp_std &
                      3, 1, 2, 4, 0, 0, 0, 0,
              & two_term_resp &
                      1, 3, 0, 0, 0, 0, 0, 0;
              & two_term_offs &
& class labels &
BYTE    TABLE c00 := 10,05,'O,'P,'E,'N,' ,' ,
  ' ,' ,' ,' , & port1_1st_ &
                     10,05,'S,'H,'O,'R,'T,' ,
  ' ,' ,' ,' , & port1_2nd_ &
                     10,05,'L,'O,'A,'D,'S,' ,
  ' ,' ,' ,' , & port1_3rd_ &
                     10,10,'I,'S,'O,'L,' ','N,
  ' ,'S,'T,'D,  & isoln_fwd_ &
                     10,04,'T,'H,'R,'U,' ,' ,
  ' ,' ,' ,' , & match_fwd_ &
                     10,04,'T,'H,'R,'U,' ,' ,
  ' ,' ,' ,' , & trans_fwd_ &
                     10,05,'O,'P,'E,'N,' ,' ,
```

```
    ' ,' ,' ,' , & port2_1st_ &
                10,05,'S,'H,'O,'R,'T,' ,
    ' ,' ,' ,' , & port2_2nd_ &
                10,05,'L,'O,'A,'D,'S,' ,
    ' ,' ,' ,' , & port2_3rd_ &
                10,10,'I,'S,'O,'L,'','N,
    ' ,'S,'T,'D, & isoln_rev_ &
                10,04,'T,'H,'R,'U,' ,' ,
    ' ,' ,' ,' , & match_rev_ &
                10,04,'T,'H,'R,'U,' ,' ,
    ' ,' ,' ,' , & trans_rev_ &
                10,08,'R,'E,'S,'P,'O,'N,
    'S,'E,' ,' , & freq_resp_ &
                10,08,'R,'E,'S,'P,'O,'N,
    'S,'E,' ,' , & two_T_resp &
                10,10,'I,'S,'O,'L,'','N,
    ' ,'S,'T,'D; & two_T_offs &

& std #  1 &
& xref to 8510 std #  1 for 7mm and 3.5mm (not
 Type N)&
REAL    TABLE a01 := 0, 999@9,
              & fmin, fmax &
                    50.0, 0.0,  0.0,
          & Zo, delay, loss &
                    0.0, 0.0, 0.0, 0.0;
          & c0, c1, c2, c3  &
BYTE    TABLE c01 := 10,06,' ,'S,'H,'O,'R,'T,
    ' ,' ,' ,' ;      & label &
BYTE    TABLE d01 := std_short, 0;
          & std_type, type2&
& std #  2 &
& xref to 8510 std #  2 for 7mm and 3.5mm (not
 Type N)&
REAL    TABLE a02 := 0, 999@9,
              & fmin, fmax &
                    50.0, 0.0,  0.0,
          & Zo, delay, loss &
                    87.2,1695,-150.5,8.89;
          & c0, c1, c2, c3  &
BYTE    TABLE c02 := 10,06,' ,'O,'P,'E,'N,' ,
    ' ,' ,' ,' ;      & label &
BYTE    TABLE d02 := std_open , 0;
          & std_type, type2&
& std #  3 &
& xref to 8510 std #  9 for 7mm and 3.5mm (not
 Type N)&
REAL    TABLE a03 := 0, 999@9,
              & fmin, fmax &
                    50.0, 0.0,  0.0,
          & Zo, delay, loss &
                    0.0, 0.0, 0.0, 0.0;
          & c0, c1, c2, c3  &
BYTE    TABLE c03 := 10,09,'B,'R,'O,'A,'D,'B,
    'A,'N,'D,' ;      & label &
BYTE    TABLE d03 := std_load,  0;
```

```
              & std_type, type2&
& std #  4 &
& xref to 8510 std # 11 for 7mm and 3.5mm (not
Type N)&
REAL    TABLE a04 := 0, 999@9,
              & fmin, fmax &
                    50.0, 0.0,  0.0,
           & Zo, delay, loss &
                   0.0, 0.0, 0.0, 0.0;
           & c0, c1, c2, c3   &
BYTE    TABLE c04 := 10,06,' ,'T,'H,'R,'U,' ,
' ,' ,' ,' ;        & label &
BYTE    TABLE d04 := std_thru,   0;
            & std_type, type2&
& std #  5 &
& xref to 8510 std # 10 for 7mm and 3.5mm (not
Type N)&
REAL    TABLE a05 := 1.999@9,999.0000@9,
              & fmin, fmax &
                    50.0, 0.0,  0.0,
           & Zo, delay, loss &
                   0.0, 0.0, 0.0, 0.0;
           & c0, c1, c2, c3   &
BYTE    TABLE c05 := 10,07,'S,'L,'I,'D,'I,'N,
'G,' ,' ,' ;       & label &
BYTE    TABLE d05 := std_load,   sliding;
            & std_type, type2&
& std #  6 &
& xref to 8510 std # 12 for 7mm and 3.5mm (not
Type N)&
REAL    TABLE a06 := 0,2.001@9,
              & fmin, fmax &
                    50.0, 0.0,  0.0,
           & Zo, delay, loss &
                   0.0, 0.0, 0.0, 0.0;
           & c0, c1, c2, c3   &
BYTE    TABLE c06 := 10,07,'L,'O,'W,'B,'A,'N,
'D,' ,' ,' ;       & label &
BYTE    TABLE d06 := std_load,   0;
            & std_type, type2&
& std #  7 &
& xref to 8510 std # 14 for 7mm and 3.5mm (not
Type N)&
REAL    TABLE a07 := 0, 999@9,
              & fmin, fmax &
                    50.0, 0.0,  0.0,
           & Zo, delay, loss &
                   0.0, 0.0, 0.0, 0.0;
           & c0, c1, c2, c3   &
BYTE    TABLE c07 := 10,01,' ,'S,'H,'O,'R,'T,
' ,' ,' ,' ;       & label &
BYTE    TABLE d07 := std_short,   0;
            & std_type, type2&
& std #  8 &
& xref to 8510 std # 16 for 7mm and 3.5mm (not
Type N)&
```

```
REAL    TABLE a08 := 0, 999@9,
                & fmin, fmax &
                        50.0, 0.0,  0.0,
            & Zo, delay, loss &
                        0.0,0.0,0.0,0.0;
        &c0, c1, c2, Zterminal&
BYTE    TABLE c08 := 10,06,' ,'O,'P,'E,'N,' ,
 ' ,' ,' ,' ;         & label &
BYTE    TABLE d08 := std_open , 0;
            & std_type, type2&
& vvv Lightwave Standards vvv &
&       Optical         &
& std # 9 &
REAL    TABLE a09 := 0, 999@9,
                & fmin, fmax &
                        1.46, 0.0, 0.0,
            & n, length, loss &
                        100.,0.0,40.0,0.0;
        &c0, c1, c2, Zterminal&
BYTE    TABLE c09 := 10,09,'R,'E,'F,'L,'E,'C,
 'T,'O,'R,' ;         & label &
BYTE    TABLE d09 := std_refl , 0;
            & std_type, type2&
& std # 10 &
REAL    TABLE a10 := 0, 999@9,
                & fmin, fmax &
                        1.46, 0.0, 0.0,
            & n, length, loss &
                        3.5,0.0,0.0,0.0;
        &c0, c1, c2, Zterminal&
BYTE    TABLE c10 := 10,07,'F,'R,'E,'S,'N,'E,
 'L,' ,' ,' ;         & label &
BYTE    TABLE d10 := std_fresnel , 0;
            & std_type, type2&
& std # 11 &
REAL    TABLE a11 := 0, 999@9,
                & fmin, fmax &
                        1.46, 0.0, 0.0,
            & n, length, loss &
                        0.0,0.0,0.0,0.0;
        &c0, c1, c2, Zterminal&
BYTE    TABLE c11 := 10,06,' ,'T,'H,'R,'U,' ,
 ' ,' ,' ,' ;         & label &
BYTE    TABLE d11 := std_opt_thru , 0;
            & std_type, type2&
& vvvvvv E/O standards vvvvvv &
& std # 12 &
REAL    TABLE a12 := 0, 999@9,
                & fmin, fmax &
                        1.46, 0.0, 0.0,
            & n, length, loss &
                        0.0,0.0,0.0,0.0;
        &c0, c1, c2, Zterminal&
BYTE    TABLE c12 := 10,07,' ,'T,'H,'R,'U,'S,
 ' ,' ,' ,' ;         & label &
```

```
BYTE      TABLE d12 := std_source , 0;
              & std_type, type2&
& std # 13 &
REAL      TABLE a13 := 0, 999@9,
              & fmin, fmax &
                      1.46, 0.0, 0.0,
              & n, length, loss &
                      0.0,0.0,0.0,0.0;
          &c0, c1, c2, Zterminal&
BYTE      TABLE c13 := 10,10,'R,'E,'F,'L,' ,'S,
'E,'N,'S,' ;         & label &
BYTE      TABLE d13 := std_refl_sens , 0;
              & std_type, type2&
& std # 14 &
REAL      TABLE a14 := 0, 999@9,
              & fmin, fmax &
                      1.46, 0.0, 0.0,
              & n, length, loss &
                      0.0,0.0,0.0,0.0;
          &c0, c1, c2, Zterminal&
BYTE      TABLE c14 := 10,10,'T,'H,'R,'U,'/,'R,
'C,'V,'R,' ;         & label &
BYTE      TABLE d14 := std_thru_rcvr , 0;
              & std_type, type2&
& vvvvvv O/E standards vvvvvv &
& std # 15 &
REAL      TABLE a15 := 0, 999@9,
              & fmin, fmax &
                      1.46, 0.0, 0.0,
              & n, length, loss &
                      0.0,0.0,0.0,0.0;
          &c0, c1, c2, Zterminal&
BYTE      TABLE c15 := 10,07,' ,'T,'H,'R,'U,'S,
' ,' ,' ,' ;         & label &
BYTE      TABLE d15 := std_receiver , 0;
              & std_type, type2&
& std # 16 &
REAL      TABLE a16 := 0, 999@9,
              & fmin, fmax &
                      1.46, 0.0, 0.0,
              & n, length, loss &
                      0.0,0.0,0.0,0.0;
          &c0, c1, c2, Zterminal&
BYTE      TABLE c16 := 10,10,' ,'T,'H,'R,'U,'/,
'S,'R,'C,' ;         & label &
BYTE      TABLE d16 := std_thru_src , 0;
              & std_type, type2&

COMMENT class lists of cal standards for TYPE
 N cal kits;

BYTE      TABLE b01 :=  2, 2, 8, 0, 0, 0, 0, 0,
              & port1_1st_std &
                       2, 1, 7, 0, 0, 0, 0, 0,
```

```
        & port1_2nd_std &
            3, 3, 5, 6, 0, 0, 0, 0,
        & port1_3rd_std &
            1, 3, 0, 0, 0, 0, 0, 0,
        & isoln_fwd_std &
            1, 4, 0, 0, 0, 0, 0, 0,
        & match_fwd_std &
            1, 4, 0, 0, 0, 0, 0, 0,
        & trans_fwd_std &
            2, 2, 8, 0, 0, 0, 0, 0,
        & port2_1st_std &
            2, 1, 7, 0, 0, 0, 0, 0,
        & port2_2nd_std &
            3, 3, 5, 6, 0, 0, 0, 0,
        & port2_3rd_std &
            1, 3, 0, 0, 0, 0, 0, 0,
        & isoln_rev_std &
            1, 4, 0, 0, 0, 0, 0, 0,
        & match_rev_std &
            1, 4, 0, 0, 0, 0, 0, 0,
        & trans_rev_std &
            5, 1, 7, 2, 8, 4, 0, 0,
        & freq_resp_std &
            5, 1, 7, 2, 8, 4, 0, 0,
        & two_term_resp &
            1, 3, 0, 0, 0, 0, 0, 0;
        & two_term_offs &
```

COMMENT b2 is number of classes to modify in current cal kit to
        convert to one port opt kit.
        b02 is class to be modified and the new class list.
        The number of lines in b02 must equal the value of b2;
INTEGER TABLE b2.L := 2,freq_resp_std,two_term_resp;
BYTE TABLE b02.L :=
            2, 9,10, 0, 0, 0, 0, 0, &freq_resp_std&
            2, 9,10, 0, 0, 0, 0, 0; &two_term_resp&

COMMENT b3 is number of classes to modify in current cal kit to
        convert to opt kit.
        b03 is new class lists. Must be in same order as in be;
INTEGER TABLE b3.L := 2, freq_resp_std, two_term_resp;
BYTE TABLE b03.L :=
            3, 9,10,11, 0, 0, 0, 0, &freq_resp_std&
            3, 9,10,11, 0, 0, 0, 0; &two_term_resp&

```
COMMENT b4 is number of classes to modify in
 current cal kit to
        convert to E/O kit.
        b04 is class to be modified and the new
 class list;
INTEGER TABLE b4.L := 3, trans_fwd_std, freq_
 resp_std, two_term_resp;
BYTE TABLE b04.L :=
            1,12, 0, 0, 0, 0, 0, 0,    &
 trans_fwd_std&
            2,12,13, 0, 0, 0, 0, 0,    &
 freq_resp_std&
            2,12,13, 0, 0, 0, 0, 0;    &
 two_term_resp&

COMMENT b5 is number of classes to modify in
 current cal kit to
        convert to O/E kit.
        b05 is class to be modified and the new
 class list;
INTEGER TABLE b5.L := 3, trans_fwd_std, freq_
 resp_std, two_term_resp;
BYTE TABLE b05.L :=
            1,15, 0, 0, 0, 0, 0, 0,    &
 trans_fwd_std&
            1,15, 0, 0, 0, 0, 0, 0,    &
 freq_resp_std&
            1,15, 0, 0, 0, 0, 0, 0;    &
 two_term_resp&

COMMENT
****************************************************
* The following are used by guided setup to        *
* perform calibrations                             *
****************************************************
;
COMMENT g0 is number of classes to modify in
 current cal kit to
        convert to an optical reflection.
        g00 is class to be modified and the
 new class list;
INTEGER TABLE g0.L := 1, freq_resp_std;
BYTE TABLE g00.L :=
            2, 9,10, 0, 0, 0, 0, 0;    &
 freq_resp_std&

COMMENT g1 is number of classes to modify in
 current cal kit to
        convert to an optical transmission.
        g01 is class to be modified and the
 new class list;
INTEGER TABLE g1.L := 1, freq_resp_std;
BYTE TABLE g01.L :=
            1,11, 0, 0, 0, 0, 0;    &
 freq_resp_std&
```

COMMENT g2 is number of classes to modify in current cal kit to
       convert to an O/E transmission.
       g02 is class to be modified and the new class list;
INTEGER TABLE g2.L := 2, trans_fwd_std, freq_resp_std;
BYTE TABLE g02.L :=
           1,15, 0, 0, 0, 0, 0, 0,   &  trans_fwd_std&
           1,15, 0, 0, 0, 0, 0, 0;   &  freq_resp_std&

COMMENT g3 is number of classes to modify in current cal kit to
       convert to an E/O transmission.
       g03 is class to be modified and the new class list;
INTEGER TABLE g3.L := 2, trans_fwd_std, freq_resp_std;
BYTE TABLE g03.L :=
           1,12, 0, 0, 0, 0, 0, 0,   &  trans_fwd_std&
           1,12, 0, 0, 0, 0, 0, 0;   &  freq_resp_std&

COMMENT g4 is number of classes to modify in current cal kit to
       convert to E/O reflection sensitivity.
       g04 is class to be modified and the new class list;
INTEGER TABLE g4.L := 1, freq_resp_std;
BYTE TABLE g04.L :=
           1,13, 0, 0, 0, 0, 0, 0;   &  freq_resp_std&

COMMENT g5 is number of classes to modify in current cal kit to
       convert to an elec. transmission.
       g05 is class to be modified and the new class list;
INTEGER TABLE g5.L := 1, freq_resp_std;
BYTE TABLE g05.L :=
           1, 4, 0, 0, 0, 0, 0, 0;   &  freq_resp_std&

COMMENT g6 is number of classes to modify in current cal kit to
       convert to an elec. transmission.
       g06 is class to be modified and the new class list;
INTEGER TABLE g6.L := 1, freq_resp_std;
BYTE TABLE g06.L :=
           2, 1, 2, 0, 0, 0, 0, 0;   &  freq_resp_std&

& The following values reflect the current data found in the HP 8510A &
& (their file is also sstddata). Changed 9/24/86 Doug Bender     &

& Changed for new 3.5 mm cal kits 4/23/87 Doug
& Changed to a double table to allow for new 8510B cal coefficients, &
& which would not "fit" as integers. 10/20/87 Doug     &

```
GLOBAL DOUBLE TABLE ee_ck :=
        700,            & 7 mm  B.1  loss in Mohm/s &
       8720,                                    & std
  2 open c0 * 100  &
      169500,                                   & std
  2 open c1 * 100  &
      -15050,                                   & std
  2 open c2 * 100  &
         889,                                   & std
  2 open c3 * 100  &
           0,                                   & std
  2 delay in fsec  &
           0,                                   & std
  1 delay in fsec  &

1300,           &  3.5 mm  B.1  loss in Mohm/s &
        4345,                                   & std
  2 open c0 * 100  &
       81870,                                   & std
  2 open c1 * 100  &
       -4893,                                   & std
  2 open c2 * 100  &
         125,                                   & std
  2 open c3 * 100  &
       29240,                                   & std
  2 delay in fsec  &
       31783,                                   & std
  1 delay in fsec  &
        2999,                                   & std
  5 fmin in MHz    &
        3001,                                   & std
  6 fmax in MHz    &

& * = Modified from Rev. 1.00  &
         800,           & N 50    B.1  loss in Mohm/s*&
        8831,                                   & std
  2 open c0 * 100 *&
      166720,                                   & std
  2 open c1 * 100  &
      -14661,                                   & std
  2 open c2 * 100  &
```

```
               975,                    & std
2 open c3 * 100    &
               22905,                  & std
2 delay in fsec    &
               27990,                  & std
1 delay in fsec    &
               8831,                   & std
8 open c0 * 100  *&
               166720,                 & std
8 open c1 * 100    &
               -14661,                 & std
8 open c2 * 100    &
               975,                    & std
8 open c3 * 100    &
               57993,                  & std
8 delay in fsec    &
               63078;                  & std
7 delay in fsec    &
PROCEDURE i_Nkit;
                ENTRY;
  BEGIN
    BYTE POINTER iptr1, iptr2;
    STPNTR( iptr1, ADRS( b01 ) );
    STPNTR( iptr2, ADRS( cal_kit_ary ) + std_
 class_1 );
    MOVE iptr2 := iptr1, +( std_class_label1
 - std_class_1 - 1 );
  END;

PROCEDURE i_kit(addr);
  VALUE addr; DOUBLE addr;
  BEGIN
  BYTE POINTER bptr1, bptr2;
  INTEGER POINTER iptr;
  INTEGER i;

STPNTR( iptr, addr );   & set to bX or gX table &
  STPNTR( bptr1, ADRS( iptr[ iptr[0]+1 ] ) );
  & set to b0x or g0x &

FOR i := 1 TO iptr[0] DO BEGIN
     STPNTR( bptr2, ADRS(cal_kit_ary) + std_class_
 1 +
                           iptr[i]*class_list_
 size );
     MOVE bptr2 := bptr1, +(class_list_size);

STPNTR( bptr1, ADRS(bptr1[0]) + class_list_
 size );
    END for;
  END i_kit;

COMMENT
          set_cal_kit
 *********************************************
```

```
* Prepare cal kit for lightwave measurements    *
*************************************************
;
;
PROCEDURE set_cal_kit( type );
    VALUE type; INTEGER type;
            ENTRY;
    BEGIN CASE type OF BEGIN
        BEGIN END;  & ELECTRICAL &
        i_kit( ADRS(b3) );   & OPTICAL     &
        i_kit( ADRS(b4) );   & E/O         &
        i_kit( ADRS(b5) );   & O/E         &
    END;
END;

PROCEDURE set_gcal_kit( type );
    VALUE type; INTEGER type;
                    ENTRY;
    BEGIN CASE type OF BEGIN
    i_kit( ADRS(g0) );   & O refl &
    i_kit( ADRS(g1) );   & O/O trans &
    i_kit( ADRS(g2) );   & O/E trans &
    i_kit( ADRS(g3) );   & E/O trans &
    i_kit( ADRS(g4) );   & E/O refl sens &
    i_kit( ADRS(g5) );   & E refl &
    i_kit( ADRS(g6) );   & E/E trans &
    END;
END;

PROCEDURE preset_elec_kit_tbl;
  BEGIN
    BYTE POINTER iptr1, iptr2;
    STPNTR( iptr1, ADRS( a00 ) );
    STPNTR( iptr2, ADRS( cal_kit_ary ) );
    MOVE iptr2 := iptr1, +(elec_kit_size);
  END;

PROCEDURE preset_opt_kit_tbl;
  BEGIN
    BYTE POINTER iptr1, iptr2;
    STPNTR( iptr1, ADRS( a09 ) );
    STPNTR( iptr2, ADRS( cal_kit_ary )+elec_kit_size );
    MOVE iptr2 := iptr1, +(opt_kit_size);
    dirty_opt_kit := FALSE;
  END;

PROCEDURE preset_eo_kit_tbl;
  BEGIN
    BYTE POINTER iptr1, iptr2;
    STPNTR( iptr1, ADRS( a12 ) );
```

```
      STPNTR( iptr2, ADRS( cal_kit_ary )+elec_kit_
  size+opt_kit_size );
      MOVE iptr2 := iptr1, +(eo_kit_size);
   END;

PROCEDURE preset_oe_kit_tbl;
   BEGIN
      BYTE POINTER iptr1, iptr2;
      STPNTR( iptr1, ADRS( a15 ) );
      STPNTR( iptr2, ADRS( cal_kit_ary )+elec_kit_
  size+opt_kit_size +eo_kit_size );
      MOVE iptr2 := iptr1, +(oe_kit_size);
   END;

PROCEDURE preset_kit_tbl(type);
   VALUE type; INTEGER type;
                    ENTRY;
   BEGIN
   CASE type OF BEGIN
      preset_elec_kit_tbl;
      preset_opt_kit_tbl;
      preset_eo_kit_tbl;
      preset_oe_kit_tbl;
      END of case;
   END;

END$
```

The following comprises a table of softkeys for selecting the desired type of error correction.

```
.CAL_TYPE_MENU
--------
"CALIBRATE:"
"NONE"
\011
,corr_off( curr_e_ch );
[Ccal_none
|
--------
"RESPONSE"
\000
[Cresponse_type
,set_cal_type( response );
|
--------
"RESPONSE"
q+" ISOL'N"
\000
[Ctwo_term_type
,BEGIN
,set_cal_type( two_term );
```

```
,END;
|
--------
"S11"
"1-PORT"
\000
[C1_port_1_type
,set_cal_type( one_port_on_1 );
|
--------
"S22"
"1-PORT"
\000
[C1_port_2_type
,set_cal_type( one_port_on_2 );
|
--------
"FULL"
"2-PORT"
\000
[C2_port_type
,set_cal_type( two_port );
--------
"RESPONSE"
q+" MATCH"
[Ceo_match_type
,set_cal_type( eo_match );
--------
"RESPONSE"
q+" MATCH"
[Coe_match_type
,set_cal_type( oe_match );
--------

.EO_MATCH_MENU
--------
"REFLECTION"
[Ccal_eo_refl
\000
^S_REFLECTION_MENU
,check_refl_status;
|
--------
"FWD.TRANS."
sk_fwd_trans
\000
?
]Cfwd_trans
|
--------
"ISOLATION"
\000
[Ccal_eo_isol
^S_ISOLATION_MENU
,tell( isolate_ports );
```

```
--------
--------
--------
--------
"DONE"
"E/O CAL"
[Cdone_eo_match
,cal_done(done_eo_match);
--------

.OE_MATCH_MENU
--------
"REFLECTION"
[Ccal_oe_refl
\000
^REFLECTION_MENU
,check_refl_status;
|
--------
"TRANS-"
"MISSION"
\000
[Ccal_oe_thru
^S_TRANSMISSION_MENU
,tell( connect_thru );
|
--------
"ISOLATION"
\000
[Ccal_oe_isol
^S_ISOLATION_MENU
,tell( isolate_ports );
--------
--------
--------
--------
"DONE"
"O/E CAL"
[Cdone_oe_match
,cal_done( done_oe_match );
--------
```

The following instructions control acquisition of data for standards to be measured during calibration.

```
M68KL,P,"stds"
BEGIN
#FILE cchtable;
#FILE ccontvar;
#FILE cchars;
#FILE cmenu;
#FILE cactive;
```

```
#FILE ceeprom8;      & for ee_7mm, ee_35mm, ee_
N50 &
#FILE feeprom;
#FILE factv1;
#FILE fcommand;
   & for cmd_token &
#FILE cstds;
#FILE cstds2;
#FILE ccal;
   & for std_... types &
#FILE fcal;
    & for acq_data &
#FILE ccalmenu;       & for Ccal_type_menu and
 Cclass_done &
#FILE cstdmenu;
#FILE cparams;       & for Co_port, Ce_port &

#FILE fmenu;
 & for change_softkey &
#FILE cmessag1;
#FILE cmsgcal;
#FILE futil3;
      & for tell, warn &
#FILE cmessag0;
#FILE fchdata;                             & for
 curr_e_ch    &
#FILE fstimul4;
#FILE fchtable;                            & for
 set_entry_ch_int &
#FILE fscreen1;
    & for title_ary &
#FILE cparam;     & elec_device,opt_device,
 eo_device,oe_device &
#FILE fparam;                         & for new_
 param, dev_type &
#FILE crins;                               & for
  act_fcn_rin &
#FILE fkernel;                               &
 for acquire, release &
#FILE fstddata;                              &
 for preset_kit_tbl &
#FILE facttbl2;
     & for get_param   &
#FILE fcmos;
#FILE fiocnfig;                              &
 for cmos_top      &
#FILE fchdata1;
#FILE frecall;
#FILE fstring;                         & app_
 str, clr_str, app_ch &
#FILE ftitle;                  & wrt_title,
 restore_sys_title &
#FILE ffmt;                                & fmt_
 int    &
#FILE cguid;      & Cgstd1, Cgstd2, thru Cgs
 td5 &
```

```
EXTERNAL INTEGER slid_load_used;    & 1    if
  sliding load used in cal, &
                                    & 0    if not
  ... for stestlc, the    &
                                    & system
  verification routines             &
                                    & initialized
  to   0   in set_cal_type&
                                    & in scal &
BYTE ARRAY cal_kit_lbl[-1:10] = cmos_top - total_
  cal_kit_size;
BYTE ARRAY std_classes[ 0:14, 0:class_size ]
  = cal_kit_lbl[11];
BYTE ARRAY std_class_labels[0:14,-1:10] = std_
  classes[15,0];
BYTE ARRAY std_data[1:max_stds, 1:std_size] =
  std_class_labels[15,-1];
BYTE ARRAY gclass[0:5];
GLOBAL
BOOLEAN dirty_opt_kit = std_data[max_stds+1,1 ];

BOOLEAN new_element_list;

GLOBAL
BYTE ARRAY cal_kit_ary.L[0:cal_kit_ary_size-1
  ] = cal_kit_lbl[-1];

#EJECT;
INTEGER current_class;
          & class   # (0-7) &
GLOBAL ALPHA curr_class_label;
INTEGER current_element;
          & element # (1-7) &
GLOBAL INTEGER last_class_element;
GLOBAL INTEGER curr_std_id;
      & standard number &
ALPHA    current_std_label;

BYTE TABLE class_param_ee.L :=
    s11-1,   & port1_1st_std &
    s11-1,   & port1_2nd_std &
    s11-1,   & port1_3rd_std &
    s21-1,   & isoln_fwd_std &
    s11-1,   & match_fwd_std &
    s21-1,   & trans_fwd_std &
    s22-1,   & port2_1st_std &
    s22-1,   & port2_2nd_std &
    s22-1,   & port2_3rd_std &
    s12-1,   & isoln_rev_std &
    s22-1,   & match_rev_std &
    s12-1;   & trans_rev_std &
    COMMENT not used
    0,       & freq_resp_std &
    0,       & two_term_resp &
    0;       & two_term_offs &
```

```
BYTE TABLE class_param_eo1.L :=
    s11-1,   & port1_1st_std &
    s11-1,   & port1_2nd_std &
    s11-1,   & port1_3rd_std &
    eo1_parm, & isoln_fwd_std &
    s11-1,   & match_fwd_std &
    eo1_parm, & trans_fwd_std &
    s22-1,   & port2_1st_std &
    s22-1,   & port2_2nd_std &
    s22-1,   & port2_3rd_std &
    s12-1,   & isoln_rev_std &
    s22-1,   & match_rev_std &
    s12-1;   & trans_rev_std &

BYTE TABLE class_param_eo2.L :=
    s11-1,   & port1_1st_std &
    s11-1,   & port1_2nd_std &
    s11-1,   & port1_3rd_std &
    eo2_parm, & isoln_fwd_std &
    s11-1,   & match_fwd_std &
    eo2_parm, & trans_fwd_std &
    s22-1,   & port2_1st_std &
    s22-1,   & port2_2nd_std &
    s22-1,   & port2_3rd_std &
    s12-1,   & isoln_rev_std &
    s22-1,   & match_rev_std &
    s12-1;   & trans_rev_std &

BYTE TABLE class_param_oe1.L :=
    s11-1,   & port1_1st_std &
    s11-1,   & port1_2nd_std &
    s11-1,   & port1_3rd_std &
    oe1_parm, & isoln_fwd_std &
    s11-1,   & match_fwd_std &
    oe1_parm, & trans_fwd_std &
    s22-1,   & port2_1st_std &
    s22-1,   & port2_2nd_std &
    s22-1,   & port2_3rd_std &
    s12-1,   & isoln_rev_std &
    s22-1,   & match_rev_std &
    s12-1;   & trans_rev_std &

BYTE TABLE class_param_oe2.L :=
    s11-1,   & port1_1st_std &
    s11-1,   & port1_2nd_std &
    s11-1,   & port1_3rd_std &
    oe2_parm, & isoln_fwd_std &
    s11-1,   & match_fwd_std &
    oe2_parm, & trans_fwd_std &
    s22-1,   & port2_1st_std &
    s22-1,   & port2_2nd_std &
    s22-1,   & port2_3rd_std &
    s12-1,   & isoln_rev_std &
    s22-1,   & match_rev_std &
    s12-1;   & trans_rev_std &
```

```
INTEGER TABLE class_elements.L :=
    std_class_1 + port1_1st_std * class_list_size,
    std_class_1 + port1_2nd_std * class_list_size,
    std_class_1 + port1_3rd_std * class_list_size,
    std_class_1 + isoln_fwd_std * class_list_size,
    std_class_1 + match_fwd_std * class_list_size,
    std_class_1 + trans_fwd_std * class_list_size,
    std_class_1 + port2_1st_std * class_list_size,
    std_class_1 + port2_2nd_std * class_list_size,
    std_class_1 + port2_3rd_std * class_list_size,
    std_class_1 + isoln_rev_std * class_list_size,
    std_class_1 + match_rev_std * class_list_size,
    std_class_1 + trans_rev_std * class_list_size,
    std_class_1 + freq_resp_std * class_list_size,
    std_class_1 + two_term_response_std * class_
list_size,
    std_class_1 + two_term_offset_std * class_
list_size;

INTEGER TABLE celement.L :=
                0,
    Cclass_std1,
    Cclass_std2,
    Cclass_std3,
    Cclass_std4,
    Cclass_std5,
    Cclass_std6,
    Cclass_std7,
    Cgstd1,
    Cgstd2,
    Cgstd3,
    Cgstd4,
    Cgstd5;

INTEGER TABLE std_class_label.L :=
    std_class_label1 + port1_1st_std * (label_
size+2),
    std_class_label1 + port1_2nd_std * (label_
size+2),
    std_class_label1 + port1_3rd_std * (label_
size+2),
    std_class_label1 + isoln_fwd_std * (label_
size+2),
    std_class_label1 + match_fwd_std * (label_
size+2),
    std_class_label1 + trans_fwd_std * (label_
size+2),
    std_class_label1 + port2_1st_std * (label_
size+2),
    std_class_label1 + port2_2nd_std * (label_
size+2),
    std_class_label1 + port2_3rd_std * (label_
size+2),
    std_class_label1 + isoln_rev_std * (label_
size+2),
```

```
      std_class_label1 + match_rev_std * (label_
  size+2),
      std_class_label1 + trans_rev_std * (label_
  size+2),
      std_class_label1 + freq_resp_std * (label_
  size+2),
      std_class_label1 + two_term_response_std *
  (label_size+2),
      std_class_label1 + two_term_offset_std *
  (label_size+2);

INTEGER TABLE Cclass.L   :=
    Cport1_std1,      & port1_1st_std &
    Cport1_std2,      & port1_2nd_std &
    Cport1_std3,      & port1_3rd_std &
    Cfwd_isol,        & isoln_fwd_std &
    Cfwd_match,       & match_fwd_std &
    Cfwd_trans,       & trans_fwd_std &
    Cport2_std1,      & port2_1st_std &
    Cport2_std2,      & port2_2nd_std &
    Cport2_std3,      & port2_3rd_std &
    Crev_isol,        & isoln_rev_std &
    Crev_match,       & match_rev_std &
    Crev_trans,       & trans_rev_std &
    Cresponse_type,   & freq_resp_std &
    C2T_response,     & two_term_response_std &
    C2T_offset;       & two_term_offset_std &

INTEGER TABLE Cload_type.L :=
      Cfixed_load,
      Csliding_load;

INTEGER TABLE Coffset_type.L :=
      Ccoax,
      Cwaveguide;

INTEGER TABLE Cstd_type.L :=
      Cdef_open,
      Cdef_short,
      Cdef_load,
      Cdef_air_line,
      Cdef_z;

DOUBLE   cal_kit;                            & addr
 ess of cal kit descriptor &
GLOBAL ALPHA   cal_kit_label;
BYTE POINTER type2;
GLOBAL DOUBLE cal_std_addr;                  & addr
 ess of cal std descriptor &

INTEGER ARRAY max_measured_std[ port1_1st_std
 :two_term_offset_std ];
DOUBLE  ARRAY cal_std_addrs[ port1_1st_std:two_
 term_offset_std,
                                  1:class_size
                           ];
```

```
#EJECT;

SUBROUTINE set_ptr_type2;
     STPNTR( type2, cal_std_addr + type2_off
set );

COMMENT
         h_offset_type
****************************************************
****************************************************
SUBROUTINE  h_offset_type;
   BEGIN & h_offset_type & set_ptr_type2;
     h_key( Coffset_type[ type2 AND %0001 ],

Ccoax,
               Cwaveguide
                 );
   END;   & h_offset_type &

#EJECT;
COMMENT
            hilight_load_type
****************************************************
****************************************************
;
SUBROUTINE  hilight_load_type;
   BEGIN & hilight_load_type & set_ptr_type2;
     h_key( Cload_type[ ARIGHT(type2,1) AND
%0001 ],
              Cfixed_load,
              Csliding_load
                 );
   END;   & hilight_load_type &

#EJECT;
COMMENT
            hilight_std_type
****************************************************
****************************************************
;
PROCEDURE  hilight_std_type;
   BEGIN & hilight_std_type &
     BYTE POINTER std_type;

STPNTR( std_type, cal_std_addr + type_
offset );
```

```
        h_key( Cstd_type[ std_type ],
                Cdef_open,
                Cdef_z
                );
   END;  & hilight_std_type &

#EJECT;
COMMENT
        h_last_class
*******************************************************
*******************************************************
;
SUBROUTINE h_last_class;
            ENTRY;
   BEGIN & h_last_class &
      h_cmd( Cclass[current_class] );
   END;  & h_last_class &

#EJECT;
COMMENT
        h_last_element
*******************************************************
*******************************************************
;
SUBROUTINE h_last_element;
            ENTRY;
   BEGIN & h_last_element &
      h_cmd( celement[current_element] );
   END;  & h_last_element &

#EJECT;
COMMENT
               set_std_addr
*******************************************************
*******************************************************
;
PROCEDURE  set_std_addr( std_no );
   VALUE   std_no;
   INTEGER std_no;
   BEGIN & set_std_addr &
      cal_std_addr := cal_kit +
                      std_def_1 +
                      (std_no - 1) * std_size ;
   END;  & set_std_addr &

#EJECT;
COMMENT
                  std_id
*******************************************************
```

```
*                                                        *
* Selects the specified (id) standard for sub-           *
* sequent modification of its values.                    *
*                                                        *
**********************************************************
;
PROCEDURE  std_id( id );
   VALUE   id;
   INTEGER id;
                        ENTRY;
   BEGIN & std_id &
      curr_std_id := id;
      set_std_addr( curr_std_id );
      current_std_label := cal_kit + std_def_
1 + label_offset +
                        (std_size * (curr_
std_id-1));
      hilight_std_type;
      COMMENT
      gen_menu( MODIFY_STDS_MENU );

END;   & std_id &

#EJECT;
COMMENT
                  define_std
**********************************************************
*                                                        *
* Specify standard type                                  *
*                                                        *
**********************************************************
;
PROCEDURE  define_std( std_type );
   VALUE   std_type;
   BYTE    std_type;
   BEGIN & define_std &
   BYTE POINTER bptr;
      select_act_fcn( active_off );
      h_on( Cdef_open, Cdef_z );
      & bptr now points to the "old" (current)
standard definition. &
      STPNTR( bptr, cal_std_addr + type_offset );
      IF std_type <> std_load THEN
         bptr[1] := RBIT(bptr[1],1);
      bptr := std_type;
      hilight_load_type;
      h_offset_type;
   END;   & define_std &

PROCEDURE  define_opt_std( std_type );
   VALUE   std_type; BYTE    std_type;
                        ENTRY;
```

```
    BEGIN & define_std &
        select_act_fcn( active_off );
        curr_std_id := std_type;
        set_std_addr( curr_std_id );
        dirty_opt_kit := TRUE;
    END;   & define_opt_std &

#EJECT;
COMMENT
                    define_type2
***********************************************
***********************************************
;
PROCEDURE   define_type2( type2_data  , mask);

VALUE   type2_data , mask;
    BYTE    type2_data , mask;
    BEGIN & define_type2 & set_ptr_type2;
        type2 := TURN( type2, type2_data , mask );
        hilight_load_type;
                    & DEBUG?&
        h_offset_type;
                & DEBUG?&
    END;   & define_type2 &

#EJECT;
COMMENT
            write_element_list
***********************************************
***********************************************
;
PROCEDURE   write_element_list;
  BEGIN
    BYTE POINTER element_ptr;
    INTEGER element;
    BYTE ARRAY str[-1:3];
    BYTE str_length = str[-1];

str_length:=3;
    STPNTR( element_ptr,cal_kit + class_elements
 [current_class] );
    clr_str( title );

element:=1;
    WHILE element <= element_ptr[0] DO
        BEGIN
            app_str ( title,
                fmt_int(element_ptr[element],ADRS
 (str),%01000300));
            IF element # element_ptr[0] THEN app_
 ch( title,',);
```

```
            element:=element + 1;
        END;

wrt_title;
   END write_element_list ;
#EJECT;
COMMENT
                    std_class
***********************************************
*                                              *
* Selects the specified class (id) for entering a *
* list of standards.  Clears any existing list *
* for the specified class.                     *
*                                              *
***********************************************
;
PROCEDURE   std_class( id );
   VALUE   id;
   INTEGER id;
   BEGIN & std_class &
   BYTE POINTER bptr;

current_class := id;
       write_element_list;
       curr_class_label := std_class_label[current_
 class] + cal_kit;
       new_element_list:=TRUE;
       tell( specify_std_class );
       select_act_fcn( active_std_class );

END;   & std_class &

#EJECT;
COMMENT
            std_class_element
***********************************************
*                                              *
* Adds the specified standard (id) to the list of *
* elements that make up the current class.     *
*                                              *
***********************************************
;
PROCEDURE   std_class_element( id );
   VALUE   id;
   INTEGER id;
                        ENTRY;
   BEGIN & std_class_element &
      INTEGER index;
      BYTE POINTER class_element;

STPNTR( class_element,
              cal_kit + class_elements[current_
 class]  );
```

```
       IF new_element_list THEN index:=1
       ELSE index := 1 + class_element[0];
       new_element_list:=FALSE;

IF index <= class_size THEN
           BEGIN & if &
               class_element[index] := id;
               class_element[0] := index;
           END    & if &
       ELSE
           warn( exceeded_std_class_limit );

write_element_list;
    END;  & std_class_element &

#EJECT;
COMMENT
             cal_kit_defined
*****************************************************
*****************************************************
;
SUBROUTINE cal_kit_defined;
   BEGIN & cal_kit_defined &
      curr_std_id := 1;
   END;  & cal_kit_defined &

#EJECT;
COMMENT
               set_element
*****************************************************
*                                                   *
* Select the element of a class (1-7) to be         *
* subsequently measured.  Look up the appropriate   *
* standard number.                                  *
*                                                   *
*****************************************************
;
PROCEDURE   set_element( element );
   VALUE    element;
   INTEGER element;
                        ENTRY;
   BEGIN & set_element &
      BYTE POINTER std_type,
                   class_element;
      INTEGER temp_menu;

IF element <= last_class_element THEN
        BEGIN current_element := element;
```

```
    STPNTR( class_element,
            cal_kit + class_elements[current_class]
          );

set_std_addr( class_element[element] );

STPNTR( std_type, type_offset + cal_std_addr );

IF std_type[0] = std_source THEN
        acq_data_eo
    ELSE IF std_type[0] = std_receiver THEN acq_data_oe
    ELSE IF (std_type[1] AND sliding) = 0 THEN
        & not sliding &
        acq_data
    ELSE
                    & sliding &
        BEGIN
        temp_menu := prior_menu;
        gen_menu( SLIDING_LOAD_MENU );
        prior_menu := temp_menu;
        tell( slide_load );
        slid_load_used:=1;
                                            & 1      if
sliding load used in cal,    &
                                            & 0      if
not... for stestlc, the      &
                                            & system
verification routines        &
                                            & initialized
to    0   in set_cal_type&
                                            & in scal &
        END;
    END
    ELSE
      warn( out_of_range );

END;  & set_element &

PROCEDURE set_gelement( element );
  VALUE element; INTEGER element;
                ENTRY;
  BEGIN
      BYTE POINTER std_type,
                  class_element;
      INTEGER temp_menu;

IF element <= gclass[0] THEN
      BEGIN current_element := element+7;  & uses by
h_last_element &
```

```
    set_std_addr( gclass[element] );

STPNTR( std_type, type_offset + cal_std_
addr );

IF std_type[0] = std_source THEN
        acq_data_eo
    ELSE IF std_type[0] = std_receiver THEN acq_data_oe
    ELSE IF (std_type[1] AND sliding) = 0 THEN
        & not sliding &
        acq_data
    ELSE
                & sliding &
        BEGIN
        temp_menu := prior_menu;
        gen_menu( SLIDING_LOAD_MENU );
        prior_menu := temp_menu;
        tell( slide_load );
        slid_load_used:=1;
                                    & 1     if
sliding load used in cal,    &
                                    & 0     if
not... for stestlc, the      &
                                    & system
verification routines        &
                                    & initialized
to   0   in set_cal_type&
                                    & in scal &
        END;
    END
    ELSE
      warn( out_of_range );

END;

COMMENT
          std_class_title
*************************************************
*                                                *
* Returns the alpha label for the specified class *
*                                                *
*************************************************
;
ALPHA PROCEDURE std_class_title(n);
  VALUE n;
  INTEGER n;
                        ENTRY;
  BEGIN
    std_class_title := std_class_label[n] + cal_
 kit ;
  END;

COMMENT
```

```
                     standard_title
*****************************************************
*                                                   *
* Returns the alpha label for the specified         *
* standard                                          *
*                                                   *
*****************************************************
;
ALPHA PROCEDURE standard_title( std );
  VALUE std;
  INTEGER std;
                        ENTRY;
  BEGIN
    BYTE POINTER class_element;

STPNTR( class_element,
            cal_kit + class_elements[current_
class] );

IF std > last_class_element THEN
         standard_title := " "
       ELSE
         standard_title := cal_kit + std_def_1
+ label_offset +
                          (std_size * (class_
element[std]-1));

END standard_title;

#EJECT;
COMMENT
                set_std_class
*****************************************************
*                                                   *
* Specifies the class from which standards will     *
* be selected during cal.                           *
*                                                   *
*****************************************************
;
PROCEDURE   set_std_class( class );
   VALUE    class;
   INTEGER  class;
                        ENTRY;
   BEGIN & set_std_class &
      BYTE POINTER class_element;

current_class := class;
      curr_class_label := std_class_label[current_
class] + cal_kit;

COMMENT changed so it does not change
pramter if S parameters
             are not presently selected;
```

```
    IF ( current_class < freq_resp_std ) THEN
      BEGIN
        IF ( ( cal_type = two_port ) OR ( cal_type = s_two_port )
           ) THEN
          new_param( class_param_ee[current_class] )
        ELSE IF cal_type = eo_match THEN
          BEGIN
            IF e_ch_bit( Co_port )=0 THEN
              new_param( class_param_eo1[current_class] )
            ELSE
              new_param( class_param_eo2[current_class] );
          END
        ELSE IF cal_type = oe_match THEN
          BEGIN
            IF e_ch_bit( Ce_port )=0 THEN
              new_param( class_param_oe1[current_class] )
            ELSE
              new_param( class_param_oe2[current_class] );
          END;
      END;

STPNTR( class_element,
            cal_kit + class_elements[current_class]
          );
    last_class_element := INTEGER( class_element[0] );

max_measured_std[current_class] := 0;
    IF last_class_element > 1 OR current_class= freq_resp_std THEN
        BEGIN & more than one std in this class &
            h_off( Cclass_std1, Cclass_std7 ) ;
            gen_menu( STD_CLASS_MENU );
            tell( connect_std );
        END   & more than one std in this class &
    ELSE & single standard &
        BEGIN
        set_element( 1 );                    & set-up and measure it &
        END;

END;   & set_std_class &

PROCEDURE set_gstd_class(class);
  VALUE class; INTEGER class;
                    ENTRY;
  BEGIN
  BYTE POINTER bptr, class_element;
  INTEGER element, gelement, std_no, std_type,
          g_meas_type;
```

```
   current_class := class;
   curr_class_label := std_class_label[current_
class] + cal_kit;
   max_measured_std[current_class] := 0;
   STPNTR( class_element, cal_kit + class_
elements[class] );
   last_class_element := INTEGER( class_element
[0] );
   gelement := 0;
   IF last_class_element > 5 THEN last_class_
element := 5;
   FOR element := 1 TO last_class_element DO
      BEGIN
      std_no := class_element[element];
      set_std_addr( std_no );
      gelement := gelement+1;
      gclass[gelement] := std_no;
      END;
   gclass[0] := gelement;
   h_off( Cgstd1, Cgstd5 );
   gen_menu( STDg_MENU );
   END;

#EJECT;
COMMENT
               get_..._label
********************************************
********************************************
;
SUBROUTINE get_cal_kit_label;
                 ENTRY;
   BEGIN & get_cal_kit_label &
      BYTE POINTER label_ptr = cal_kit_label;

MOVE title_ary[-1] := label_ptr[-1], +(
  2 + label_size );
   END;  & get_cal_kit_label &

SUBROUTINE get_std_class_label;
                  ENTRY;
   BEGIN & get_std_class_label &
      BYTE POINTER label_ptr = curr_class_label;
      & must add class labelling selection &
      MOVE title_ary[-1] := label_ptr[-1], +(
  2 + label_size );
   END;   & get_std_class_label &

SUBROUTINE get_std_label;
                  ENTRY;
   BEGIN & get_std_label &
      BYTE POINTER label_ptr = current_std_label;
      MOVE title_ary[-1] := label_ptr[-1], +(
```

```
      2 + label_size );
   END;  & get_std_label &

#EJECT;
COMMENT
                put_..._label
********************************************
********************************************
;
SUBROUTINE put_cal_kit_label;
                        ENTRY;
   BEGIN & put_cal_kit_label &
      MOVE cal_kit_label := title;
   END;  & put_cal_kit_label &

SUBROUTINE dirty_cal_kit_label;
   BEGIN & dirty_cal_kit_label &
      BYTE POINTER label_ptr = cal_kit_label;

label_ptr[ label_ptr[0] ] := '*;
   END;  & dirty_cal_kit_label &
SUBROUTINE put_std_class_label;
                        ENTRY;
   BEGIN & put_std_class_label &
      MOVE curr_class_label := title;
   END;  & put_std_class_label &

SUBROUTINE put_std_label;
                        ENTRY;
   BEGIN & put_std_label &
      MOVE current_std_label := title;
   END;  & put_std_label &

#EJECT;
COMMENT
                label_class
********************************************
********************************************
;
PROCEDURE  label_class( id );
   VALUE   id;
   INTEGER id;
   BEGIN & label_class &
      current_class := id;
      curr_class_label := std_class_label[cur
rent_class] + cal_kit;
      select_act_fcn( active_std_class_label );
   END;  & label_class &
```

```
#EJECT;
COMMENT
                std_measd
****************************************************
*                                                  *
* Add the current standard to the list of stan-    *
* dards measured.  Return its f_min and f_max.     *
*                                                  *
****************************************************
;
INTEGER PROCEDURE std_measd( f_min, f_max, class );
   & by reference &
   REAL    f_min, f_max;
   INTEGER class;
                        ENTRY;
   BEGIN & std_measd &
      BOOLEAN move_stds;
      INTEGER i;
      REAL POINTER std;
      BYTE POINTER byte_ptr = std;

& check if this std has already been
measured &
      move_stds := FALSE;
      IF max_measured_std[current_class] >= 1 THEN
          FOR i := 1 UNTIL max_measured_std[current_
class] DO
              IF move_stds THEN
                  cal_std_addrs[current_class,(i-1)]
:=
                                            cal_
std_addrs[current_class,i]
              ELSE IF cal_std_addrs[current_class,
i] = cal_std_addr
                  THEN
                      move_stds := TRUE;
      IF NOT move_stds THEN
          max_measured_std[current_class] :=
                                    max_measured_
std[current_class] + 1;

& place this standard in the list of
measured standards &
      cal_std_addrs[current_class,max_measured_
std[current_class]] := cal_std_addr;

& return the frequency limits of this
standard &
      STPNTR( std, cal_std_addr );
      f_min := std[ f_min_index ];
      f_max := std[ f_max_index ];
      class := current_class;
      set_ptr_type2;
      COMMENT return std type and type2 packed
```

```
         as an integer;
             std_measd := LEFT(INTEGER(type2[-1]),8)
          + INTEGER(type2[0]);

END;   & std_measd &

#EJECT;
COMMENT
                freq_covered
**************************************************
*                                                  *
* Returns TRUE if the current frequency range has  *
* been covered by standards measured since the     *
* most recent set_std_class(), FALSE otherwise.    *
*                                                  *
**************************************************
;
BOOLEAN PROCEDURE freq_covered;
                 ENTRY;
    BEGIN & freq_covered &
       BYTE    used;
       BOOLEAN covered;
          & temporary result &
       INTEGER i,
               j;
       REAL    min,
               max,
               band_start,
               band_stop,
               temp_min,
               temp_max;
       QUAD    temp_quad;
       REAL POINTER std;

covered := FALSE;
       used := 0;

IF max_measured_std[current_class] > 0   THEN
           BEGIN & if & temp_quad := e_ch_quad( ch_start_
frequency );
            band_stop := REAL( temp_quad +
                                    e_ch_quad( ch_
frequency_span ) );
            band_start := temp_quad;

j := 0;
            min := 1.0@37;
         & a very big_number &
            FOR i := 1 UNTIL max_measured_std
[current_class] DO
               BEGIN & for &
                  STPNTR( std, cal_std_addrs[
```

```
current_class,i] );
               temp_min := std[f_min_index ];
               temp_max := std[f_max_index ];
               IF ( (temp_min < min)
          AND
                    (temp_min < band_stop)
          AND
                    (temp_max > band_start )
                  ) THEN        & part of
standard is in current band &
                  BEGIN & if &
                     j := i;
                     min := temp_min;
                     max := temp_max;
                  END;   & if &
          END;   & for &

& check for coverage &
          IF min <= band_start THEN
             BEGIN & if &
                used := SBIT( used, j );

& cumbersome, but smaller than
a sort &
                FOR i := 1 UNTIL max_measured_
std[current_class] DO
                   FOR j := 1 UNTIL max_
measured_std[current_class] DO
                      IF NOT TBIT(used,j) THEN
                         BEGIN & if &
                            STPNTR( std, cal_
std_addrs[
          current_class,
          j
          ]
                            );
                            IF std[f_min_index]
< max THEN
                               BEGIN & if &
                                  temp_max
:= std[f_max_index];
                                  IF temp_max
> max THEN
                                     max :=
  temp_max;
                                  used := S
BIT(used,j);
                               END;  & if &
                            END;  & if &
```

```
                IF max >= band_stop THEN
                     covered := TRUE;
              END;  & if &
         END;  & if & freq_covered := covered;
   END;  & freq_covered &

#EJECT;
COMMENT
                standard_specs
*********************************************
*                                             *
* Returns the address of the REAL ARRAY contain- *
* ing the specifications of the standard in the  *
* class for the specified frequency. Individual  *
* specifications are indexed by the ..._index    *
* constants in cstds.                            *
*                                             *
*********************************************
;
DOUBLE PROCEDURE standard_specs( frequency, class);
   VALUE   frequency, class;
   REAL    frequency;
   INTEGER class;
                          ENTRY;
   BEGIN & standard_specs &
      INTEGER i;
      BOOLEAN done;
      REAL POINTER std;

done := FALSE;
      i := max_measured_std[class];
      WHILE ( (i > 0) AND (NOT done) ) DO
         BEGIN & while &
            STPNTR( std, cal_std_addrs[class, i] );
                  & take_data must use the same
 banding rules &
            IF ( (std[f_min_index] <= frequency)
 AND
                 (std[f_max_index] >= frequency)
               ) THEN
               done := TRUE
            ELSE
               i := i - 1;
         END;  & while & standard_specs := cal_std_addrs[class,i ];

END;  & standard_specs &

#EJECT;
COMMENT
                mod_standard
```

```
************************************************
************************************************
;
PROCEDURE mod_standard( std_no, offset, r_value );
  VALUE std_no, offset, r_value;
  INTEGER std_no, offset; REAL r_value;
  BEGIN
    REAL POINTER rptr;
    STPNTR( rptr, cal_kit + std_def_1 + (std_
no - 1)*std_size + offset);
    rptr := r_value;
  END;

PROCEDURE mod_std_label( std_no, label );
  VALUE std_no, label; INTEGER std_no; ALPHA
 label;
  BEGIN
    ALPHA temp_label;
      temp_label := cal_kit + std_def_1 + label_
offset +
                              ( std_size * (std_
no - 1));
      MOVE temp_label := label;
  END;

COMMENT
************************************************
*                                               *
* An inelegant, specific purpose routine to     *
* change the 7mm cal kit into a generic TYPE N  *
* cal kit.  There may be a more efficient table *
* driven technique - but for now     --         *
*                                               *
************************************************
;
PROCEDURE preset_type_N_kit ;
  BEGIN
    BYTE POINTER bptr;
    INTEGER i_std_no;
    COMMENT change OPEN and SHORT to OPENS and
 SHORTS in class labels;
    STPNTR( bptr, cal_kit + std_class_label1 );
    bptr[5] := bptr[18] := bptr[77] := bptr[9
0] := 'S;
    bptr[0] := bptr[12] := bptr[72] := bptr[8
4] := 6;

COMMENT change class lists of standards;
    i_Nkit;

COMMENT change std labels on open and shorts;
    mod_std_label( 1, "SHORT (M)" );
    mod_std_label( 2, "OPEN (M)" );
    mod_std_label( 7, "SHORT (F)" );
```

```
        mod_std_label( 8, "OPEN (F)" );

END;

#EJECT;
COMMENT
                     load_ee_ck
****************************************************
****************************************************
;
PROCEDURE load_ee_ck( type );
  VALUE type; INTEGER type;
  BEGIN & type = 0 ... 7 mm &
  & type = 1 ... 3.5 mm &
  & type = 2 ... Type N &
  & type = 3 ... User kit, not stored in eeprom
 nor used here &

INTEGER i_std_no,
             c_offset,
             offset;

INTEGER TABLE ck_offset.L :=
          ee_7mm,
          ee_35mm,
          ee_N50;

SUBROUTINE get_open_c;
       BEGIN
         mod_standard( i_std_no, c_offset, ee_
 doub( offset )*1.@-2 );
         offset := offset + 4;
       END;

SUBROUTINE get_delay;
       BEGIN
         mod_standard( i_std_no, delay_offset,
 ee_doub( offset )*1.@-15 );
         offset := offset + 4;
       END;

SUBROUTINE get_open;
       BEGIN
         c_offset := c0_offset; get_open_c;
         c_offset := c1_offset; get_open_c;
         c_offset := c2_offset; get_open_c;
         c_offset := c3_offset; get_open_c;
         get_delay;
       END;
     SUBROUTINE get_loss;
       BEGIN
         FOR i_std_no := 1 TO 8 DO
           mod_standard( i_std_no, loss_offset,
```

```
ee_doub( offset )*1.@6 );
      offset := offset + 4;
    END;

IF type = 2 THEN preset_type_N_kit;

offset := ck_offset[ type ];
  get_loss;
  i_std_no := 2; get_open;
  i_std_no := 1; get_delay;

IF type = 1 THEN     & 3.5 mm &
  BEGIN
    i_std_no := 5;
    mod_standard( i_std_no, f_min_offset, ee_
doub( offset )*1.@6 );
    offset := offset + 4;
    i_std_no := 6;
    mod_standard( i_std_no, f_max_offset, ee_
doub( offset )*1.@6 );
  END;

IF type = 2 THEN     & type N 50 ohm &
    BEGIN
      i_std_no := 8; get_open;
      i_std_no := 7; get_delay;
    END;

END load_ee_ck;

#EJECT;
COMMENT
                    sel_ck
*******************************************
*                                         *
* Selects one of the 4 possible cal kits as the *
* present active kit.  Not an elegant approach - *
* but it gives the flexibility to eventually *
* transfer the coefficients to EEPROM easily. *
* The table approach would be more difficult. *
*                                         *
* Modified 9/25/86 by Doug Bender          *
*   deleted the type N 75 ohm cal kit (now on *
*   ly 4 kits as shown above) simplified to a *
*   single case statement for readibility and *
*   future cal kits                        *
*                                         *
* One of 5  8/21/87 db                    *
* One of 4 10/20/87 db                    *
*                                         *
*******************************************
;
PROCEDURE sel_ck( kit );
  VALUE kit; INTEGER kit;
                      ENTRY;
  BEGIN
```

```
    ALPHA temp_alpha;
    INTEGER i_std_no;
    REAL POINTER rptr;

IF cal_in_progress THEN
        terminate_cal;     & stop cal if in progress &
    cal_kit := ADRS( cal_kit_ary );
    cal_kit_label := cal_kit + std_kit_label;

CASE kit OF BEGIN
      BEGIN
      & set up 7 mm B.1 kit &
          set_e_ch_real( 50., ch_system_z0 );
          preset_kit_tbl(elec_device);
          load_ee_ck( kit );      & see file sstddata,
    table ee_ck &
      END;

BEGIN
      & set up 3.5 mm B.1 kit &
          set_e_ch_real( 50., ch_system_z0 );
          preset_kit_tbl(elec_device);
          load_ee_ck( kit );      & see file sstddata,
    table ee_ck &
          temp_alpha := "3.5mm";
          MOVE cal_kit_label := temp_alpha;
      END;

BEGIN                                    & setup
    Type N, 50 ohm cal kit &
          set_e_ch_real( 50., ch_system_z0 );
          preset_kit_tbl(elec_device);
          load_ee_ck( kit );      & see file sstddata,
    table ee_ck &
          temp_alpha := "N·50"+ohm_char;
          MOVE cal_kit_label := temp_alpha;
      END;

BEGIN
       & user defined cal kit &
          move_block( ADRS( cmos_top ) - user_cal_
    kit_size,
                                     cal_kit, user_cal_
    kit_size/2 );
          set_e_ch_real( user_system_z0, ch_system_
    z0 );
      END;
    END case;

& The following does the underlining on the
    softkey menu. &
      h_key( Cck7mm + kit, Cck7mm, Cckud );

END sel_ck;
```

```
COMMENT
                save_uck
***********************************************
*                                             *
* Procedure to save the user's cal kit into cmos *
* memory                                      *
*                                             *
***********************************************
;
SUBROUTINE save_uck;
 BEGIN
  move_block( cal_kit, ADRS( cmos_top ) - user_
  cal_kit_size,
                                        user_
  cal_kit_size/2 );
  user_system_z0 := e_ch_real( ch_system_z0 )
  ;
  beep_done;
 END;

#EJECT;
COMMENT
                i_stds
***********************************************
***********************************************
;
PROCEDURE   i_stds;
                ENTRY;
   BEGIN & i_stds & curr_std_id := 1;
      sel_ck( e_ch_bitmap( Cck7mm ));
      preset_kit_tbl( opt_device );
      preset_kit_tbl( elec_device );
      preset_kit_tbl( eo_device );
      preset_kit_tbl( oe_device );
      dirty_opt_kit := FALSE;
      IF recall_type = power_lost_recall THEN
   save_uck;
      END;  & i_stds &

#FILE fstdmenu;

END$
```

The following instructions are executed in a multi-tasking operating system that processes measured data. This data processing includes error correction.

```
COMMENT
                ary_upd
***********************************************
```

```
*                                                           *
*       upper         lower                                 *
*     XXXX XXXX     XXXX XXXX                               *
*      \   /  \ /   \   /                                   *
*       \ /    V     \ /                                    *
*        |     |      |                                     *
*        |     |      -------- source of data for           *
*        |     |               update (see ctrace2)         *
*        |     ---------------- channel to be updated       *
*        ---------------------- type of update to be        *
*                               performed (see carray)      *
*                                                           *
*************************************************************
;
PROCEDURE ary_upd;          & a process &
                ENTRY;
   BEGIN & ary_upd &
      LABEL    loop;
      INTEGER  fifo_word,
               ch;
      BYTE     channel,
               upd_type,
               fifo_word_upper = fifo_word,
               fifo_word_lower = fifo_word+1;
      BYTE ARRAY accum[1:2];
      BOOLEAN  respond;
      BOOLEAN  temp = ch;

time_update_pending := 3;        & first
   time: update ch1 and ch2 &
      graticule_update_pending := TRUE;
               & first time & loop:
      accum[1] := 0;
      accum[2] := 0;

DO
       BEGIN & do & fifo_word := read_ff( ary_upd_fifo );

channel := fifo_word_upper AND array_
ch_mask;

IF (channel AND %0001) <> 0 THEN
              accum[1] := accum[1] OR fifo_word_
lower;
          IF (channel AND %0002) <> 0 THEN
              accum[2] := accum[2] OR fifo_word_
lower;

IF (fifo_word_upper AND time_update_
mask) <> 0 THEN
              time_update_pending := SBIT(time_
update_pending,channel);
```

```
            IF (fifo_word_upper AND graticule_
update_mask) <> 0 THEN
                graticule_update_pending := TRUE;
            IF (fifo_word_upper AND ary_upd_mask)
<> 0 THEN
                ary_upd_pending := SBIT(ary_upd_
pending,
channel
                                                     );

preempt;

respond := awaited( ap_fini );
        END    & do &
    UNTIL ( ( empty_ff( ary_upd_fifo )     )
AND
            ( NOT awaited( array_fifo_not_full
) AND  build_done )
            );        & wait for fifo empty and
no pending wrt_ff's &

COMMENT IF respond is true, then someone
is waiting for array
            to finish everything it has
already read from the fifo,
            despite whatevery additional
commands may be put into
            the fifo before array completes
the processing section;

acquire( processing_variables );

IF graticule_update_pending THEN
        BEGIN & if &
            set_trace_mem_both;   & update trace
memory requirements &
            IF (text_on = 0) AND disp_on THEN part_trace_and_grat;
            graticule_update_pending := FALSE ;
            rst_dp_ptrs;          & trace pointers
may have changed   &
            rst_datap;
            IF (text_on = 0) AND disp_on THEN upd_limit_lines;
        END;   & if &

COMMENT to make sure the off channel
doesn't get done;

IF trace_mode = single_ch THEN accum[ 3
- curr_e_ch ] := 0;

FOR ch := 1 UNTIL 2 DO
```

```
          IF accum[ch] <> 0 THEN
              BEGIN & if &
                  IF TBIT( ary_upd_pending, ch )
THEN
                      BEGIN & if &
                          cont_datap( ch );
                          ary_upd_pending := RBIT(
ary_upd_pending,
      ch );
                      END;  & if &
                  IF TBIT( time_update_pending,
ch ) THEN
                      BEGIN & if &
                          cont_datap_time( ch );
                          time_update_pending := R
BIT(time_update_pending,
      ch );
                      END;  & if &
                  IF (accum[ch] AND update_m) <>
 0 THEN
                      BEGIN & if &
COMMENT The following instructions perform data
processing.
                          upd_datap( ch, update_m );
                          accum[ch] := accum[ch]
 XOR update_m;
                      END;  & if &
                  IF (accum[ch] AND update_l) <>
 0 THEN
                      BEGIN & if &
                          limit_lines( ch );
                          accum[ch] := accum[ch]
 XOR update_l;
                      END;  & if &
                  upd_type := accum[ch] AND update_
raw;  &includes d and f&
                  IF upd_type <> 0 THEN
                      BEGIN
COMMENT The following instructions perform data
processing.
                          upd_datap( ch, upd_type );
                          accum[ch] := accum[ch]
 XOR upd_type;
                      END;
                  IF (accum[ch] AND update_t) <>
 0 THEN
                      BEGIN & if &
                        IF ( NOT TBIT( dirty, ch
) OR
                             ( num_of_groups[ ch ]
 = hold )) AND
                             ( recall_type = done_
recall ) THEN
```

```
                    limit_test( ch );
            END;   & if &
        END;  & if & list_values;

release( processing_variables );

IF ( NOT TBIT( dirty, ch ) OR
         ( num_of_groups[ ch ] = hold )) AND
         ( recall_type = done_recall ) THEN
            upd_mkrs;     & move markers, update-mark,
1st point, ch mark &

IF ( temp := (( empty_ff( ary_upd_fifo
)     ) AND
                    ( NOT awaited( array_fifo_
not_full ))) ) THEN
            ary_dirty := FALSE;

IF awaited( ap_fini ) AND ( temp  OR
respond ) THEN
            send( ap_fini );

preempt;

GO TO loop;
  END;   & ary_upd &
```

The following instructions control error correction parameters used during processing of measured data.

```
COMMENT
            cont_datap
****************************************************
*                                                   *
* EXTERNAL SPECIFICATION FOR cont_datap             *
* FUNCTION:                                         *
* This routine will convert user variables into     *
* internal variables needed for data processing.    *
* This routine will not distrub any of the data     *
* pointers.                                         *
*                                                   *
*                                                   *
* DECLARATION INFORMATION:                          *
*                                                   *
* INPUT:   ch        Channel (1/2) to be effected   *
*                                                   *
* OUTPUT:                                           *
*                                                   *
* EXTERNAL EFFECTS:                                 *
*                                                   *
****************************************************
*                                                   *
```

```
* LOGIC INFORMATION FOR cont_datap               *
*                                                 *
* MODULES CALLED:                                  *

*                                                 *
* INITIAL REFINEMENT:                              *
*                                                 *
*                                                 *
**************************************************
#EJECT end of comment;
INTEGER PROCEDURE cont_datap(ch); VALUE ch;
 INTEGER ch;

ENTRY;
BEGIN
DOUBLE   dp_vars_adrs,
         dp_ptrs_adrs;
BYTE     POINTER dp_byte_ptr = dp_vars_adrs;
INTEGER  POINTER dp_int_ptr  = dp_vars_adrs;
REAL     POINTER dp_real_ptr = dp_vars_adrs;
DOUBLE   POINTER dp_double_ptr=dp_vars_adrs;
DOUBLE   POINTER dp_ptrs=dp_ptrs_adrs;
INTEGER  POINTER grat_specs;
INTEGER  POINTER iptr;
INTEGER  basis_s_param,
         param_type,
         cal_type;

REAL     x_div_size, y_div_size,
         x_grad_ref, y_grad_ref;

REAL ref_val;

INTEGER   format_code, format, math_index;

dp_vars_adrs :=   ch_dp_vars[ch];
 dp_ptrs_adrs :=   ch_dp_ptrs[ch];
 IF  ch = 1 THEN
     STPNTR(grat_specs,ADRS(grat1_specs))
   ELSE
      STPNTR(grat_specs,ADRS(grat2_specs));

format       := ch_bitmap( Cmag, ch);
 format_code  := fmt_map[format];

dp_int_ptr[dp_y_min] := grat_specs[min_y];
 dp_int_ptr[dp_y_max] := grat_specs[max_y];
 y_div_size := REAL(grat_specs[div_y]);

cont_datap_freq(ch);

system_z0 := ch_real( ch_system_z0, ch );
        & assumes that z0 is always coulped --
 what if test set different&
```

```
dp_real_ptr[dp_y_gain] := y_div_size/ch_real
(ch_scale,ch);

IF TBIT(format_code, polar_bit) THEN
    BEGIN
    dp_int_ptr[dp_x_min] := grat_specs[min_x] ;
    dp_int_ptr[dp_x_max] := grat_specs[max_x] ;
    dp_double_ptr[dp_x_offset] := DOUBLE(grat_
specs[grat_x]);
    dp_double_ptr[dp_y_offset] := DOUBLE(grat_
specs[grat_y]);
    dp_real_ptr[dp_x_gain] := dp_real_ptr[dp_
y_gain] * aspect_ratio;
    END of polar
  ELSE
    BEGIN ref_val := ch_real(ch_ref_val,ch);
    IF format = fmt_log_mag THEN
        BEGIN
        ref_val := ref_val * inv_log2_db;
        dp_real_ptr[dp_y_gain] :=  dp_real_ptr
[dp_y_gain] * log2_to_db;
        END
    ELSE IF format = fmt_phase THEN
        BEGIN
        dp_double_ptr[dp_phase_ref] := DOUBLE(
-ref_val*inv_ph_scale);
        ref_val := 0.0;
        dp_real_ptr[dp_y_gain] := dp_real_ptr[
dp_y_gain] * phase_scale;
        END
    ELSE IF format = fmt_delay THEN
        BEGIN
        ref_val := ref_val/ dp_real_ptr[dp_grp_
dly_scal];
        dp_real_ptr[dp_y_gain] := dp_real_ptr[dp_
y_gain] *
                                    dp_real_ptr[dp_
grp_dly_scal]
        END;

y_grad_ref := (ch_real(ch_ref_pos,ch) *
                                    y_div_size)
+ REAL(grat_specs[grat_y]);
   dp_real_ptr[dp_y_offset] := (y_grad_ref/dp_
real_ptr[dp_y_gain])
                                - ref_val;

IF format = fmt_log_mag OR format = fmt_phase
THEN
      BEGIN
      dp_double_ptr[dp_y_gain] := DOUBLE( 4096.
* 4096 *
                                              dp
```

```
_real_ptr[dp_y_gain] );
     COMMENT gain factor is over scaled by 256,
data must be
        scaled down by 256 after multiplying
 by gain factor;
     dp_double_ptr[dp_y_offset] := DOUBLE(dp_
real_ptr[dp_y_offset]);
     END;

END of rectangular;

IF ch_bit(Ccorrection, ch) = 1    THEN     & d
ds &
   BEGIN
   cal_type := ch_bitmap( Ccal_none, ch );
   param_type := get_param( ch );
   basis_s_param := IF ((cal_type = two_port ) OR
                         (cal_type = s_two_port))
AND
                            ( param_type <= 3 &s2
2& ) THEN
                         param_type + 1 ELSE 1;

IF cal_type=eo_match AND param_type=0 &s1
1& THEN
        cal_type := one_port_on_1
    ELSE IF cal_type=oe_match AND param_type=3
&s22& THEN
        cal_type := one_port_on_2;

dp_double_ptr[dp_correct_sw] := corr_tbl[ cal_
 type ];

dp_int_ptr[dp_corr_offset] := 6*(num_mpts
[ch]-1);

STPNTR( iptr, zoom_addr(ch) );
   IF ADRS( iptr ) <> 0 THEN
       dp_int_ptr[dp_corr_offset] := 6*(iptr[
hd_num_of_pts]-1)
     ELSE IF ch_bit ( Cdsp_sing_seg, ch ) AND
           ch_bit ( Clist_freq, ch )   THEN
         dp_int_ptr[dp_corr_offset] := 6*(list_
pts-1);

dp_double_ptr[dp_corr_select] := ADRS(s_coeff
[ basis_s_param ] );
   END of correction
 ELSE
    dp_double_ptr[dp_correct_sw] := corr_tbl[0];

dp_double_ptr[dp_para_conv_sw] := conv_tbl[
                     ch_bitmap( C
conv_off, ch) ];&dds&
                  &  ch_int( ch_param_
```

```
conversion, ch) ]; &

IF ch_bit( Cd_div_m, ch ) THEN math_index : = 1
    ELSE IF ch_bit( Cd_minus_m, ch ) THEN math_index := 2
         ELSE math_index := 0;
dp_double_ptr[dp_trac_math_sw] := math_tbl[math_index];

dp_ptrs[dp_m_ptr] := 6*dp_int_ptr[dp_pos] +
ch_dbl(ch_m_base,ch);

IF (format = fmt_log_mag) THEN
   BEGIN
   param_type := get_param( ch );
   COMMENT if optical parameter then set to optical db
           optical dB is placed right after regular formats
           by using max_format+1
           ;
   IF (param_type >= LW_param) AND
      (param_type <= 14 &O/O2&) THEN
      dp_double_ptr[dp_format_sw]    := fmt_table[max_format+1]
     ELSE
      dp_double_ptr[dp_format_sw]    := fmt_table[format];
   END
 ELSE
   dp_double_ptr[dp_format_sw]    := fmt_table[format];
dp_double_ptr[dp_smoo_inc_sw]  := inc_smoo_tbl[format];
dp_double_ptr[dp_smoo_dec_sw]  := dec_smoo_tbl[format];
dp_double_ptr[dp_smoo_scal_sw] := scal_smoo_tbl[format];
dp_double_ptr[dp_smoo_exit_sw] := exit_smoo_tbl[format];
dp_int_ptr[dp_fini_signal] := ch_int( ch_finished_signal, ch);

cont_datap := 0;

END of cont_datap;
```

The following instructions update processing of measured data, including error correction.

```
#EJECT;
COMMENT
            upd_datap
************************************************
*                                               *
* EXTERNAL SPECIFICATION FOR upd_datap          *
```

```
*                                                          *
* FUNCTION:                                                *
*                                                          *
* Starting from a specified intermediate storage           *
* array (i.e., D or M or F), this routine will             *
* place on the display a complete trace. All               *
* pointers to data, and conditions of the                  *
* processing will be setup elsewhere.                      *
*                                                          *
*                                                          *
* DECLARATION INFORMATION:                                 *
*                                                          *
* INPUT:   update_ch     The channel ( 1/2 ) to be         *
*                        updated                           *
*          update_block  The degree of update              *
*          ( start at   D, M or F )                        *
*                                                          *
*    OUTPUT: none                                          *
*                                                          *
* EXTERNAL EFFECTS:                                        *
*                                                          *
* The display and various intermediate arrays are          *
* update.                                                  *
************************************************************
*                                                          *
* LOGIC INFORMATION FOR upd_datap                          *
*                                                          *
* MODULES CALLED:                                          *
*                                                          *
* INITIAL REFINEMENT:                                      *
*                                                          *
* The address of the start of the needed update            *
* routine is found, with the twist that update             *
* from f is different if the display is in polar           *
* or rectangluar.  The pointers to memory                  *
* pointers and variables are setup in registers            *
* for 'compute'.  The trace math switch needs to           *
* store if updating M in case group delay is               *
* selected ( normally trace math is skipped ).             *
*                                                          *
* A loop for the correct number of points is               *
* then done.                                               *
*                                                          *
************************************************************

#EJECT end of comment;
PROCEDURE upd_datap(update_ch,update_block);
                              VALUE    update_ch,
  update_block ;
                              INTEGER update_ch,
  update_block ;         ENTRY;
BEGIN
DOUBLE     ch_byte_dbl,
           update_switch;
INTEGER    point,
           ch_trace,
           update_subtype,
```

```
                            format;

DOUBLE   POINTER  dp_dbl_ptr = vars_base;
INTEGER POINTER  dp_int_ptr = vars_base;
BYTE POINTER     dp_byte_ptr = vars_base,
                 ch_byte_ptr = ch_byte_dbl;

format := mkr_fmt( update_ch );    & mgh &
IF update_block = update_f THEN
   IF format < 0 THEN update_subtype := update_
f_polar
     ELSE IF format = fmt_log_mag THEN
             update_subtype := update_f_rect_dbl
       ELSE IF format = fmt_phase THEN
             update_subtype := update_f_rect_ph
         ELSE update_subtype := update_f;

cont_datap_sm( update_ch, update_block );

set_vars_ptrs_base( 0 );
   ch_byte_dbl      :=         ch_dp_vars[ update_
ch ] ;

MOVE dp_byte_ptr := ch_byte_ptr ,+( last_dp_
vars );

init_scr;                            & only needs
to done at power up &
   reset_dp_vars( 0 );

IF update_block = update_m THEN
      BEGIN
         ch_trace :=  0 & ch_m_trace_base &;
         dp_dbl_ptr[dp_trac_math_sw] := math_
tbl; &math off&
      END
    ELSE ch_trace :=  1 & ch_trace_base & ;

set_dp_ptrs( update_ch, 0, ch_trace );

l_mode := ch_bit(Clist_freq, update_ch) OR
           ch_bit(Clog_freq,  update_ch);
 num_pt := num_pts[ update_ch ];

IF update_block = update_f THEN
   BEGIN
     update_switch := upd_table[ update_subtype -
1 ];
     set_vars_ptrs_base( 0 );
     REPEAT num_pt DO
        ASSEMBLE( MOVE.L   update_switch, R8;
                  JSR      (R8)
    );
     END
  ELSE
```

```
      BEGIN
        f_list := mem_id_addr[ list_id[update_ch ] ];
        d_list := f_list + 8*num_mpts[update_ch] ;
```

COMMENT The following instruction processes the array of data, including error correction.

```
        ary_datap( update_block, update_ch );
      END
```

END upd_datap;

The following instructions call the error correction subroutine to process the array of measured data.

```
PROCEDURE ary_datap( update_block, ch );
   VALUE update_block, ch;
   INTEGER update_block, ch;
                        ENTRY;
BEGIN
  DOUBLE ptrs_base   = REGISTER 11;
  DOUBLE vars_base   = REGISTER 12;
  DOUBLE POINTER dp_ptrs = ptrs_base;
  DOUBLE POINTER dp_vars = vars_base;
  INTEGER index, num_pts_freq, demod;
  DOUBLE  dp_d,dp_m;

compute_xform := ch_bit( Ctransform, ch );
  compute_gate  := ch_dm_bit( Cgate, ch,
           IF update_block = update_m THEN
0 ELSE 1 );
  num_fpts := num_pts_freq := num_mpts[ ch ];

num_tpts := num_pts[ ch ];
  fft_size := size_of_fft;
  fft_pts := ALEFT(1, fft_size );
  IF ( td_sts AND compute_mask ) <> 0 THEN
          ary_sz := fft_pts
     ELSE ary_sz :=  num_mpts[ ch ] + 1;
  ary_sz := ary_sz * 6;
  mem_stolen( dp_scr_array_time, td_scr_arrays_
id, ary_sz );
  IF  dp_scr_array_time  # 0   THEN
  BEGIN
    chan := ch;

dp_scr_array_freq := dp_scr_array_time;
    IF ch_bit( Ccw_time, chan )  THEN
    BEGIN
       tdr_mode := 0;
       demod := ch_bitmap( Cdemod_off, ch );
```

```
      Fo := 0.0;
      Fs := ch_real( ch_sweep_time, chan ) /
                REAL( num_mpts[ chan ] - 1 );
   END
   ELSE
   BEGIN
      demod := 0;
      Fo    := REAL( ch_quad( ch_start_frequency,
chan ));
      Fs    := freq_step( chan );
   END;

IF (( td_sts AND compute_mask ) <> 0 ) AND
   ( demod = 0 ) AND
      ( ch_bitmap( Ctdr_impulse, chan ) <= step_
tdr ) THEN
     BEGIN
       Fo       := 0.0 ;
       tdr_mode := 1;
       num_fpts := num_fpts + extrapts;
       dp_scr_array_freq := dp_scr_array_freq
+ 6*extrapts;
     END   low pass
   ELSE tdr_mode := 0;

IF update_block = update_raw THEN
   BEGIN
     IF ch_bit ( Ccorrection, ch ) = 0  THEN BEGIN
       set_vars_ptrs_base( 0 );
            &restore&
       dp_vars[ dp_correct_sw ]:= corr_tbl[ 0 ];
     END
     ELSE
       set_dp_ptrs(ch, 0, 1 );  & ch_trace_base & set_vars_ptrs_base( 0 );
             & restore &
   dp_d := dp_ptrs[ dp_d_ptr ];

ASSEMBLE( MOVE num_pts_freq, R7;
             MOVE.L dp_scr_array_freq, R13

);

COMMENT  The  following  instruction  performs  error
correction on the data array.

ary_corr;
     copy_user3( dp_scr_array_freq,  dp_d, num_
pts_freq );
    END;
```

```
   IF update_block = update_m THEN
   BEGIN
     set_dp_ptrs(ch, 0, 0 & ch_m_trace_base &);
     set_vars_ptrs_base( 0 );
     dp_m := dp_ptrs[ dp_m_ptr ];
     copy_user3( dp_m, dp_scr_array_freq, num_
pts_freq );
   END
   ELSE
   BEGIN & update_raw OR update_d &
     set_dp_ptrs( ch, 0, 1 & ch_trace_base & );
     set_vars_ptrs_base( 0 );
     ASSEMBLE( MOVE   num_pts_freq, R7;
               MOVE.L dp_scr_array_freq, R1 3 );
     ary_trace_math;
   END;

IF tdr_mode THEN compute_dc_value;

IF demod > 0 THEN
            do_demod( dp_scr_array_time, num_
fpts, demod );

IF compute_gate THEN do_gating;

set_vars_ptrs_base( 0 );
            &restore&

IF tdr_mode THEN
   BEGIN
     ASSEMBLE ( MOVE.W  extrapts,R7 );
     set_dc_elec_length;
   END;

ASSEMBLE( MOVE num_fpts, R7;
            MOVE.L dp_scr_array_time, R13 ) ;
   ary_elec_length;

IF compute_xform  THEN     & dds mod 6-2-8
8 for gating offset &
   BEGIN
     do_time_domain;
     & need to make # pts same for output &
     IF tdr_mode THEN
        dp_scr_array_freq := dp_scr_array_freq -
6*extrapts;
   END;

set_vars_ptrs_base( 0 );
   ASSEMBLE( MOVE.L dp_scr_array_freq, R13 ) ;
   REPEAT num_tpts DO
   BEGIN
     ASSEMBLE( MOVE.L  (R13)+, R0;
               MOVE.W  (R13)+, R1;
               MOVE.L  R13,-(S);
```

```
                MOVE.L    dp_format_sw(R12),R10 ;
                JSR       (R10);
                MOVE.L    (S)+, R13          );
        END;

flag := 0;
        release_mem( td_scr_arrays_id );
    END
    ELSE
       warn( exceeded_available_memory );

END ary_datap;
END$
```

The following subroutines actually perform error correction on measured data.

```
*
cpx_1 HEX 0000,4000     imag part = 0  real part =
  1/2
       HEX 0000,0001    exp part = 1
 ORR
 ENT comp_datap
 ENT logE,magE,mag2E,angE,realE,logEopt
 ENT LOG10
 ENT fmt_table,corr_tbl,conv_tbl,math_tbl,upd_
 table
 ENT inc_smoo_tbl,dec_smoo_tbl,scal_smoo_tbl,
 exit_smoo_tbl
 ENT ary_corr,ary_elec_length,set_dc_elec_length
 ENT ary_trace_math
 ENT conv_to_z,conv_to_y
*    external software
 EXT MPYE_ptr,DIVE_ptr,DVRE_ptr,SUBE_ptr,ADDE_
 ptr
 EXT DVRE,ADDE,SUBE,MPYE,DIVE
 EXT MPY2,DIV2,DVR2,DIV3,CNV24,CNVA2,CNV32
 EXT exp_overflow,fst_trig,fst_sqrt
*    external data
 EXT system_z0
 EXT log_tbl,atn_tbl              in long
 address space
 EXT l_mode,f_list,d_list,num_pt
*    needed for segmented cal
 EXT prev_segs_pts,special_corr,freq_order
           declared in slists
 EXT text_on
         declared in sparmtbl
*
max_numb_points EQU 801
*
$gsp_addr EQU 1048576            100000 hex
$gsp_data EQU 1048582            100006 hex
```

```
*
*
R0   REG  0
R1   REG  1
R2   REG  2
R3   REG  3
R4   REG  4
R5   REG  5
R6   REG  6
R7   REG  7
R8   REG  8
R9   REG  9
R10  REG  10
R11  REG  11
R12  REG  12
R13  REG  13
G    REG  13
M    REG  14
S    REG  15
*
*EJECT
************* chtable_start *********
dp_m_ptr    EQU  0
dp_d_ptr    EQU  4
dp_f_ptr    EQU  8
dp_trace_ptr    EQU  12
dp_raw_get      EQU  16
dp_raw11_get    EQU  16
dp_raw21_get    EQU  20
dp_raw12_get    EQU  24
dp_raw22_get    EQU  28 dp_correct_ptr      EQU  32
dp_format_sw    EQU  0
dp_correct_sw   EQU  4
dp_trac_math_sw     EQU  8
dp_para_conv_sw     EQU  12
dp_smoo_inc_sw      EQU  16
dp_smoo_dec_sw      EQU  20
dp_smoo_scal_sw     EQU  24
dp_smoo_exit_sw     EQU  28
dp_length_init      EQU  32
dp_length_inc   EQU  36
dp_length_shift     EQU  40
dp_scr_base     EQU  44
dp_scr_head     EQU  48
dp_scr_tail     EQU  52
dp_scr_end      EQU  56
dp_grp_dly_mem      EQU  60
dp_corr_select      EQU  64
dp_ph_sm_adjust     EQU  68
dp_dbl_sm_scale     EQU  72
dp_phase_ref    EQU  76
dp_gsp_trace    EQU  80
dp_x_gain       EQU  84
dp_x_offset     EQU  88
dp_y_gain       EQU  92
```

```
dp_y_offset        EQU  96
dp_smooth_scale    EQU  100
dp_smooth_sum      EQU  104
dp_smooth_sum2     EQU  108
dp_grp_dly_scal    EQU  112
dp_x_min   EQU  116
dp_x_max   EQU  118
dp_y_min   EQU  120
dp_y_max   EQU  122
dp_pos     EQU  126
dp_flg     EQU  128
dp_smooth_aper     EQU  130
dp_smooth_delay    EQU  132
dp_smooth_corr     EQU  134
dp_corr_offset     EQU  136
dp_dsp_flg         EQU  138
************* chtable_end ***************
```

The following comprises a table of coded error correction algorithms.

```
*EJECT
corr_tbl DEF.L null_rtr  correction off
         DEF.L freq_resp response
         DEF.L two_term  two_term
         DEF.L one_port  one_port
         DEF.L one_port  one_port  on port 2
         DEF.L two_port  two_port  12_term
         DEF.L two_port  two_port ( simple )
         DEF.L eo_match
         DEF.L oe_match
conv_tbl DEF.L null_rtr  no conversion
         DEF.L conv_to_z
         DEF.L conv_to_zt
         DEF.L conv_to_y
         DEF.L conv_to_yt
         DEF.L conv_to_recip
math_tbl DEF.L math_off
         DEF.L DIVE_ptr   math_div
         DEF.L SUBE_ptr   math_minus
fmt_table DEF.L log_mag
         DEF.L phase
         DEF.L delay
         DEF.L smoothing     z_smith
         DEF.L smoothing     log_polar
         DEF.L lin_mag
         DEF.L real
         DEF.L swr
         DEF.L log_mag_opt
upd_table DEF.L update_f_rect_loop
         array processing
             DEF.L update_f_polar_loop
             DEF.L update_f_dbl_loop
             DEF.L update_f_ph_loop
```

```
inc_smoo_tbl DEF.L inc_dbl_smooth
             DEF.L inc_phase_smooth
             DEF.L inc_smoothing
             DEF.L inc_pol_smooth
             DEF.L inc_pol_smooth
             DEF.L inc_smoothing
             DEF.L inc_smoothing
             DEF.L inc_smoothing
dec_smoo_tbl DEF.L dec_dbl_smooth
             DEF.L dec_dbl_smooth
             DEF.L dec_smoothing
             DEF.L dec_pol_smooth
             DEF.L dec_pol_smooth
             DEF.L dec_smoothing
             DEF.L dec_smoothing
             DEF.L dec_smoothing
*EJECT
scal_smoo_tbl DEF.L scal_dbl_smooth
              DEF.L scal_ph_smooth
              DEF.L scale_smoothing
              DEF.L scal_pol_smooth
              DEF.L scal_pol_smooth
              DEF.L scale_smoothing
              DEF.L scale_smoothing
              DEF.L scale_smoothing
exit_smoo_tbl DEF.L exit_dbl_smooth
              DEF.L exit_ph_smooth
              DEF.L exit_smoothing
              DEF.L exit_pol_smooth
              DEF.L exit_pol_smooth
              DEF.L exit_smoothing
              DEF.L exit_smoothing
              DEF.L exit_smoothing
*EJECT
* "ptr_adjust"
* This is the entry point for special correction
* adjustment of the address already loaded in
* dp_correct_ptr(R11) to allow overlapping segments
* in list frequency mode, or allow normal,
* incremental correction.
*
* R13 is previously loaded with the address of
* dp_correct_ptr(R11).  R7 which is a loop counter
* in ary_corr added 12/31/87--see below.
*
* dp_pos(R12) is an integer that provides the
* current measurement position.
*
* Registers used:  R2, R10
*
* The global prev_segs_pts contains the current
* number of points previous to that of the current
* segment selected.
*
* The integer array freq_order (created and
* updated in slists) contains the re-ordered
```

* position of the calibration data for that point.
*
* See also file slists (sort_stim_list and build_
* stim_list) for more info.  12/17/87 Doug Bender
*
* Added short portion to test for LIST VALUES
*  mode... the dp_pos(R12) integer value is not
* updated during this mode...hence the need to
* generate the current measurement point position
* (num_corr_pts) from the R7 value in "ary_corr"
* below.   12/31/87 Doug Bender
*
```
ptr_adjust EQU *
 TST.W      special_corr          declared in slists...segmented cal
 BEQ        normal_corr           branch for normal, increment corr.
 MOVE.W     text_on,R2
 CMP.W      =H2,R2                check to see if list values mode on
 BEQ        list_val_adj          if so, different position adjustment
 MOVE.W     dp_pos(R12),R2        current meas. pt. position --> R2
 BRA        continue_adj
list_val_adj EQU *
 MOVE.W     num_corr_pts,R2
 SUB.W      R7,R2
continue_adj EQU *
 ADD.W      prev_segs_pts,R2      previous # pts ahead of current seg.
 ADD.W      R2,R2                 double result for INTEGER ARRAY offset
 LEA.L      freq_order,R10        load address of freq_order int. array
 ADD.W      R2,R10                R2 acts as index into the array
 MOVE.W     (R10),R2              R10 points to "ordered" value
 MULU.W     #6,R2                 cal data is stored as 6 byte type
 ADD.W      R2,R13                R13 now points to proper position
 MOVE.L     R13, R8
 BRA        ptr_adjust_exit
normal_corr EQU *
 MOVE.L     R13, R8
 ADD.W      #6,  R13
 MOVE.L     R13,dp_correct_ptr(R11)
ptr_adjust_exit EQU *
 RTS
```
*
*

The following are coded error correction algorithms.

*EJECT

COMMENT The following is a coded frequency response correction algorithm.

```
freq_resp EQU *
 MOVE.L    dp_correct_ptr(R11),R13
 BSR       ptr_adjust
 JMP       DIVE_ptr
*
```

COMMENT The following is a coded frequency response and isolation algorithm.

```
two_term EQU *
 MOVE.L    dp_correct_ptr(R11),R13
 BSR       ptr_adjust
 MOVE      dp_corr_offset(R12),R10
 JSR       SUBE_ptr
 ADD.W     R10,R8
 JMP       MPYE_ptr
 implied return
*
*
*********************************************
**************************
* one_port correction  assumes R8 constains a
* ptr to the first error coeff and R10 has the
* offset needed to get each of the others
*          R0/R1 has the measured value and
* this will exit with the
*          corrected value in R0/R1
*
*          ( meas - directivity)
*  s11 actual  =   ------------------------
  ----------------------------
*                   tracking  +  source
 match * ( meas - directivity )
*********************************************
**************************
```

COMMENT The following is a coded one-port error correction algorithm.

```
one_port EQU *
 MOVE.L    dp_correct_ptr(R11),R13
 BSR       ptr_adjust
 MOVE      dp_corr_offset(R12),R10
one_port_correc EQU *
 JSR       SUBE_ptr            directivity
 MOVE.L    R0,    R5
 MOVE.W    R1,    R6           save a copy of
 measured-directivity for later
```

```
*
 ADD.W     R10,   R8
 JSR       MPYE_ptr          source match
*
 ADD.W     R10,   R8
 JSR       ADDE_ptr          tracking
*
*
 MOVE.L    R5,    R2
 MOVE.L    R6,    R3
*
 JMP       DVRE
*RTS       rts is implied in DVRE
*
*
*EJECT
*
*

COMMENT The following is a coded full two-port error
correction algorithm using four S-parameters.

two_port EQU *
 MOVE.L    dp_correct_ptr(R11),R13
 BSR       ptr_adjust
 MOVE.L    dp_raw21_get(R11),R10
 MOVE.L    (R10)+,R2
 MOVE.W    (R10)+,R3
 MOVE.L    R10,dp_raw21_get(R11)
       restore ptr
 MOVE.L    dp_raw12_get(R11),R10
 MOVE.L    (R10)+,R4
 MOVE.W    (R10)+,R5
 MOVE.L    R10,dp_raw12_get(R11)
       restore ptr
 MOVE.L    dp_raw22_get(R11),R10
 MOVE.L    (R10)+,R6
 MOVE.W    (R10)+,R7
 MOVE.L    R10,dp_raw22_get(R11)
       restore ptr *
 MOVE.L    dp_corr_select(R12),R13
 MOVE.W    dp_corr_offset(R12),R10
***********************************
*************************
*two_port_correc
 run time 1 mS/pt
*                              5 cpx div,8 cp
 x mult,6 cmp sub,2 real add
* R0/R1 = S11,   R2/R3 = S21,   R4/R5 = S12,
   R6/R7 = S22
* R8 has ptr to error terms,  R10 has offset
  between error terms
* R11/R12 have data that must be saved
* R8/R9 is used by math routines  (data in R0
  /R3)
* R12 will used as ptr to processed error terms
```

```
* R13 contains the index descirbing the S parameter to output
* and R0/R1 on exit has result
* Order (structure) of error coeffs is VERY important  ( see scal )
*  e       e       e       e       e       e       e       e
   e       e       e       e       e
*  DF      SF      RF      XF      LF      TF      DR
   SR      RR      XR      LR      TR
*************************************************************
* MOVEM of a's / b's and the cpx_1  would be faster with MOVE.L/MOVE.W
*************************************************************
*
*                       compute the interdemeniate terms ie a's and b's
*
*                                       Measured
*       - Leakage
*                       b term  =  ------------
   ------------
*                                               Tracking
*
*                       a term  =  b term    *   Match
*                                       NOTE: In a term 11,22 a +1 is added
two_port_correc EQU *
    MOVEM.L     R2/R3/R11/R12,-(S)              save for later
    LEA         coeff, R12
*
    BSR         comp_coeff                              b11

MOVEM.L     cpx_1 ,R2/R3
    JSR         ADDE
    MOVE.L      R0,(R12)+                               a11

MOVE.L      R1,(R12)+
*
    MOVEM.L     (S)+,R0/R1
    BSR         comp_coeff                              b21

MOVE.L      R0,(R12)+                               a21

MOVE.L      R1,(R12)+
*
    MOVE.L      R6,    R0
    MOVE.W      R7,    R1
    BSR         comp_coeff                              b22

MOVEM.L     cpx_1 ,R2/R3
    JSR         ADDE
    MOVE.L      R0,(R12)+                               a22
    MOVE.L      R1,(R12)+
```

```
*
 MOVE.L    R4,   R0
 MOVE.W    R5,   R1
 BSR       comp_coeff                       b12

MOVE.L    R0,(R12)+                        a12

MOVE.L    R1,(R12)+
*
*
 MOVEM.L   det_coeff,R6/R7
 BSR       use_coeff                        det MOVEM.L   R0/R1,det
 MOVEM.L   (R13),R6/R7                      R13
 has addr of item in s_coeff
 BSR       use_coeff
 selected parameter
 MOVEM.L   det,R2/R3
 MOVEM.L   (S)+,R11/R12
 JMP       DIVE
 result
*RTS  is implied in DIVE
*EJECT
*
*                      compute the interdemeniate
 terms ie a's and b's
*
*                                  Measured
   - Leakage
*                        b term = ------------
------------
*                                  Tracking
*
*                      a term = b term   *
    Match
*                                  NOTE: In a
    term 11,22 a +1 is added
*
comp_coeff EQU *
  AND.W    =HFF, R1
  JSR      SUBE_ptr
  ADD.W    R10 , R8
  MOVE.L   R8,   R11
  ADD.W    #6,   R8
  ADD.W    R10 , R8
  JSR      DIVE_ptr
  MOVE.L   R0,(R12)+
  save b term
  MOVE.L   R1,(R12)+
  ADD.W    R10 , R8
  MOVE.L   (R11)+,R2
  MOVE.W   (R11), R3
  JMP      MPYE
  compute a term
*RTS      rts is implied in mpye
```

```
*
*
*                    compute a product difference
 (w*x)-(y*z)
*                    where the terms are the
 a's and b's terms
*                    R6 and R7 hold indexes to
 which term to use
*                    R6  upper half is w index,
 R6 lower half is x index
*                    R7  upper half is y index,
 R7 lower half is z index
*                    R12 holds the pointer to
  first coeff
use_coeff EQU *
 LEA       coeff, R12
 MOVEM.L   0(R12,R7.W),R0/R1
 SWAP      R7
 MOVEM.L   0(R12,R7.W),R2/R3
 JSR       MPYE
 y*z term
 MOVE.L    R0,    R4
 save
 MOVE.W    R1,    R5
 MOVEM.L   0(R12,R6.W),R0/R1
 SWAP      R6
 MOVEM.L   0(R12,R6.W),R2/R3
 JSR       MPYE
 w*x term
 MOVE.L    R4,    R2
 restore y*z
 MOVE.W    R5,    R3
 JMP       SUBE
 result
*RTS        rts is implied in sube
*
*
*********************************************
**************************
* eo_match correction assumes R8 constains a
 ptr to the first error
*          coeff and R10 has the offset needed
 to get each of the others
*          R0/R1 has s11 for input and will exit
 with the corrected
*          s21 value
*
*                          (s21-crosstalk)/tracking
*  s21 actual = ---------------------------------
------------------------
* (eo transmission)    (1 + [(s11-directivity)*
 match/tracking])
*
*********************************************
**************************
* Order (structure) of error coeffs is VERY
 important  ( see scal )
```

```
*    e      e      e     e      e
*    DF     SF     RF    XF     TF
*********************************
*************************
```

COMMENT The following is a coded frequency response and source match correction algorithm using S11 and S21.

```
eo_match EQU *
  MOVE.L    dp_correct_ptr(R11),R13
  BSR       ptr_adjust
  MOVE.L    dp_raw21_get(R11),R10
  MOVE.L    (R10)+,R5
     s21 in R4/R5
  MOVE.W    (R10)+,R6
  MOVE.L    R10,dp_raw21_get(R11)
  MOVE.W    dp_corr_offset(R12),R10
  JSR       SUBE_ptr
     s11-directivity
  ADD.W     R10,R8
  JSR       MPYE_ptr                     *
     (s11-direct.)*match
  ADD.W     R10,R8
  JSR       DIVE_ptr                     * [(s
11-direct)*match/tracking]
  MOVEM.L   cpx_1,R2/R3
  JSR       ADDE                                 1
+ [ ]
  MOVE.W    R1,R3                        save
one port denom in R5/R6
  MOVE.W    R6,R1                        move s
21 to R0/R1
  MOVE.W    R3,R6
  MOVE.L    R0,R2
  MOVE.L    R5,R0
  MOVE.L    R2,R5
  ADD.W     R10,R8
  JSR       SUBE_ptr                             s
21-crosstalk
  ADD.W     R10,R8
  JSR       DIVE_ptr        *            (s
21-crosstalk)/tracking
  MOVE.L    R5,R2
  MOVE.W    R6,R3           *  (s21-cross)
/tracking/(1+[ ])
  JMP       DIVE            return
  implied in DIVE
*
*
*********************************************
*************************
* oe_match correction assumes R8 constains a
* ptr to the first error coeff and R10 has the
* offset needed to get each of the others
*           R0/R1 has s22 for input and will
* exit with the corrected
```

```
*           s21 value
*
*                    [1 + ((s22-EDR)/ERR)(ESR-EL
 F)]((s21-EXT)/ETF)
*   s21 actual  = ---------------------------
 ---------------------
* (oe transmission)      (1 + [((s11-EDR)/ERR)
 *ESR])
*
*
********************************************
*************************
* Order (structure) of error coeffs is VERY
  important   ( see scal )
*   e     e     e    e     e    e
*   DR    SR    RR   XF    LF   TF
********************************************
*************************

COMMENT The following is a coded frequency response and
load match correction algorithm using S21 and S22.

oe_match EQU   *
  MOVE.L       dp_correct_ptr(R11),R13
  BSR          ptr_adjust
  MOVE.L       dp_raw21_get(R11),R10
  MOVE.L       (R10)+,-(S)
     save s21 on stack
  MOVE.W       (R10)+,-(S)
  MOVE.L       R10,dp_raw21_get(R11)
  MOVE.W       dp_corr_offset(R12),R10
  JSR          SUBE_ptr
     s11 - directivity
  ADD.W        R10,R8
  MOVE.L       0(R8,R10.W),R2
  get ERR (reflection tracking)
  MOVE.W       4(R8,R10.W),R3
  JSR          DIVE
  s11-direct.  / tracking
  MOVE.L       R0,-(S)
     save intermed. on stack
  MOVE.W       R1,-(S)
  MOVE.L       (R8),-(S)
  save ESR on stack (match)
  MOVE.W       4(R8),-(S)
  JSR          MPYE_ptr
  s11-dirct. / track * match
  MOVEM.L      cpx_1,R2/R3
  add one
  JSR          ADDE
  MOVE.L       R0,R5
    move denom to R5/R6
  MOVE.W       R1,R6
  ADD.W        R10,R8
  MOVE.W       (S)+,R1
  recall ESR from stack
```

```
MOVE.L      (S)+,R0
MOVE.L      0(R8,R10.W),R2
 get ELF
MOVE.W      4(R8,R10.W),R3
JSR         SUBE
 match - load match
MOVE.W      (S)+,R3
MOVE.L      (S)+,R0
JSR         MPYE
MOVEM.L     cpx_1,R2/R3
JSR         ADDE
MOVE.L      R5,R0
MOVE.W      R6,R1
JSR         DIVE
MOVE.L      R0,R5
MOVE.W      R1,R6
MOVE.W      (S)+,R1
MOVE.L      (S)+,R0
JSR         SUBE_ptr
ADD.W       R10,R8
ADD.W       R10,R8
JSR         DIVE_ptr
MOVE.L      R5,R2
MOVE.W      R6,R3
JMP         MPYE                    return
 implied in MPYE
*
* entrys for array driven data processing
*
*  R11 must be preloaded with a ch ptr base
*  R12 must be preloaded with a ch var base
*  R13 must be preloaded with the adr to store
*  the result
*  R7  is   number of points to process
*
*
```

COMMENT The following instructions execute the selected error correction algorithm on each data value in the array of measured data.

```
ary_corr EQU *
 SUBQ.W     =H1,R7
 MOVE.W     R7,num_corr_pts
 ADDQ.W     =H1,R7
 BRA        ary_corr2
*
```

COMMENT The correction switch is set by the subroutine 'cont_datap'. It points to one of the coded algorithms in the table labeled 'corr_tbl'.

```
array_loop EQU *
 MOVE.L     R7,-(S)
 MOVE.L     R13,-(S)
 MOVE.L     dp_raw_get(R11),R10
```

```
MOVE.L      (R10)+,R0
MOVE.W      (R10)+,R1
AND.W       =HFF,  R1
MOVE.L      R10,dp_raw_get(R11)
    restore ptr
*
MOVE.L      dp_correct_sw(R12),R10
JSR         (R10)
MOVE.L      (S)+,R13
MOVE.L      (S)+,R7
MOVE.L      R0,    (R13)+
MOVE.W      R1,    (R13)+
*
ary_corr2 EQU *
    DBRA            R7, array_loop
    RTS
*
```

Ease of use is achieved by implementing in RF switching many of the interconnections that would otherwise typically be manually performed by a user in a non-integrated test system, such as the HP 8702A lightwave component measurement system. With the integrated approach implemented in the lightwave component analyzer 10, a user is able to measure an electrical (E/E), electro-optical (E/O), opto-electrical (O/E), or optical (O/O) device easily. The measurement procedure is simpler than when performing the measurement with a non-integrated test system.

In addition to fewer steps to perform a measurement, the calibration process is more intuitive and logical. Calibration requires the connection of an RF cable and lightwave cable. To perform the measurement of an E/O or O/E device, a user simply disconnects the appropriate end of the RF and lightwave cable and connects the DUT.

The lightwave component analyzer 10 allows the measurement of the analog portion of the lightwave source 14 (transmitter) separately from the lightwave receiver 16, or visa versa. The measurements are fast and accurate, and the measurement process is convenient and easy to use. This provides the modulation/-demodulation transfer measurement capability for assuring precise test measurements.

A DUT can then be measured when it is connected to the test ports of the electrical test set 18 and/or the lightwave test set 12 in a given measurement setup. The lightwave component analyzer 10 uses the error correction data when the electrical, E/O, O/E, or optical characteristics of the DUT are measured.

The test measurements on a DUT initially require the user to select a measurement. Then, the characteristics of the DUT are measured. Finally, the lightwave component analyzer 10 compensates the test measurements on the DUT using the error correction data. The lightwave component analyzer 10 facilitates user calibration and test measurements for E/O, O/E, and 0 Reflection (one port optical). Additionally, the firmware of the lightwave component analyzer 10 will set up the RF switches for E/E, O/O, and E Reflection (one port electrical).

The lightwave component analyzer 10 measures modulation (demodulation) bandwidth, modulation (demodulation) transfer functions, loss, delay, dispersion, and reflections of fiber optic system components, such as modulators, demodulators, optical fiber cables, and fiber components, based on frequency domain measurements. For optical components (such as optical fiber cable, couplers, and connectors), the lightwave component analyzer 10 can measure such parameters as modulation bandwidth, optical insertion loss, pulse dispersion, optical reflections, and length. Additionally, single and multiple reflections can be resolved in time and distance with very high resolution. This enables precise location of one or more discontinuities and measurement of optical fiber cable length.

Insofar as optical measurements are concerned, typical optical components are optical fiber cable, modulators, and passive devices, such as switches, splitters, combiners, and attenuators. The input and output signals for testing these devices are light, and the key parameters measured are attenuation versus modulation frequency, modulation bandwidth, delay, modal pulse dispersion, location of discontinuities, and length.

The dynamic range of optical measurements is typically greater than 40 dB. The two-event resolution of discontinuities measured in distance is less than 1 cm.

Additionally, the modulation transfer characteristics of electro-optical (E/O) transmitters and opto-electrical (O/E) receivers can also be precisely measured. For example, the responsivity of a PIN diode or laser diode can be measured, not only at one modulation frequency, but also as a function of modulation frequency from 130 MHz to 20 GHz.

Representative E/O devices are optical modulators and sources (such as laser diodes and LEDs). Examples of O/E devices are PIN or avalanche photodiode detectors in optical receivers. The key parameters for these devices are the same for both types, except that the independent and dependent variables are reversed; i.e., for E/O devices, optical power out is measured as a function of electrical (RF) drive, whereas RF power out as a function of optical drive is measured for O/E devices. Typical measurements for these devices are sensitivity (including the noise threshold/floor), as well as responsivity versus modulating frequency. Also, the lightwave component analyzer 10 can test reflection performance of electrical and optical device ports.

The RF (or electrical) elements of the fiber optic system under test can also be characterized utilizing the lightwave component analyzer 10. Examples of RF devices are amplifiers, filters, and cables used in a fiber optic system. The RF measurements include bandwidth, insertion loss/gain, phase, group delay, and complex impedance.

Electrical measurements can be performed on such RF components as amplifiers, filters, and cables, or a complete fiber optic repeater (comprising an optical transmitter, optical fiber cable, and optical receiver). Typical measurements include loss/gain versus modulation frequency, modulation bandwidth, modulation phase shift or phase delay, distortion (e.g., group delay or deviation from linear phase), complex impedance (magnitude and phase), and electrical length (including discontinuity location).

For example, one set of calibrated measurements is opto-electrical device sensitivity (responsivity) versus modulation frequency and modulation bandwidth measurements. The RF switch matrix is configured for an O/E user calibration, as indicated in FIGS. 2 and 3. The RF power into the lightwave source 14 is held at a constant power level [f(t)], and the modulation frequency is varied over some frequency range, $f_1$ to $f_2$.

The total modulation frequency response of the lightwave component analyzer 10 is measured. The measurement is operated upon by factory calibration data.

The resultant error correction data are then stored for later use. The calibration is now complete, and the next step is to measure an unknown device, i.e., the DUT.

To perform the measurement on the DUT, the DUT is connected diagonally to one electrical test port $18_1$ or $18_2$ of the electrical test set 18 and to one lightwave test port $12_1$ or $12_2$ of the lightwave test set 12. A display of receiver responsivity versus modulation frequency is then obtained. The information obtained from the display provided by the CRT 20 is the absolute receiver responsivity in amperes per watt (in a 50-ohm impedance system), the modulation bandwidth of the DUT, and the responsivity variation from a constant level over the modulation frequency range (or responsivity variation over modulation frequency).

The corresponding measurements can be performed for sources or electro-optical devices. For the source case, the responsivity is in terms of watts per ampere; other comments made for the receiver measurements also apply for these measurements.

Considered in more detail, one parameter set is the demodulation bandwidth measurement for a demodulator (or receiver). The lightwave (or carrier) frequency is fixed, for example, at 1300 nm, and the modulation frequency is varied over some frequency range, such as 130 MHz to 20 GHz, by the modulation source 22. The lightwave source 14 outputs an amplitude modulated lightwave, where the lightwave is a constant frequency, but the modulation frequency varies over some frequency range.

The demodulator (or receiver), typically a photodiode and pre-amp, strips away the carrier frequency and recovers the modulated signal, g(w). The lightwave component analyzer 10 forms the ratio of g/f for each modulation frequency and operates on that ratio (g/f) and displays the transfer characteristic versus modulation frequency.

The foregoing description is offered primarily for purposes of illustration. Various modifications can be made. For example, an HP Series 217 instrument controller and an HP 3488 switch controller can be provided to configure the RF switch matrix. The HP Series 217 instrument controller software incorporates coded instructions to perform the needed switch connections for the calibration process and while measuring the response characteristics of a DUT during desired test measurements. A calibration or test measurement can be performed easily and quickly by user selection of the desired calibration or measurement by actuation of a key on the keyboard of the HP Series 217 instrument controller. It will be readily apparent to those skilled in the art that numerous other modifications and variations not mentioned above can still be made without departing from the spirit and scope of the invention as claimed below.

What is claimed is:

1. A method for electrical-source-to-E/O-device impedance mismatch calibration in a lightwave component analyzer, comprising the steps of:
   (a) measuring electrical response data for a short on a first electrical test port of the lightwave component analyzer;
   (b) measuring electrical response data for an open on the first electrical test port;
   (c) measuring electrical response data for a load on the first electrical test port;
   calculating forward source match (Esf), forward reflection tracking (Erf), and forward directivity (Edf) using the response data measured during steps (a), (b), and (c);
   (d) measuring electrical isolation response data, which is used as Exf;
   (e) measuring electrical and optical response data for respective electrical and optical through connections connected across the first and a second electrical test port of the lightwave component analyzer and first and second optical test ports of the lightwave component analyzer, respectively, which are used to calculate transmission tracking (Etf); and
   using the response data for calculating error correction data to obtain a calibrated measurement on an E/O device.

2. The calibration method of claim 1 wherein the steps (a), (b), (c), (d), and (e) are performed in any order.

3. The calibration method of claim 1, further comprising the steps of:
   measuring transmission response data for an E/O device connected across one of the electrical test ports and one of the optical test ports; and
   error-correcting the transmission measurement on the E/O device in accordance with the expression:

$$S21_{actual} = \frac{\frac{(S21\ meas - Exf)}{Etf}}{1 + \frac{(S11\ meas - Edf)}{Erf} Esf}$$

where

S21 meas is the measured transmission response data containing systematic errors;

S21 actual is a corrected transmission response measurement with source match, cross-talk, and transmission tracking errors removed;

S11 meas is a measured, uncorrected electrical reflection;
Edf is the forward directivity;
Erf is the forward reflection tracking;
Esf is the forward source match;
Exf is the isolation; and
Etf is transmission tracking;
thereby correcting transmission measurements of the E/O device for source match errors, in addition to frequency response and cross-talk error correction, to provide improved accuracy in actual test measurements of an E/O test device with an electrical port having an impedance different from the lightwave component analyzer measurement system impedance.

4. The calibration method of claim 1 wherein the step of measuring the optical response data for the optical through connection connected across the first and second optical test ports of the lightwave component analyzer, which is used to calculate transmission tracking (Etf), comprises the step of providing an optical signal to the optical through connection by means of an internal optical source.

5. The calibration method of claim 1 wherein the step of measuring the optical response data for the optical through connection connected across the first and second optical test ports of the lightwave component analyzer, which is used to calculate transmission tracking (Etf), comprises the step of providing an optical signal to the optical through connection by means of an external optical source.

6. A method for O/E-device-to-electrical-receiver impedance mismatch calibration in a lightwave component analyzer, comprising the steps of:
(a) measuring electrical response data for a short on a first electrical test port of the lightwave component analyzer;
(b) measuring electrical response data for an open on the first electrical test port;
(c) measuring electrical response data for a load on the first electrical test port;
calculating load match (Elf) using the response data measured during steps (a), (b), and (c);
(d) measuring electrical response data for a short on a second electrical test port of the lightwave component analyzer;
(e) measuring electrical response data for an open on the second electrical test port;
(f) measuring electrical response data for a load on the second electrical test port;
calculating reverse source match (Esr), reverse reflection tracking (Err), and reverse directivity (Edr) using the response data measured during steps (d), (e), and (f);
(g) measuring electrical isolation response data, which is used as Exf;
(h) measuring electrical response data for an electrical through, connection which is used to calculate load match (Elf);
(i) measuring electrical and optical response data for respective electrical and optical through connections connected across the first and second electrical test ports and first and second optical test ports of the lightwave component analyzer, respectively, which are used to calculate transmission tracking (Etf); and
using the response data for calculating error correction data to obtain a calibrated measurement on an O/E device.

7. The calibration method of claim 6 wherein the steps (a), (b), (c), (d), (e), (f), (g), (h), and (i) are performed in any order.

8. The calibration method of claim 6, further comprising the steps of:
measuring transmission response data for an O/E device connected across one of the optical test ports and one of the electrical test ports; and
error-correcting the transmission measurement on the O/E device in accordance with the expression:

$$S21_{actual} = \frac{1 + \frac{(S22\ meas - Edr)}{Err}(Esr - Elf)\frac{(S21\ meas - Exf)}{Etf}}{1 + \frac{(S22\ meas - Edr)}{Err}Esr}$$

where
S21 meas is the measured transmission response data containing systematic errors;
S21 actual is a corrected transmission response measurement with load match, cross-talk, and transmission tracking errors removed;
S22 meas is a measured, uncorrected electrical reflection;
Edr is the reverse directivity;
Err is the reverse reflection tracking;
Esr is the reverse source match;
Exf is the isolation;
Elf is the load match; and
Etf is the transmission tracking;
thereby correcting transmission measurements of the O/E device for load match errors, in addition to frequency response and cross-talk error correction, to provide improved accuracy in actual test measurements of an O/E test device with an electrical port having an impedance difference from the lightwave component analyzer measurement system impedance.

9. The calibration method of claim 6 wherein the step of measuring the optical response data for the optical through connection connected across the first and second optical test ports of the lightwave component analyzer, which is used to calculate transmission tracking (Etf), comprises the step of providing an optical signal to the optical through connection by means of an internal optical source.

10. The calibration method of claim 6 wherein the step of measuring the optical response data for the optical through connection connected across the first and second optical test ports of the lightwave component analyzer, which is used to calculate transmission tracking (Etf), comprises the step of providing an optical signal to the optical through connection by means of an external optical source.

11. A method for electrical-source-to-E/O-device impedance mismatch calibration and O/E-device-to-electrical-receiver impedance mismatch calibration in a lightwave component analyzer, comprising the steps of:
(a) measuring electrical response data for a short on a first electrical test port of the lightwave component analyzer;
(b) measuring electrical response data for an open on the first electrical test port;
(c) measuring electrical response data for a load on the first electrical test port;

calculating forward source match (Esf), forward reflection tracking (Erf), forward directivity (Edf), and load match (Elf) using the response data measured during steps (a), (b), and (c);

(d) measuring electrical response data for a short on a second electrical test port of the lightwave component analyzer;

(e) measuring electrical response data for an open on the second electrical test port;

(f) measuring electrical response data for a load on the second electrical test port;

calculating reverse source match (Esr), reverse reflection tracking (Err), and reverse directivity (Edr) using the response data measured during steps (d), (e), and (f);

(g) measuring electrical isolation response data, which is used as Exf;

(h) measuring electrical response data for an electrical through connection which is used to calculate load match (Elf);

(i) measuring electrical and optical response data for respective electrical and optical through connections connected across the first and second electrical test ports and first and second optical test ports of the lightwave component analyzer, respectively, which are used to calculate transmission tracking (Etf); and using the response data for calculating error correction data to obtain a calibrated measurement on at least one of an E/O device and an O/E device.

12. The calibration method of claim 11 wherein the steps (a), (b), (c), (d), (e), (f), (g), (h), and (i) are performed in any order.

13. The calibration method of claim 11, further comprising the steps of:

measuring transmission response data for an E/O device connected across one of the electrical test ports and one of the optical test ports; and error-correcting the transmission measurement of the E/O device in accordance with the expression:

$$S21_{actual} = \frac{\frac{(S21\ meas - Exf)}{Etf}}{1 + \frac{(S11\ meas - Edf)}{Erf} Esf}$$

where

S21 meas is the measured transmission response data containing systematic errors;

S21 actual is a corrected transmission response measurement with source match, cross-talk, and transmission tracking errors removed;

S11 meas is a measured, uncorrected electrical reflection;

Edf is the forward directivity;

Erf is the forward reflection tracking;

Esf is the forward source match;

Exf is the isolation; and

Etf is transmission tracking;

thereby correcting transmission measurement of the E/O device for source match errors, in addition to frequency response and cross-talk error correction, to provide improved accuracy in actual test measurements of an E/O test device with an electrical port having an impedance different from the light wave component analyzer measurement system impedance.

14. The calibration method of claim 11, further comprising the steps of:

measuring transmission response data for an O/E device connected across one of the optical test ports and one of the electrical test ports; and error-correcting the transmission measurement on the O/E device in accordance with the expression:

$$S21_{actual} = \frac{1 + \frac{(S22\ meas - Edr)}{Err}(Esr - Elf)\frac{(S21\ meas - Exf)}{Etf}}{1 + \frac{(S22\ meas - Edr)}{Err} Esr}$$

where

S21 meas is the measured transmission response data containing systematic errors;

S21 actual is a corrected transmission response measurement with load match, cross-talk, and transmission tracking errors removed;

S22 meas is a measured, uncorrected electrical reflection;

Edr is the reverse directivity;

Err is the reverse reflection tracking;

Esr is the reverse source match;

Exf is the isolation;

Elf is the load match; and

Etf is the transmission tracking;

thereby correcting transmission measurements of the O/E device for load match errors, in addition to frequency response and cross-talk error correction, to provide improved accuracy in actual test measurements of an O/E test device with an electrical port having an impedance different from the lightwave component analyzer measurement system impedance.

15. The calibration method of claim 13, further comprising the steps of:

measuring transmission response data for an O/E device connected across one of the optical test ports and one of the electrical test ports; and error-correcting the transmission measurement on the O/E device in accordance with the expression:

$$S21_{actual} = \frac{1 + \frac{(S22\ meas - Edr)}{Err}(Esr - Elf)\frac{(S21\ meas - Exf)}{Etf}}{1 + \frac{(S22\ meas - Edr)}{Err} Esr}$$

where

S21 meas is the measured transmission response data containing systematic errors;

S21 actual is a corrected transmission response measurement with load match, cross-talk, and transmission tracking errors removed;

S22 meas is a measured, uncorrected electrical reflection;

Edr is the reverse directivity;

Err is the reverse reflection tracking;

Esr is the reverse source match;

Exf is the isolation;

Elf is the load match; and

Etf is the transmission tracking;

thereby correcting transmission measurements of the O/E device for load match errors, in addition to frequency response and cross-talk error correction, to provide improved accuracy in actual test measurements of an O/E test device with an electrical port having an impedance different from the lightwave component analyzer measurement system impedance.

16. The calibration method of claim 11 wherein the step of measuring the optical response data for the optical through connection connected across the first and second optical test ports of the lightwave component analyzer, which is used to calculate transmission tracking (Etf), comprises the step of providing an optical signal to the optical through connection by means of an internal optical source.

17. The calibration method of claim 11 wherein the step of measuring the optical response data for the optical through connection connected across the first and second optical test ports of the lightwave component analyzer, which is used to calculate transmission tracking (Etf), comprises the step of providing an optical signal to the optical through connection by means of an external optical source.

18. A method for electrical-source-to-E/O-device impedance mismatch calibration and O/E-device-to-electrical-receiver impedance mismatch calibration measurements in a lightwave component analyzer, comprising the steps of:
  (a) measuring electrical response data for a short on a first electrical test port of the lightwave component analyzer;
  (b) measuring electrical response data for an open on the first electrical test port;
  (c) measuring electrical response data for a load on the first electrical test port;
  (d) measuring electrical response data for a short on a second electrical test port of the lightwave component analyzer;
  (e) measuring electrical response data for an open on the second electrical test port;
  (f) measuring electrical response data for a load on the second electrical test port;
  (g) measuring electrical isolation response data, which is used as Exf;
  (h) measuring electrical response data for an electrical through connection which is used to calculate load match (Elf);
  (i) measuring electrical and optical response data for respective electrical and optical through connections connected across the first and second electrical test ports and first and second optical test ports of the lightwave component analyzer, respectively, which are used to calculate transmission tracking (Etf); and
  using the response data for calculating error correction data to obtain a calibrated measurement on at least one of an E/O device and an O/E device.

19. The method of claim 18, further comprising the steps of:
  calculating forward source match (Esf), forward reflection tracking (Erf), forward directivity (Edf), and load match (Elf) using the response data measured during steps (a), (b), and (c); and
  calculating reverse source match (Esr), reverse reflection tracking (Err), and reverse directivity (Edr) using the response data measured during steps (d), (e), and (f).

20. The method of claim 19, further comprising the steps of:
  measuring transmission response data for as E/O device connected across one of the electrical test ports and one of the optical test ports;
  error-correcting the transmission measurement on the E/O device in accordance with the expression:

$$S21_{E/O\ actual} = \frac{\frac{(S21\ meas - Exf)}{Etf}}{1 + \frac{(S11\ meas - Edf)}{Erf} Esf}$$

measuring transmission response data for an O/E device connected across one of the optical test ports and one of the electrical test ports; and
  error-correcting the transmission measurement on the O/E device in accordance with the expression:

$$S21_{O/E\ actual} = \frac{1 + \frac{(S22\ meas - Edr)}{Err}(Esr - Elf)\frac{(S21\ meas - Exf)}{Etf}}{1 + \frac{(S22\ meas - Edr)}{Err} Esr}$$

where
S21 meas is the measured transmission response data containing systematic errors;
$S21_{E/O}$ actual is a corrected transmission response measurement of the E/O device with load match, cross-talk, and transmission tracking errors removed;
S22 meas is a measured, uncorrected electrical reflection;
Edr is the reverse directivity;
Err is the reverse reflection tracking;
Esr is the reverse source match;
Exf is the isolation;
Elf is the load match;
Etf is the transmission tracking;
$S21_{O/E}$ actual is a corrected transmission response measurement of the O/E device with source match, cross-talk, and transmission tracking errors removed;
S11 meas is a measured, uncorrected electrical reflection;
Edf is the forward directivity;
Erf is the forward reflection tracking;
Esf is the forward source match; and
Etf is transmission tracking;
thereby correcting transmission measurements of the E/O and O/E devices for source match errors, in addition to frequency response and cross-talk error correction, to provide improved accuracy in actual test measurements of E/O and O/E test devices with an electrical port having an impedance different from the lightwave component analyzer measurement system impedance.

* * * * *

UNITED STATES PATENT AND TRADEMARK OFFICE
CERTIFICATE OF CORRECTION

PATENT NO. : 5,175,492

DATED : December 29, 1992

INVENTOR(S) : Roger W. Wong and Michael G. Hart

It is certified that error appears in the above-identified patent and that said Letters Patent is hereby corrected as shown below:

Column 3, Line 64, "In the drawing:" should read --In the drawings:--

Column 9, Line 18, "one opto-electrical electrical" should read --one opto-electrical--

Column 260, Line 39, "impedance difference from" should read --impedance different from--

Column 261, Line 39, "measurement of the" should read --measurement on the--

Column 264, Line 3, "response data for as E/O" should read --response data for an E/O--

Signed and Sealed this

Seventh Day of December, 1993

Attest:

BRUCE LEHMAN

*Attesting Officer*     *Commissioner of Patents and Trademarks*